United States Patent
Cochems

(10) Patent No.: US 11,791,145 B2
(45) Date of Patent: Oct. 17, 2023

(54) SYSTEMS AND METHODS FOR ACCURATE, STABLE VOLTAGE SUPPLY

(71) Applicant: Thermo Fisher Scientific (Bremen) GmbH, Bremen (DE)

(72) Inventor: Philipp Cochems, Bremen (DE)

(73) Assignee: Thermo Fisher Scientific (Bremen) GmbH, Bremen (DE)

(*) Notice: Subject to any disclaimer, the term of this patent is extended or adjusted under 35 U.S.C. 154(b) by 271 days.

(21) Appl. No.: 17/156,921

(22) Filed: Jan. 25, 2021

(65) Prior Publication Data

US 2021/0233757 A1 Jul. 29, 2021

(30) Foreign Application Priority Data

Jan. 27, 2020 (GB) ..................... 2001107

(51) Int. Cl.
*H01J 49/02* (2006.01)
*H01J 49/40* (2006.01)
*G05F 5/00* (2006.01)

(52) U.S. Cl.
CPC .............. *H01J 49/022* (2013.01); *G05F 5/00* (2013.01); *H01J 49/406* (2013.01)

(58) Field of Classification Search
CPC .......... H01J 49/022; H01J 49/406; G05F 5/00
(Continued)

(56) References Cited

U.S. PATENT DOCUMENTS

2006/0202876 A1* 9/2006 Lee ..................... H03M 1/0609
341/126
2008/0067354 A1* 3/2008 Gabeler .................. H01J 49/40
250/288
(Continued)

FOREIGN PATENT DOCUMENTS

JP 2009-536443 A 10/2009
WO 96/30930 A1 10/1996

OTHER PUBLICATIONS

Combined Search and Examination Report dated Jul. 10, 2020 for GB Patent Application No. 2001107.8.
(Continued)

*Primary Examiner* — Yemane Mehari

(57) ABSTRACT

A voltage supply and a method for calibrating the voltage supply are provided. The voltage supply is for providing a reference voltage to supply a voltage to at least one electrode. The voltage supply comprises: an ultra-stable DC voltage source, an accurate DC voltage source, a tuning unit, a comparator, and a control unit. An ultra-stable voltage is applied to the tuning unit, which is provided based on a supplied voltage of the ultra-stable DC voltage source. The tuning unit provides an output voltage. A voltage based on the output voltage of the tuning unit is compared by the comparator with an accurate voltage. The accurate voltage is provided based on a supplied voltage of the accurate DC voltage source. The comparator provides a signal resulting from the comparison to the control unit, wherein the control unit is tuning the tuning unit during a tuning period according to the signal provided by the comparator to minimize the absolute difference between the voltage based on the output
(Continued)

voltage of the tuning unit and the accurate voltage. The reference voltage of the voltage supply is provided based on the output voltage of the tuning unit after the tuning period.

28 Claims, 20 Drawing Sheets

(58) Field of Classification Search
USPC .......................................................... 323/313
See application file for complete search history.

(56) References Cited

U.S. PATENT DOCUMENTS

| | | | | |
|---|---|---|---|---|
| 2009/0322305 | A1* | 12/2009 | De Cremoux | G11C 27/005 |
| | | | | 323/313 |
| 2019/0227586 | A1* | 7/2019 | Shafeeu | G05F 1/461 |

OTHER PUBLICATIONS

Notification of Reason for Rejection dated Feb. 24, 2022 issued to JP Patent Application No. 2021-010808.
First Office Action dated Mar. 3, 2022, issued to CN Patent Application No. 202110095590.0.

* cited by examiner $T_1$ = tunable voltage divider 1 (coarse tuning)
$T_2$ = tunable voltage divider 2 (fine tuning)

SYSTEMS AND METHODS FOR ACCURATE, STABLE VOLTAGE SUPPLY

CROSS-REFERENCE TO RELATED APPLICATIONS

This application claims the priority to GB Patent Application No. 2001107.8, filed on Jan. 27, 2020, which is hereby incorporated herein by reference in its entirety.

TECHNICAL FIELD OF THE INVENTION

This invention relates to a voltage supply, which is providing a reference voltage. This reference voltage is used to supply a voltage to at least one electrode.

BACKGROUND OF THE INVENTION

In a mass spectrometer, ions are transferred and analysed by charged electrodes. DC voltages and/or RF voltages are applied to these electrodes.

The performance of the mass spectrometers depends very often on the stability and/or accuracy of the applied voltages. This can be provided by a voltage source, a voltage supply or a reference voltage which is provided by a voltage supply and which can then be amplified by a voltage amplifier to the voltage which is applied at an electrode.

The requirements regarding the stability and accuracy of the applied voltages depend on the function of an electrode in a mass spectrometer.

A voltage provided by a DC voltage source for some functions in a mass spectrometer, should be stable over time and temperature.

Therefore the stability and accordingly precision of a voltage provided by a DC voltage source is defined over time and temperature and has preferably the same value regarding a specific time period and temperature range.

The stability of a voltage of a DC voltage source over time is defined as 6 times the standard deviation of the voltage in a specific time period at a constant temperature ($\Delta T<1°$ C.). Typically the specific time period to define the stability of a voltage is between 12 and 36 hours, preferably it is defined for a time period of 24 hours. The stability of the voltage over the time is mostly provided as the 6 times the standard deviation of the voltage in relation to the average value of the voltage supplied by the DC voltage source and is typically provided as a ppm value. So when the average voltage of a voltage source is 6 V and the stability of the voltage over the time is 12 ppm, the standard deviation of the voltage is 12 µV in the specific time period defining the stability of the voltage source.

The stability of a voltage of a DC voltage source, which is the average voltage provided by the DC voltage source, over the temperature is defined as the maximum deviation of a maximum value and a minimum value of the voltage in a specific temperature range. Typically the stability of a voltage is defined over a temperature range of at least 10° C., preferably of at least 20° C. and particular preferably of at least 25° C. Preferably the temperature range is symmetrical regarding an operation temperature of the DC voltage source.

This stability of the voltage of a DC voltage source over the temperature can be available at a specific operation temperature of the DC voltage source. Preferably it is available at a range of the operation temperature of the DC voltage source. The range of the operation temperature, at which the stability of the voltage of a DC voltage source over the temperature is available, can be larger than 2° C., preferably larger than 10° C., more preferably larger than 50° C. and most preferably larger than 100° C. A typical range of the operation temperature, at which the stability of the voltage of a DC voltage source over the temperature is available, is between 15° C. and 40° C. Preferably the range of the operation temperature, at which the stability of the voltage of a DC voltage source over the temperature is available, is between 5° C. and 60° C., more preferably between −10° C. and 90° C. and most preferably between −40° C. and 110° C.

The stability of the voltage over the temperature is mostly provided as the relative maximum deviation of the maximum value and the minimum value of the voltage in the specific temperature range in relation to the average value of the voltage supplied by the DC voltage source and is typically provided as a ppm value. So when the average voltage of a voltage source is 6 V and the stability of the voltage over the temperature is 10 ppm, the maximum deviation of the voltage is 60 µV, which is the maximum difference of the voltage in the specific temperature range, for which the stability of the voltage source is determined.

The accuracy of the DC voltage supplied by a DC voltage source is defined by the maximum deviation, which the average value of the supplied voltage has, when the DC voltage source is produced. This accuracy is further denoted as production accuracy. So the average value of the supplied voltage of a DC voltage source does not deviate more than the maximum deviation, given by the accuracy, from its nominal voltage, which is the value of the voltage, which shall be provided by the DC source.

The accuracy of the DC voltage supplied by a DC voltage source is provided as a ppm value, providing the ratio of maximum deviation of the average value of a produced DC voltage source from its nominal voltage to its nominal voltage. Typically the deviation of the average values of the supplied voltage of a set of produced DC voltage sources is symmetrical to their nominal voltage. But it is also possible that the deviation to higher or lower voltage values regarding the nominal voltage has a higher occurrence e.g. due to a systematic error.

In particular, the performance of a time-of-flight (TOF) mass spectrometer depends on the stability and or accuracy of the voltages, applied at its electrodes.

In a time-of-flight (TOF) mass spectrometer the flight times of ions travelling a known distance are recorded. These flight times are used to determine the mass to charge ratios (m/z). The translation from the flight time to the mass to charge ratio is done by a calibration function.

In multi-reflection time-of-flight mass spectrometers ions are oscillating between ion mirrors of the mass analyser, which comprise at least one mirror electrode, the stability of the calibration of these time-of-flight mass spectrometers is influenced, among other parameters, by the stability and accuracy of the voltages applied to the mirror electrodes. The ratio of the mass accuracy of the mass spectrometer to the voltage stability of its mirror electrodes, to which a stable voltage is supplied, is more or less one to one. Therefore, e.g. to achieve a typically intended mass accuracy of 1 ppm, a voltage stability of 1 ppm is required for at least one of the mirror electrodes. For a further increased high resolving power and mass accuracy of the mass spectrometer a voltage stability below 0.8 ppm of at least one mirror electrode is advantageous and a voltage stability below 0.5 ppm of at least one mirror electrode is more advantageous.

Also the performance of a Fourier transform mass spectrometer, which can comprise an electrostatic trap as mass analyser, depends on the stability and or accuracy of the voltages, applied at its electrodes.

In a Fourier transform mass spectrometer the ions are cycling in an ion trap. The measured cycling frequency of the ions is used to determine their mass to charge ratios. The translation from the frequency to the mass to charge ratio is done using a calibration function. The stability of the calibration is influenced, among other parameters, by the stability of the voltages applied to the electrodes of the ion trap, in particular to the center electrode of an electrostatic trap, e.g. the center electrode of an Orbitrap® mass analyser distributed by Thermo Fisher Scientific Inc. The ratio between the mass accuracy of the mass spectrometer and the voltage stability is more or less one to one. Therefore, to achieve a mass stability of 1 ppm, a voltage stability of 1 ppm is required.

There are very few accurate voltage references available which claim a temperature stability of 1 ppm/° C. But this is not sufficient to operate a mass spectrometer within a common temperature range of about 10° C.

In particular in high precision voltage instruments voltage supplies are used, which provide reference voltages which are extremely stable and precise but unfortunately not accurate. The output voltage of these ultra-stable DC voltage sources can be in the range of 2 V to 20 V, mostly in the range of 5V to 10 V and preferably in the range of 5.5 V and 8 V. But the output voltage typically differs considerably, typically by more than +/−4%. These ultra-stable DC voltage sources are in particular using Zener diodes. Examples of such voltage supplies are the reference voltage sources LM399 and LTZ1000 distributed by Linear Technology Corp.

The accuracy needed in mass spectrometry for a reference voltage is not as high as the needed stability. Nevertheless, +/−4% tolerance is in most cases not accurate enough to successfully operate a mass spectrometer.

In many applications, for example in digital multimeters, a stable reference voltage is used and the accurate reading value of a DC voltage is tuned with a calibrator. This can be done by potentiometers to adjust the gain in the reference circuit to produce the required accurate voltage value. In most modern test and measurement instruments that are based on a stable reference voltage the analogue to digital converter range is large enough to deal with reference voltages over the whole tolerance band. The calibration is done in software using this approach. In both approaches, calibration for every single instrument is required in order to meet the specifications. These production methods are time consuming and expensive for several reasons. Precise and costly equipment is indispensable and in addition trained personal is needed which can carry out an accurate calibration. Other disadvantages are the relatively bad stability of potentiometers, which disturb the stability of the circuit. The need of a wide tuning range is also a source of instabilities in high voltage applications. The smaller the tuning range, the smaller is the produced influence of the circuit.

In summary, using a lot of effort is required to transform an ultra-stable and precise voltage references into an accurate voltage reference with the same stability. Furthermore, the techniques to get an accurate reference voltage out of a precise voltage will influence its stability.

It is therefore the first object of the invention to provide an improved voltage supply, which is providing a reference voltage, which has a high accuracy and also a high stability.

It is a second object of the invention is to provide a calibration method for the improved voltage supply, which is providing a reference voltage, which has a high accuracy and also a high stability, which makes it possible that the reference voltage is provided by the voltage supply as soon as possible after the voltage supply has been activated, in particular reactivated after an unintended disruption of the voltage supply, e.g. by power breakdown.

It is a third object of the invention that the provided calibration method is already providing a reference voltage, before the calibration of the reference voltage having a high accuracy and high stability is finished.

SUMMARY OF THE INVENTION

The first object is solved by the voltage supply of claim 1.

The voltage supply provides a reference voltage to supply a voltage to at least one electrode. The provided reference voltage can be applied directly to the at least one electrode or can be applied to at least one amplifier, which then is providing an amplified voltage which is supplied to at least one of the electrodes. The supplied reference voltage can be used to supply a voltage to more than one electrode. The supplied voltage provided by the at least one amplifier as amplified voltage can be the same for all electrodes or different for some electrodes or each of the electrodes.

The inventive voltage supply comprises two different DC voltage sources, an ultra-stable DC voltage source and an accurate DC voltage source.

The ultra-stable DC voltage source provides a very stable output voltage. The stability of the output voltage is provided over the time and a specific temperature range. Typically the output voltage provide by a DC ultra-stable voltage source has a voltage stability below 5 ppm, preferably below 1 ppm, more preferably below 0.5 ppm and particular preferably below 0.3 ppm. The stability of the output voltage is provided typically over more than 12 hours, preferably over more than 24 hours, more preferably over more than 48 hours and particularly over more than 96 hours. The stability of the output voltage is provided typically over a temperature range of more than 10° C., preferably over more than 15° C., more preferably over more than 20° C. and particularly over more than 25° C.

The stability of the output voltage of the ultra-stable DC voltage source over the temperature range can be available at a specific operation temperature of the ultra-stable DC voltage source or preferably at a range of the operation temperature of the ultra-stable DC voltage source.

The range of the operation temperature, at which the stability of the voltage of the ultra-stable DC voltage source over the temperature is available, can be larger than 2° C., preferably larger than 10° C., more preferably larger than 50° C. and most preferably larger than 100° C. A typical range of the operation temperature, at which the stability of the voltage of the ultra-stable DC voltage source over the temperature is available, is between 15° C. and 40° C. Preferably the range of the operation temperature, at which the stability of the voltage of the ultra-stable DC voltage source over the temperature is available, is between 5° C. and 60° C., more preferably between −10° C. and 90° C. and most preferably between −40° C. and 110° C.

The accurate DC voltage source provides a very accurate DC output voltage with an accuracy typically below 1000 ppm, preferably below 400 ppm, more preferably below 250 ppm and most preferably below 100 ppm.

The voltage supplied by the ultra-stable DC source can have preferably a higher absolute value than the voltage supplied by the accurate DC voltage source. In this case additional amplifiers are not required in the inventive voltage supply.

Typically in these embodiments the absolute value of the voltage of the ultra-stable DC source is at least 2% higher than the absolute value of the voltage of the accurate DC voltage source. Preferably the absolute value of the voltage of the ultra-stable DC source is at least 10% higher than the absolute value of the voltage of the accurate DC voltage source. More preferably the absolute value of the voltage of the ultra-stable DC source is at least 25% higher than the absolute value of the voltage of the accurate DC voltage source.

Typically the absolute value of the voltage of the ultra-stable DC source is not more than 500% higher than the absolute value of the voltage of the accurate DC voltage source. Preferably the absolute value of the voltage of the ultra-stable DC source is not more than 200% higher than the absolute value of the voltage of the accurate DC voltage source. More preferably the absolute value of the voltage of the ultra-stable DC source is not more than 100% higher than the absolute value of the voltage of the accurate DC voltage source.

In another embodiment the voltage provided by the ultra-stable DC source is supplied to an amplifier and then the amplified voltage has a higher absolute value than the voltage provided by the accurate DC voltage source.

Typically both voltages sources, the ultra-stable DC source and the accurate DC voltage source provide voltages with absolute values in the range of 0.5 V to 100 V, preferably in the range of 2 V to 20 V and more preferably in the range of 5 V to 10 V and most preferably in the range of 5.5 V to 8 V. Preferably ultra-stable DC voltage sources are using Z-diodes and/or Zener diodes, in particular based in silicon, which preferably are supplying voltages in the range of 5 V to 8 V.

The inventive voltage supply also comprises a tuning unit.

A voltage is supplied by a voltage source to the tuning unit, which is applied at at least one (input) connector of the tuning unit, preferably two (input) connectors of the tuning unit. The tuning unit provides an output voltage to at least one (output) connector, wherein the provided output voltage can be adjusted by the tuning unit.

The tuning unit can comprise one or more tunable voltage dividers. In a preferred embodiment, the tuning unit can be a tunable voltage divider.

A tunable voltage divider comprises preferably at least one resistor, more preferably a network of connected resistors. Then the tunable voltage divider provides an output voltage to at least one (output) connector by tapping the voltage from the resistor or the resistor network.

A tunable voltage divider which can be used in the inventive voltage supply is a voltage divider, which is tunable, which means that the output voltage can be adjusted. A kind of tunable voltage divider is also named potentiometer. In a classical potentiometer the voltage divider is tuned by a sliding contact, which is connected to an output connector. A tunable voltage divider of the inventive voltage supply can be tuned analogue or digitally. In an analogue tunable voltage divider the tuning can be executed also by an electrical component of the electrical circuit of the voltage divider, due to which a tuned output voltage is provided to an (output) connector of the voltage divider. If the voltage divider is digitally tuned, it can be a digital to analogue converter (DAC), to which a digital signal of several bits is provided as tuning input, wherein the bits are switching resistors in a parallel resistor network of the digital to analogue converter (DAC), which can a R-2R ladder DAC comprising a repeated cascaded structure of resistors having the values R and 2R. In this case each bit is binary weighted.

Another type of digital to analogue converter (DAC), which can be used as tuning unit in the inventive voltage supply, comprises a pulse width modulator, which is controlled by a single bit signal, and a low-pass filter to provide the DC component of the modulated signal as the output voltage of the tuning unit.

In another embodiment of the invention the tuning unit of the voltage supply comprises at least one resistor and a tunable voltage divider, which are connected in series. When a voltage is supplied by a voltage source to the tuning unit, only a portion of the voltage is applied at the tunable voltage divider and only this portion of the applied voltage is tunable by the tunable voltage divider to provide an output voltage to the (output) connector.

In another embodiment of the invention the tuning unit of the voltage supply comprises two tunable voltage dividers. The voltage supplied by a voltage source to the tuning unit is applied at a first tunable voltage divider of the two tunable voltage dividers, which provides a first output voltage to an (output) connector. This first output voltage is then applied at a second tunable voltage divider of the two tunable voltage dividers, which provides a second output voltage to an (output) connector, which is the output voltage of the tuning unit. Preferably the first tunable voltage divider is used to tune the output voltage of the tuning unit coarsely and the second tunable voltage divider is used to tune the output voltage of the tuning unit in a fine manner.

In another embodiment of the invention the tuning unit of the voltage supply comprises at least one resistor and a digital to analogue converter (DAC), which are connected in parallel and a current to voltage converter, typically a transimpedance amplifier. Preferably the digital to analogue converter (DAC) is connected in series with at least one further resistor. When a voltage is supplied by a voltage source to the tuning unit, this is applied at the parallel connected digital to analogue converter (DAC) and at least one resistor. The other end of this parallel connection is connected with the input of the current to voltage converter, which provides the output voltage of the tuning unit.

In another embodiment of the invention the tuning unit of the voltage supply comprises at least one resistor and two digital to analogue converters (DAC), which are connected in parallel and a current to voltage converter, typically a transimpedance amplifier. When a voltage is supplied by a voltage source to the tuning unit, this is applied at the parallel connected digital to analogue converters (DAC) and at least on resistor. The other end of this parallel connection is connected with the input of the current to voltage converter, which provides the output voltage of the tuning unit. In this configuration preferably one of two digital to analogue converters (DAC) is provided for a coarse tuning of the output voltage of the tuning unit and the other of two digital to analogue converters (DAC) is provided for a fine tuning of the output voltage of the tuning unit. Preferably both digital to analogue converters (DAC) are connected in series with at least one further resistor. The digital to analogue converters (DAC) which is connected in series with the resistor of higher resistivity is provided for the fine tuning.

In another embodiment of the invention the tuning unit of the voltage supply comprises at least one resistor and a digital to analogue converter (DAC), which are supplied with two voltages, which are supplied by two voltage sources to the tuning unit, and a current to voltage converter, typically a transimpedance amplifier. The at least one resistor and a digital to analogue converter (DAC) are connected at a node, which is connected with the input of the current to voltage converter, which provides the output voltage of the tuning unit. The digital to analogue converter (DAC) is connected in series with at least one further resistor.

In one embodiment of the inventive voltage supply the supplied voltage of the ultra-stable DC voltage source is applied directly at at least one (input) connector of the tuning unit.

In another embodiment the voltage provided by the ultra-stable DC voltage source is supplied to an amplifier and then the amplified voltage is applied at at least one (input) connector of the tuning unit.

These embodiments represent simple arrangements showing how an ultra-stable voltage based on the supplied voltage of the ultra-stable DC voltage source can be applied at the tuning unit. For example other arrangements known by a skilled person might be used to apply a voltage derived from the supplied voltage of the ultra-stable DC voltage source as ultra-stable voltage to the tuning unit.

In one embodiment of the inventive power supply the output voltage of the tuning unit is used to supply the reference voltage provided by the voltage supply. In this embodiment the tuning unit is providing the reference voltage directly as its output voltage.

In another embodiment of the inventive power supply the output voltage of the tuning unit is supplied to an amplifier and then the amplified voltage is the reference voltage provided by the voltage supply.

In the whole specification the amplification of a voltage by an amplifier shall not be limited to the increase of the voltage which is amplified. Due to the amplification also a reduction of a voltage is possible. According any amplifier described is in this specification can have in general a gain which is typically above, but can be also below 1 if a voltage is decreased by an amplifier.

These embodiments represent simple arrangements showing how the reference voltage of the inventive voltage supply can be provided based on the output voltage of the tuning unit. For example other arrangements known by a skilled person might be used to provide the reference voltage of the inventive voltage supply, which is derived from the output voltage of the tuning unit.

The inventive voltage supply also comprises a comparator. A comparator is an electrical component which compares two input voltages. To enable tuning of the voltage supply, the comparator provides an output signal which is resulting from the comparison of the two input voltages. The output signal can be a signal which is equal or proportional to the difference of the compared voltages. Preferably the comparator comprises an operational amplifier which can be a differential amplifier.

In a preferred embodiment the output signal of the comparator is a digital signal which has only the output signal 0 and 1. By these signals it is only indicated which of the two input voltages has the higher value. For such a kind of comparator can be used a high-gain differential amplifier, which is providing a very low or high voltage, which are then identified as signal 0 and 1.

The comparator can be also a digital comparator. By this comparator two digital signals are compared. It is also possible to supply two analogue voltages to a digital comparator, when they have been converted by an analogue to digital converter. In this embodiment the digital comparator preferably uses a switch to measure both signals over the same connection with the same analogue to digital converter.

A voltage based on the output voltage of the tuning unit and an accurate voltage, which is provided based on the accurate DC voltage source are provided to the comparator of the inventive power supply, which compares the voltage signals.

In a preferred embodiment of the inventive voltage supply the output voltage of the tuning unit and the voltage of the accurate voltage source are provided to the comparator of the inventive power supply directly, which compares the voltage signals.

In an embodiment of the inventive voltage supply the output voltage of the tuning unit is compared by the comparator with the accurate voltage to provide the signal to the control unit according to which the control unit is tuning the tuning unit during the tuning period. By the tuning of the tuning unit the absolute difference between the output voltage of the tuning unit and the accurate voltage is minimised.

In another embodiment of the inventive voltage supply the voltage based on the output voltage of the tuning unit, which is provided to the comparator, is an amplified voltage of the output voltage of the tuning unit. Then the output voltage of the tuning unit is supplied to an amplifier, which is providing the amplified voltage of the output voltage. This amplified voltage is then used for the comparison by the comparator.

These embodiments represent simple arrangements showing how to provide a voltage based on the output voltage of the tuning unit to the comparator to be compared with an accurate voltage. For example other arrangements known by a skilled person might be used to provide a voltage, which is derived from the output voltage of the tuning unit, to the comparator to be compared with an accurate voltage.

In an embodiment of the inventive voltage supply the supplied voltage of the accurate DC voltage source is the accurate voltage, which is compared by the comparator with the voltage based on the output voltage of the tuning unit.

In another embodiment of the inventive voltage supply the accurate voltage, which is provided based on the accurate DC voltage source and is provided to the comparator is an amplified voltage of the accurate voltage supplied by the accurate DC voltage source. The accurate voltage supplied by the accurate DC voltage source is supplied to an amplifier, which is providing the amplified voltage of the accurate voltage supplied by the accurate DC voltage source. This amplified voltage is then used for the comparison by the comparator.

These embodiments represent simple arrangements showing how to provide an accurate voltage, which is provided based on the supplied voltage of accurate DC voltage source, to the comparator to be compared with a voltage based on the output voltage of the tuning unit. For example other arrangements known by a skilled person might be used to provide an accurate voltage, which is derived from the supplied voltage of accurate DC voltage source, to the comparator to be compared with a voltage based on the output voltage of the tuning unit.

The output signal which is resulting from the comparison of these two input voltages of the comparator, can be a signal which is equal or proportional to the difference of the compared voltages. The output signal which is resulting from the comparison of these two input voltages can be also a digital signal.

The inventive power supply comprises also a control unit.

The control unit may comprise a processor. A computer program may be executed on the processor to operate the voltage supply according to the described steps of the method.

The signal provided by the comparator, which results from the comparison of the voltage based on the output voltage of the tuning unit and the accurate voltage, which is provided based on the supplied voltage of the accurate DC voltage source is provided to the control unit as input signal.

During a tuning period, which is typically initially after activation or reactivation of the voltage supply, the control unit tunes the tuning unit according to the provided signal to minimise the difference between voltages provided to the comparator which is the voltage based on the output voltage of the tuning unit and the accurate voltage, which is provided based on the supplied voltage of the accurate DC voltage source.

To achieve this, the control unit provides an output signal, which is provided to the tuning unit.

If the signal provided by the comparator which is provided to the control unit is equal or proportional to the difference of the compared voltages, according to the detected voltage difference the control unit reacts and provides a signal to the tuning unit to increase or decrease its output voltage according to the detected voltage difference to reduce the difference of the voltages provided to the comparator.

The output signal provided by the control unit is increasing the absolute value of the output voltage of the tuning unit if the absolute value of the accurate voltage, which is provided to the comparator based on the supplied voltage of the accurate DC voltage source is higher than the absolute value of the voltage provided to the comparator, which is based on the output voltage of the tuning unit.

When in the preferred embodiment of the inventive voltage supply the output voltage of the tuning unit and the voltage supplied by the accurate DC voltage source are provided to the comparator of the inventive power supply directly, the output signal provided by the control unit is increasing the absolute value of the output voltage of the tuning unit if the absolute value of the voltage of the accurate DC voltage source is higher than the absolute value of the output voltage of the tuning unit provided to the comparator.

In particular if the comparator is providing a digital signal, then in an embodiment the digital signal provided by the comparator indicates by a first value that the absolute value of the accurate voltage, which is provided to the comparator based on the supplied voltage of the accurate DC voltage source is higher than the absolute value of the voltage provided to the comparator, which is based on the output voltage of the tuning unit. The control unit reacts on the first value of the digital signal provided by the comparator and provides a signal, preferably a digital signal, to the tuning unit to increase the absolute value of its output voltage.

In this embodiment the output signal provided by the control unit is decreasing the absolute value of the output voltage of the tuning unit if the absolute value of accurate voltage, which is provided to the comparator based on the supplied voltage of the accurate DC voltage source is lower than the absolute value of the voltage provided to the comparator, which is based on the output voltage of the tuning unit.

The digital signal provided by the comparator indicates by a second value that the absolute value of the accurate voltage, which is provided to the comparator based on the supplied voltage of the accurate DC voltage source is lower than the absolute value of the voltage provided to the comparator, which is based on the output voltage of the tuning unit. The control unit reacts on the second value of the digital signal provided by the comparator and provides a signal, preferably a digital signal, to the tuning unit to decrease the absolute value of its output voltage.

Preferably the increase and decrease of the output voltage of the tuning unit is reduced stepwise by the control unit providing accordingly a signal to the tuning unit. By this reduced change of the output voltage of the tuning unit the absolute difference between the voltages provided to the comparator, which is based on the output voltage of the tuning unit and the accurate voltage, which is provided to the comparator based on the supplied voltage of the accurate DC voltage source is minimised, i.e. the absolute difference between the voltages provided to the comparator, which is based on the output voltage of the tuning unit and the accurate voltage, which is provided to the comparator based on the supplied voltage of the accurate DC voltage source becomes progressively less.

For this approach it is only important, that the stepwise reduction of the change of the output voltage during the tuning process results in a minimisation of the absolute difference of the voltages compared by the comparator.

When in the preferred embodiment of the inventive voltage supply the output voltage of the tuning unit and the voltage of the accurate voltage source are provided to the comparator of the inventive power supply directly, by the reduced change of the output voltage of the tuning unit the absolute difference between the output voltage of the tuning unit and the voltage of the accurate DC voltage source is minimised, i.e. the absolute difference between the output voltage of the tuning unit and the voltage of the accurate DC voltage source becomes progressively less.

When in an embodiment of the inventive power supply the signal provided from the comparator indicates, that the absolute difference of the voltage provided to the comparator, which is based on the output voltage of the tuning unit to the accurate voltage, which is provided to the comparator based on the supplied voltage of the accurate DC voltage source is below a defined minimum value, the tuning by the control unit can be stopped. Then the tuning unit is providing an output voltage, which is a voltage having the stability of the ultra-stable DC voltage source and the accuracy of the accurate DC voltage source and thereby this voltage can be considered to be tuned or calibrated. The output voltage provided by the tuning unit can be directly used as the reference voltage of the power supply or the reference voltage of the power supply can be based on the output voltage of the tuning unit. Then preferably the output voltage of the tuning unit is supplied to an amplifier and the amplified voltage is the reference voltage provided by the voltage supply. The provided reference voltage has been adjusted based on the accurate voltage, which is provided to the comparator and is based on the supplied voltage of the accurate DC voltage source and has due to this adjustment the same accuracy than the accurate voltage, which is provided to the comparator, which has the accuracy of the accurate DC voltage source. But due to the circuit design of the inventive power supply it has now the stability of the ultra-stable DC voltage source due the ultra-stable voltage applied to the tuning unit, which is provided based on the supplied voltage of the ultra-stable DC source. This is in particularly correct, if any electrical component like amplifier have no influence on the accuracy of the accurate voltage provided to the comparator and stability the ultra-stable voltage applied to the tuning unit. Otherwise the performance of the inventive voltage supply may be reduced. But nevertheless the inventive voltage supply will provide a reference voltage of high accuracy and high stability.

When in the preferred embodiment of the inventive voltage supply the output voltage of the tuning unit and the voltage of the accurate voltage source are provided to the comparator of the inventive power supply directly and the signal provided from the comparator indicates, that the absolute difference of the output voltage of the tuning unit to the voltage of the accurate DC voltage source is below a defined minimum value, the tuning by the control unit can be stopped. Then the tuning unit is providing an output voltage which is having the stability of the ultra-stable DC voltage source and the accuracy of the accurate DC voltage source and based on which the reference voltage of the power supply is provided. Preferably the output voltage provided by the tuning unit can be used directly as the reference voltage provided by the inventive power supply. The average of the output voltage of the tuning unit is equal to the average of the voltage supplied by the accurate DC voltage source. So when of the output voltage of the tuning unit is used directly as the reference voltage provided by the inventive power supply the provided reference voltage has—apart from a difference smaller the defined minimum value—the value of the voltage supplied by the accurate DC voltage source and the same accuracy. But due to the circuit design of the inventive power supply it has now the stability of the ultra-stable DC voltage source.

Preferably the ratio of the defined minimum value, when the tuning of the tuning unit is stopped, to the nominal average value of the voltage supplied by the accurate DC voltage source is below 100 ppm, preferably below 40 ppm, more preferably below 25 ppm and most preferably below 10 ppm.

In another embodiment of the inventive power supply the tuning of the tuning unit by the control unit is a process which is minimising the absolute difference of the voltage provided to the comparator, which is based on the output voltage of the tuning unit, to the accurate voltage, which is provided to the comparator based on the supplied voltage of the accurate DC voltage source below a defined minimum. The tuning of the tuning unit by the control unit is finished at the end of the process and then the tuning unit is providing an output voltage based on which the reference voltage of the inventive power supply can be provided. As already explained before, the reduction of the absolute difference of the voltage provided to the comparator, which is based on the output voltage of the tuning unit, to the accurate voltage, which is provided to the comparator based on the supplied voltage of the accurate DC voltage source, results in a reference voltage of the inventive power supply of at least high accuracy and stability and might have, depending on the detailed circuit design of the inventive power supply, the stability of the ultra-stable DC voltage source and the accuracy of the accurate DC voltage source.

As already mentioned before, the tuning unit of the inventive voltage supply can be a digital to analogue converter. In such an embodiment of the inventive voltage supply the control unit of the voltage supply provides a digital signal to the digital to analogue converter to tune the output voltage of the digital to analogue converter.

As also mentioned before, the tuning unit of the inventive voltage supply can comprise one or more digital to analogue converters. In such an embodiment of the inventive voltage supply the control unit of the voltage supply provides a digital signal to each digital to analogue converter to tune the output voltage of the digital to analogue converters.

Preferably a digital to analogue converter of the tuning unit comprises a resistor ladder network, in particular an R-2R resistor ladder network. Then the digital signal provided by the control unit, is a digital signal of a specific number of bits. Preferably the digital signal is a signal of at least 12 bits, particular preferably of at least 16 bits and most preferably of at least 20 bits. When such a digital signal of several bits is provided as tuning input, the bits are switching switches adding resistors in a parallel resistor network of the digital to analogue converter (DAC), which can an R-2R ladder DAC comprising a repeated cascaded structure of resistors having the values R and 2R. In this case each bit is binary weighted.

But the digital signal provided by the control unit can be also a signal of one single bit. Such a signal is in particular used, when a digital to analogue converter of the tuning unit comprises a pulse width modulator and a low-pass filter. Then this one bit signal of the control unit is provided to this digital to analogue converter via an input of the tuning unit.

When the control unit is providing a digital signal to the tuning unit, the control unit preferably comprises a processor or a programmable logic circuit, like a Field Programmable Gate Array (FPGA) or Complex Programmable Logic Device (CPLD).

Preferably the control unit provides a digital signal to each digital to analogue converter of the tuning unit according to the digital signal provided by the comparator. The digital signals provided by the control unit in an preferred embodiment are increasing the absolute value of the output voltage of the tuning unit if the absolute value of the accurate voltage, which is provided to the comparator based on the supplied voltage of the accurate DC voltage source is higher than the absolute value of the voltage provided to the comparator, which is based on the output voltage of the tuning unit. In this case the digital signal provided by the comparator indicates by a first value that the absolute value of the accurate voltage, which is provided to the comparator based on the supplied voltage of the accurate DC voltage source is higher than the absolute value of the voltage provided to the comparator, which is based on the output voltage of the tuning unit. The control unit reacts on the first value of the digital signal provided by the comparator and provides a digital signal to each digital to analogue converter of the tuning unit to increase the absolute value of the output voltage of the tuning unit. The digital signals provided by the control unit in this preferred embodiment are decreasing the absolute value of the output voltage of the tuning unit if the absolute value of the accurate voltage, which is provided to the comparator based on the supplied voltage of the accurate DC voltage source is lower than the absolute value of the voltage provided to the comparator, which is based on the output voltage of the tuning unit. In this case the digital signal provided by the comparator indicates by a second value that the absolute value of the accurate voltage, which is provided to the comparator based on the supplied voltage of the accurate DC voltage source is lower than the absolute value of the voltage provided to the comparator, which is based on the output voltage of the tuning unit. The control unit reacts on the second value of the digital signal provided by the comparator and provides digital signals to each digital to analogue converter of the tuning unit to decrease the absolute value of the output voltage of the tuning unit.

When the control unit provides a digital signal to a tuning unit, which is a digital to analogue converter, according to a digital signal provided by the comparator, a digital signal is provided by the control unit to increase in another preferred embodiment the absolute value of the output voltage of the digital to analogue converter if the absolute value of the accurate voltage, which is provided to the comparator based on the supplied voltage of the accurate DC voltage source, is higher than the absolute voltage provided to the comparator, which is based on the output voltage of the digital to analogue converter. In this case the digital signal provided by the comparator indicates by a first value that the absolute value of the accurate voltage, which is provided to the comparator based on the supplied voltage of the accurate DC voltage source is higher than the absolute value of the voltage provided to the comparator, which is based on the output voltage of the digital to analogue converter. The control unit reacts on the first value of the digital signal provided by the comparator and provides a digital signal to the digital to analogue converter to increase the absolute value of its output voltage. A digital signal is provided by the control unit to decrease in this preferred embodiment the absolute value of the output voltage of the digital to analogue converter, if the value of the absolute value of the accurate voltage, which is provided to the comparator based on the supplied voltage of the accurate DC voltage source is lower than the absolute value of the voltage provided to the comparator, which is based on output voltage of the digital to analogue converter. In this case the digital signal provided by the comparator indicates by a second value that the absolute value of the accurate voltage, which is provided to the comparator based on the supplied voltage of the accurate DC voltage source is lower than the absolute value of the voltage provided to the comparator, which is based on output voltage of the digital to analogue converter. The control unit reacts on the second value of the digital signal provided by the comparator and provides a digital signal to the digital to analogue converter to decrease the absolute value of its output voltage.

Preferably the increase and decrease of the output voltage of the tuning unit is reduced stepwise by the control unit providing accordingly digital signals to the digital to analogue converters of the tuning unit. By this reduced change of the output voltage of the tuning unit the absolute difference between the voltage provided to the comparator, which is based on output voltage of the tuning unit and the accurate voltage, which is provided to the comparator based on the supplied voltage of the accurate DC voltage source is minimised.

When the tuning unit is a digital to analogue converter, also preferably the increase and decrease of the output voltage of the digital to analogue converter is reduced stepwise by the control unit providing accordingly a digital signal. By this reduced change of the output voltage of the digital to analogue converter the absolute difference between the voltage provided to the comparator, which is based on output voltage of the digital to analogue converter and the accurate voltage, which is provided to the comparator based on the supplied voltage of the accurate DC voltage source is minimised.

In many cases the reference voltage provided by the inventive power supply is applied at at least one voltage amplifier, which is applying an amplified voltage to the at least electrode. The reference voltage provided by the inventive power supply can be applied at the at least one voltage amplifier via a switch.

When the output voltage of the tuning unit is directly provided by the inventive voltage supply as reference voltage, the output voltage of the tuning unit can be applied at at least one voltage amplifier, which is applying an amplified voltage to the at least one electrode. The output voltage of the tuning unit can then be applied at the at least one voltage amplifiers via a switch.

In an embodiment of the inventive voltage supply an accurate voltage, which based on the supplied voltage of the accurate DC voltage source, can be also applied at the voltage amplifier via the switch, which is a further component of the inventive voltage supply. The accurate voltage applied at the switch can be in particular an amplified voltage of the accurate voltage supplied by the accurate DC voltage source. The accurate voltage supplied by the accurate DC voltage source is supplied to another amplifier provided in the inventive power supply, which is providing the amplified voltage of the accurate voltage supplied by the accurate DC voltage source. This amplified voltage is then applied at the switch. In an embodiment of the inventive voltage supply the accurate voltage, which is provided to the comparator based on the supplied voltage of the accurate DC voltage source, can be applied also at the voltage amplifier via the switch, which is a further component of the inventive voltage supply.

In an embodiment of the inventive voltage supply also the supplied voltage of the accurate DC voltage source can be applied at the voltage amplifier via the switch, which is a further component of the inventive voltage supply.

The reference voltage provided by the inventive power supply can be used to supply a voltage to one or more electrodes of a mass spectrometer.

The one or more electrodes can be preferably one or more trapping electrodes for trapping ions of an electrostatic trap and the reference voltage applied to the one or more trapping electrodes is preferably a trapping voltage.

In particular the reference voltage provided by the inventive power supply can be used to supply a voltage to the center electrode of an electrostatic trap.

Typically to the electrode of the electrostatic trap is applied a voltage in the range of 0.7 kV to 12 kV. Typically to a center electrode of the electrostatic trap is applied a voltage in the range of 1 kV to 8 kV, preferably a voltage in the range of 2 kV to 7 kV.

In particular it can be an advantage to use the reference voltage provided by the inventive power supply by amplifying the reference voltage to provide an accurate and ultra-stable voltage to the center electrode of an electrostatic trap, in particular orbital trapping electrostatic trap, which can be used as a mass analyser, such as the Orbitrap® mass analyser distributed by Thermo Fisher Scientific Inc. The center electrode of such a mass analyser is for example disclosed in the international patent application WO96/30930, which content is hereby incorporated in this description.

The center electrode is preferably arranged radially central in an electrostatic trap having a longitudinal axis and more preferably arranged radially central and axially central in an electrostatic trap having a longitudinal axis. But the center electrode can be also arranged only axially central in an electrostatic trap having a longitudinal axis.

The electrode of a mass spectrometer can be also an electrode of a time-of-flight mass spectrometer, in particular of a multi-reflection time-of-flight mass spectrometer. In multi-reflection time-of-flight mass spectrometer the reference voltage provided by the voltage supply can be used to provide a voltage to mirror electrodes, preferably all mirror electrodes. Preferably the reference voltage is provided to a voltage amplifier which then provides a voltage in the range of kilovolts (kV) to mirror electrodes, preferably all mirror electrodes, which are acting preferably as ion-optical mirrors. Typically the ions in one type of a multi-reflection time-of-flight mass spectrometer are reflected between opposing ion-optical mirrors several times while they are drifting along a drift direction. Due to the multi-reflection of the ions at the ion-optical mirrors comprising several mirror electrodes, preferably each electrode has to be provided with an accurate and ultra-stable voltage. Any instability could change the trajectory of the ions which are oscillating between the reflecting ion-optical mirrors. Accordingly a changed flight-time of the analysed ions would result in time-of-flight mass spectra of lower resolving power or changing the mass-to-charge-calibration of the detected time-of-flight mass spectra.

In an additional aspect, this disclosure also provides a mass spectrometer comprising a voltage supply in accordance with the invention, which is claimed in claim 28.

The ultra-stable DC voltage source of the inventive power supply has preferably a voltage stability below 1 ppm over a time period of 24 hours.

The ultra-stable DC voltage source of the inventive power supply has preferably a voltage stability below 1 ppm over a temperature range of 10° C.

The ultra-stable DC voltage source of the inventive power supply has particular preferably a voltage stability below 1 ppm over a time period of 24 hours and a temperature range of 10° C.

The accurate DC voltage source of the inventive power supply has preferably a production accuracy of its supplied voltage below 1000 ppm, preferably below 400 ppm, more preferably below 250 ppm and most preferably below 100 ppm.

The second object is solved by the method for calibrating a voltage supply according to claim 23.

The method is calibrating a voltage supply of the present invention, which is providing a reference voltage to supply a voltage to at least one electrode. The voltage supply can provide via a switch a voltage as the reference voltage, which is based on the output voltage of its tuning unit, after the calibration. As already mentioned before, for example the output voltage of the tuning unit can be used directly to supply the reference voltage or the output voltage of the tuning unit can be supplied to an amplifier and then the amplified voltage is the reference voltage provided by the voltage supply.

The method comprises the steps:

When the voltage supply is activated, a voltage provided based on the output voltage of the tuning unit is applied to the switch. But this voltage is not provided via the switch as the reference voltage, which is used to supply a voltage to at least one electrode.

The control unit of the voltage supply is tuning the tuning unit according to the signal provided by the comparator to minimise the absolute difference between the voltage based on the output voltage of the tuning unit and the accurate voltage, which is provided based on the supplied voltage of the accurate DC voltage source compared by the comparator.

When the absolute difference between the voltages compared by the comparator is below a defined minimum value and the tuning by the control unit is stopped, the control unit submits a switching signal to the switch, the switch receiving the switching signal is actuated and then the voltage provided based on the output voltage of the tuning unit applied to the switch is provided by the voltage supply via the switch as the reference voltage, which then is used to supply a voltage to at least one electrode.

In general any voltage, which is based on the output voltage of the tuning unit, can be applied to the switch. This voltage can be derived from the output voltage of the tuning unit by any appropriate arrangement known by a skilled person In particular different voltages, which are based on the output voltage of the tuning unit, can be applied at the switch and compared by the comparator. But in a preferred embodiment the same voltage, which is based on the output voltage of the tuning unit, can be applied at the switch and compared by the comparator. So the voltage provided based on the output voltage of the tuning unit applied to the switch is the voltage based on the output voltage of the tuning unit, which is compared by the comparator.

The voltage provided based on the output voltage of the tuning unit applied to the switch is only used as reference voltage, when the tuning process of the tuning unit has been finished. Then due to the small absolute difference between the voltages compared by the comparator the voltage provided based on the output voltage of the tuning unit applied to the switch has a high accuracy and high stability of an defined voltage value, which is only preset by the electrical components of the power supply, in particular the accurate DC voltage source and possibly present voltage amplifiers, preferably voltage amplifiers amplifying the voltage supplied by the accurate DC voltage source and/or the output voltage of the tuning unit.

The second object can be also solved by the method for calibrating a voltage supply according to claim 25. Also the third second object can be solved by the method for calibrating a voltage supply according to claim 25.

The method is calibrating a voltage supply of the present invention, which is providing a reference voltage to supply a voltage to at least one electrode. In the method, the inventive voltage supply is comprising a switch, to which a voltage provided based on the output voltage of the tuning unit and an accurate voltage, which is provided based on the supplied voltage of the accurate DC voltage source are applied.

The accurate voltage applied at the switch has preferably nearly the same value as the reference voltage of the inventive voltage supply. The value of the accurate voltage applied to the switch typically deviates not more than 1% from the value of the reference voltage of the inventive voltage supply, preferably not more than 1,000 ppm and in particular preferably not more than 100 ppm.

As already mentioned before, the output voltage of the tuning unit can be used directly to supply the reference voltage and applied to the switch of the inventive voltage supply or the output voltage of the tuning unit can be supplied to an amplifier and then the amplified voltage is applied to the switch of the inventive voltage supply and is the reference voltage provided by the voltage supply.

These embodiments represent simple arrangements showing how a voltage provided based on the output voltage of the tuning unit can be applied to the switch. For example other arrangements known by a skilled person might be used to provide a voltage, which is derived from the output voltage of the tuning unit, to the switch.

Also, the voltage supplied by the accurate DC voltage source can be directly applied to the switch of the inventive voltage supply or the voltage supplied by the accurate DC voltage source can be supplied to an amplifier and then the amplified voltage is applied to the switch of the inventive voltage supply.

These embodiments represent simple arrangements showing how an accurate voltage, which is provided based on the supplied voltage of accurate DC voltage source, can be provided to the switch. For example other arrangements known by a skilled person might be used to provide an accurate voltage, which is derived from the supplied voltage of accurate DC voltage source, to the switch.

Via the switch, during an initial period, the accurate voltage, which is provided based on the supplied voltage of the accurate DC voltage source is supplied to the voltage amplifier, while the voltage provided based on the output voltage of the tuning unit applied at the switch is not supplied via the switch to the amplifier. After tuning, the reference voltage, which is then the voltage provided based on the output voltage of the tuning unit applied at the switch is applied to the voltage amplifier, which is supplying the voltage to at least one electrode. The method comprises the steps:

When the voltage supply is activated, a voltage provided based on the output voltage of the tuning unit and an accurate voltage, which is provided based on the supplied voltage of the accurate DC voltage source are applied to the switch and the voltage provided based on the output voltage of the tuning unit applied to the switch is not connected via the switch with the voltage amplifier and the accurate voltage applied to the switch is connected via the switch with the voltage amplifier.

The control unit of the voltage supply is tuning the tuning unit according to the signal provided by the comparator to minimise the absolute difference between the voltage based on the output voltage of the tuning unit and the accurate voltage, which is provided based on the supplied voltage of the accurate DC voltage source compared by the comparator;

When the absolute difference of the voltages compared by the comparator is below a defined minimum value and the tuning by the control unit is stopped, the control unit submits a switching signal to the switch. The switch receiving the switching signal is actuated and then the voltage provided based on the output voltage of the tuning unit applied to the switch is connected via the switch with the voltage amplifier as the reference voltage and the accurate voltage applied to the switch is disconnected by the switch from the voltage amplifier.

In general any voltage, which is based on the output voltage of the tuning unit, can be applied to the switch. This voltage can be derived from the output voltage of the tuning unit by any appropriate arrangement known by a skilled person In particular different voltages, which are based on the output voltage of the tuning unit, can be applied at the switch and compared by the comparator.

In general any accurate voltage, which is provided based on the supplied voltage of the accurate DC voltage source, can be applied to the switch. This voltage can be derived from the supplied voltage of the accurate DC voltage source by any appropriate arrangement known by a skilled person In particular different accurate voltages, which are provided based on the supplied voltage of the accurate DC voltage source, can be applied at the switch and compared by the comparator.

The same voltage provided based on the output voltage of the tuning unit can be applied to the switch and the comparator. So the voltage provided based on the output voltage of the tuning unit applied to the switch is the voltage based on the output voltage of the tuning unit, which is compared by the comparator.

The same accurate voltage provided based on the supplied voltage of the accurate DC voltage source can be applied to the switch and the comparator. So the accurate voltage, which is applied to the switch, is the accurate voltage, which is compared by the comparator.

In a preferred embodiment the same voltage provided based on the output voltage of the tuning unit and the same accurate voltage provided based on the supplied voltage of the accurate DC voltage source can be applied to the switch and the comparator.

In a preferred embodiment of the method the inventive voltage supply comprises a switch, to which the output voltage of the tuning unit and the voltage of the accurate DC voltage source are applied. The comparator of the inventive voltage supply of this embodiment is comparing the output voltage of the tuning unit and the voltage of the accurate DC voltage source. Via the switch, during an initial period, the accurate DC voltage source is connected to the voltage amplifier, while the output voltage of the tuning unit is not connected to the amplifier. After tuning, the reference voltage provided by the output voltage of the tuning unit is applied to a voltage amplifier, which is supplying the voltage to at least one electrode. The method comprises the steps:

When the voltage supply is activated, the output voltage of the tuning unit and the supplied voltage of the accurate DC voltage source are applied to the switch and the output voltage of the tuning unit applied to the switch is not connected via the switch with the voltage amplifier and the supplied voltage of the accurate DC voltage source is connected via the switch with the voltage amplifier.

The control unit of the voltage supply is tuning the tuning unit according to the signal provided by the comparator to minimise the absolute difference between the output voltage of the tuning unit and the supplied voltage of the accurate DC voltage source.

When the absolute difference of the voltages compared by the comparator is below a defined minimum value and the tuning by the control unit is stopped, the control unit submits a switching signal to the switch. The switch receiving the switching signal is actuated and then the output voltage of the tuning unit is connected via the switch with the voltage amplifier as the reference voltage and the supplied voltage of the accurate DC voltage source is disconnected by the switch from the voltage amplifier.

DETAILED DESCRIPTION OF PREFERRED EMBODIMENTS

Figure 1:
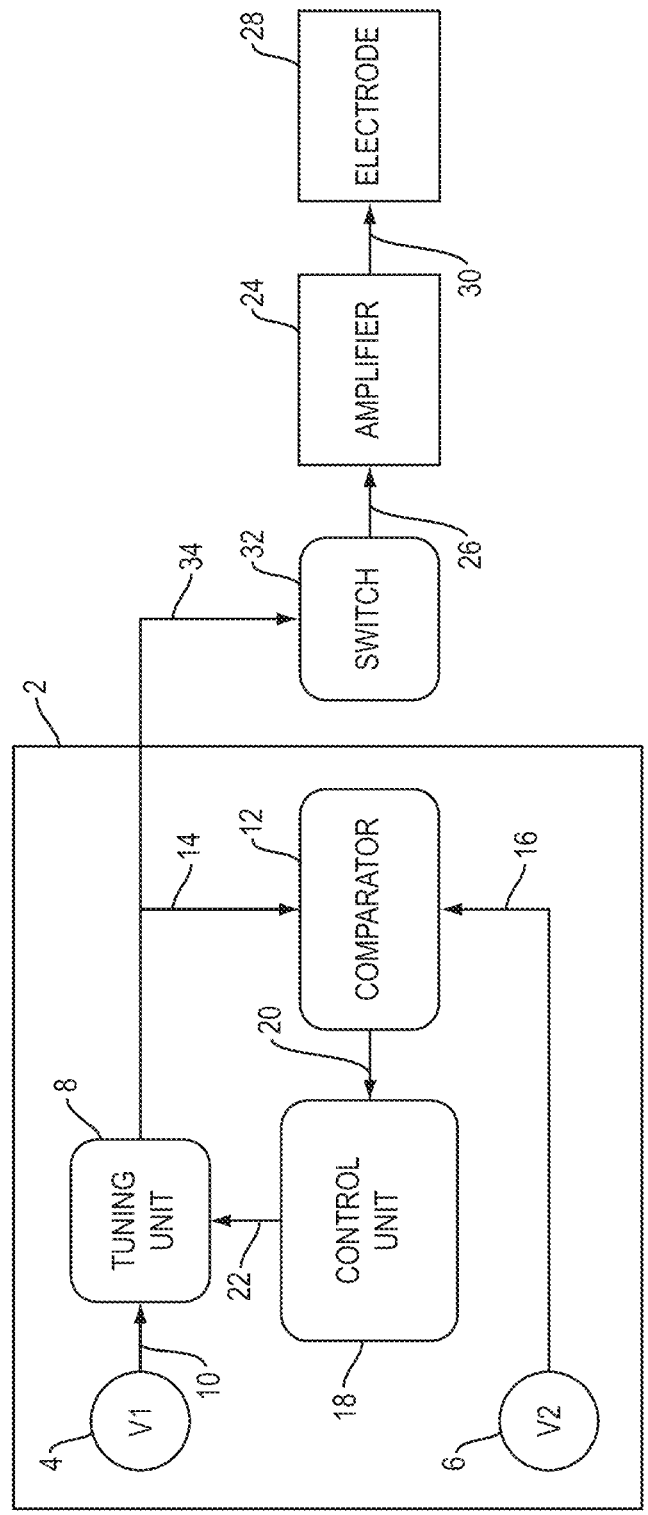
FIG. 1 shows a first embodiment of an inventive voltage supply schematically.

FIG. 1 shows a first embodiment of an inventive voltage supply 2. Schematically are shown the main components of the voltage supply 2, which are essential for the invention.

The inventive voltage supply 2 comprises two different DC voltage sources, an ultra-stable DC voltage source 4 (V1) and an accurate DC voltage source 6 (V2).

The ultra-stable DC voltage source 4 provides a very stable output voltage. The stability of the output voltage is provided over the time and a specific temperature range. Typically the output voltage provide by a DC ultra-stable voltage source 4 has a voltage stability below 5 ppm, preferably below 1 ppm, more preferably below 0.5 ppm and particular preferably below 0.3 ppm. The stability of the output voltage is provided typically over more than 12 hours, preferably over more than 24 hours, more preferably over more than 48 hours and particular over more than 96 hours. The stability of the output voltage is provided typically over a temperature range of more than 10° C., preferably over more than 15° C., more preferably over more than 20° C. and particular over more than 25° C.

For example in the first embodiment of the inventive voltage supply 2 an ultra-stable DC voltage source 4 can be used with a voltage stability below 2 ppm over more than 24 hours and a temperature range of more than 10° C.

The accurate DC voltage source 6 provides a very accurate DC output voltage with a production accuracy typically below 1,000 ppm, preferably below 400 ppm, more preferably below 250 ppm and most preferably below 100 ppm.

For example in the first embodiment of the inventive voltage supply 2 an accurate DC voltage source 6 can be used with a production accuracy below 500 ppm.

In the first embodiment of the inventive voltage supply 2 the voltage supplied by the ultra-stable DC source 4 has a higher absolute value than the voltage supplied by the accurate DC voltage source 6.

Typically in the first embodiment of the inventive voltage supply 2 the absolute value of the voltage of the ultra-stable DC source 4 is at least 2% higher than the absolute value of the voltage of the accurate DC voltage source 6. Preferably the absolute value of the voltage of the ultra-stable DC source 4 is at least 10% higher than the absolute value of the voltage of the accurate DC voltage source 6. More preferably the absolute value of the voltage of the ultra-stable DC source 4 is at least 25% higher than the absolute value of the voltage of the accurate DC voltage source 6.

Typically the absolute value of the voltage of the ultra-stable DC source 4 is not more than 500% higher than the absolute value of the voltage of the accurate DC voltage source 6. Preferably the absolute value of the voltage of the ultra-stable DC source 4 is not more than 200% higher than the absolute value of the voltage of the accurate DC voltage source 6. More preferably the absolute value of the voltage of the ultra-stable DC source 4 is not more than 100% higher than the absolute value of the voltage of the accurate DC voltage source 6.

Typically both voltages sources of the inventive voltage supply, the ultra-stable DC source 4 and the accurate DC voltage source 6 provide voltages with an absolute value in the range of 0.5 V to 100 V, preferably in the range of 2 V and 20 V and more preferably in the range of 2.5 V to 10 V. For example in the first embodiment of the inventive voltage supply 2 an ultra-stable DC source 4 can be used, which provide an average voltage of 9 V and an accurate DC voltage source 6 which provide a nominal voltage of 7 V. Then the inventive voltage supply 2 will provide a reference voltage of 7 V.

The inventive voltage supply 2 also comprises a tuning unit 8, which can be a tunable voltage divider. A tunable voltage divider comprises at least one resistor, preferably a network of connected resistors. In the first embodiment of the inventive voltage supply 2 the voltage of the DC ultra-voltage source 4 is applied to two (input) connectors (not shown) of the tuning unit 8 shown by the arrow 10. The tuning unit 8 comprises an output connector (not shown) to which the tuning unit 8 provides an output voltage. If the tuning unit 8 is a tunable voltage divider, the output voltage is provided by taping the voltage from the resistor or the resistor network of the tunable voltage divider.

The tuning unit 8 provides an output voltage which can be adjusted.

The tuning unit 8 of the inventive voltage supply 2 can be tuned analogue or digitally. In an analogue tuning unit the tuning can be executed also by an electrical component of the electrical circuit or a mechanical component of the tuning unit 8, due to which a tuned output voltage is provided to the (output) connector of the tuning unit 8. If the tuning unit is digitally tuned, a digital signal of one or several bits is provided to at least one tuning input (not shown) of the tuning unit 8.

In the first embodiment of the inventive voltage supply 2 the output voltage of the tuning unit 8 is the reference voltage provided by the voltage supply 2.

The inventive voltage supply 2 also comprises a comparator 12. Preferably the comparator 12 comprises an operational amplifier which is more preferably a differential amplifier and in particular preferably a high-gain differential amplifier which is providing a digital signal.

In the first embodiment of the inventive voltage supply 2 the output voltage of the tunable voltage divider 8 shown by the arrow 14 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages. The output signal can be a signal which is equal or proportional to the difference of the compared voltages. The output signal which is resulting from the comparison of these two input voltages can be also a digital signal which has only the output signals 0 and 1. By these signals it is only indicated which of the two input voltages has the higher value.

For such a kind of comparator can be used a high-gain differential amplifier, which is providing a very low or high voltage, which are then identified as signal 0 and 1.

The inventive power supply 2 comprises also a control unit 18.

The signal provided by the comparator 12, which results in the first embodiment of the inventive voltage supply 2 from the comparison of the output voltage of the tuning unit 8 and the voltage of the accurate voltage source 6 is provided to the control unit 18 as input signal shown by arrow 20.

The control unit 18 in the first embodiment of the inventive voltage supply 2 is tuning the tuning unit 8 according to the signal provided by the comparator 12 to minimise the difference between the output voltage of the tuning unit 8 and the voltage of the accurate DC voltage source 6. To achieve this, the control unit 18 provides an output signal, which is provided to the tuning unit 8 shown by arrow 22.

When the signal provided from the comparator 12 indicates, that the total difference of the output voltage of the tuning 8 to the voltage of the accurate DC voltage source 6 is below a defined minimum value, the tuning by the control unit 18 will be stopped. Preferably the ratio of the defined minimum value, when the tuning of the tunable voltage divider 8 is stopped, to the nominal average value of the voltage supplied by the accurate DC voltage source 6 is below 500 ppm, preferably below 200 ppm, more preferably below 50 ppm and most preferably below 10 ppm.

For example in the first embodiment of the inventive voltage supply 2 the defined minimum value can be 140 µV. For a nominal voltage the accurate DC voltage source 6 of 7 V then the ratio of the defined minimum value to the nominal average value of the voltage supplied by the accurate DC voltage source 6 is 20 ppm.

Then the tuning unit 8 is providing an output voltage, which is in the first embodiment of the inventive voltage supply 2 a reference voltage having the stability of the ultra-stable DC voltage source 4 and the accuracy of the accurate DC voltage source 6. The average of the output voltage of the tuning unit divider 8 is equal to the average of the voltage supplied by the accurate DC voltage source 6. So the provided reference voltage has—apart from a difference smaller the defined minimum value—the value of the voltage supplied by the accurate DC voltage source 6 and the same accuracy. But due to the inventive power supply 2 it has now the stability of the ultra-stable DC voltage source 4.

If the signal provided by the comparator 12 which is provided to the control unit 18 is equal or proportional to the difference of the compared voltages, according to the detected voltage difference the control unit 18 reacts and provides a signal to the tuning unit 8 to increase or decrease its output voltage according to the detected voltage difference. In the first embodiment of the inventive voltage supply 2 the difference of the output voltage of the tuning unit 8 and the voltage of the accurate DC voltage source 6 is reduced.

The output signal provided by the control unit 18 (arrow 22) in the first embodiment of the inventive voltage supply 2 is increasing the output voltage of the tunable voltage divider 8 if the value of the voltage of the DC accurate voltage source 6 is higher than the output voltage of the tunable voltage divider 8.

In particular if the comparator 12 in the first embodiment of the inventive voltage supply 2 is providing a digital signal, then the digital signal provided by the comparator 12 indicates by a first value that the voltage of the accurate DC voltage source 6 is higher than the output voltage of the tuning unit 8. The control unit reacts on the first value of the digital signal provided by the comparator and provides a signal to the tuning unit 8 to increase its output voltage.

The output signal provided by the control unit 18 in the first embodiment of the inventive voltage supply 2 is decreasing the output voltage of the tuning unit 8 if the value of the voltage of the accurate DC voltage source 6 is lower than the output voltage of the tunable voltage divider 8.

In particular if the comparator 12 in the first embodiment of the inventive voltage supply 2 is providing a digital signal, then the digital signal provided by the comparator 12 indicates by a second value that the voltage of the accurate DC voltage source 6 is lower than the output voltage of the tuning unit 8. The control unit reacts on the second value of the digital signal provided by the comparator 12 and provides a signal to the tuning unit 8 to decrease its output voltage.

Preferably the increase and decrease of the output voltage of the tuning unit 8 is reduced stepwise by the control unit 18 providing accordingly a signal to the tuning unit 8.

By this reduced change of the output voltage of the tuning unit 8 in the first embodiment of the inventive voltage supply 2 the absolute difference between the output voltage of the tuning unit 8 and the voltage of the accurate DC voltage source 6 is minimised.

In the first embodiment of the FIG. 1 the output voltage of the tuning unit 8 of the inventive voltage supply 2 is applied as reference voltage at a voltage amplifier 24 shown by arrow 26, which is applying an amplified voltage to an electrode 28 shown by arrow 30. The output voltage of the tuning unit 8 is applied to the voltage amplifier 24 via a switch 32. Accordingly the output voltage of the tuning unit 8 is directly applied to the switch 32 shown by arrow 34.

The switch 32 will connect in the first embodiment of the inventive voltage supply 2 the output voltage of the tuning unit 8 with the voltage amplifier 24 at a defined time after the voltage supply 2 has been activated. Preferably the time delay to connect the output voltage of the tuning unit 8 with the voltage amplifier 24 is chosen in that way that the tuning of the tuning unit 8 by the control unit 18 has been finished before the output voltage of the tuning unit 8 is connected with the voltage amplifier 24. Then the output voltage of the tuning unit 8 is a reference voltage, having the accuracy of the accurate DC voltage source 6 and stability of the ultra-stable DC voltage source 4, which is applied to the voltage amplifier 24. Then the voltage amplifier 24 is supplying a voltage of high accuracy and stability based on the reference voltage provided by the power supply 2 to the electrode 28.

In a not shown further embodiment of the inventive voltage supply 2 the switch 32 is a component of the inventive voltage supply 2 and the control unit 18 is submitting a switching signal to the switch 32, when the tuning of the tuning unit 8 by the control unit 18 is stopped. Then the switch 32 is actuated due to the received switching signal and a voltage provided based on the output voltage of the tuning unit 8 applied to the switch is provided by the inventive voltage supply 2 via the switch 32 as the reference voltage.

When the inventive voltage supply 2 has the same components as the first embodiment of the inventive voltage supply 2 and further the control unit 18 is connected with the switch 32 to submit a switching signal to the switch 32 and the switch 32 is actuated due to the received switching signal submitted after the tuning of the tuning unit 8, the output voltage of the tuning unit 8 is connected after the actuation of the switch with the voltage amplifier 24. Then output voltage of the tuning unit 8 is applied at the voltage amplifier 24 as an ultra-stable and accurate reference voltage.

Figure 2:
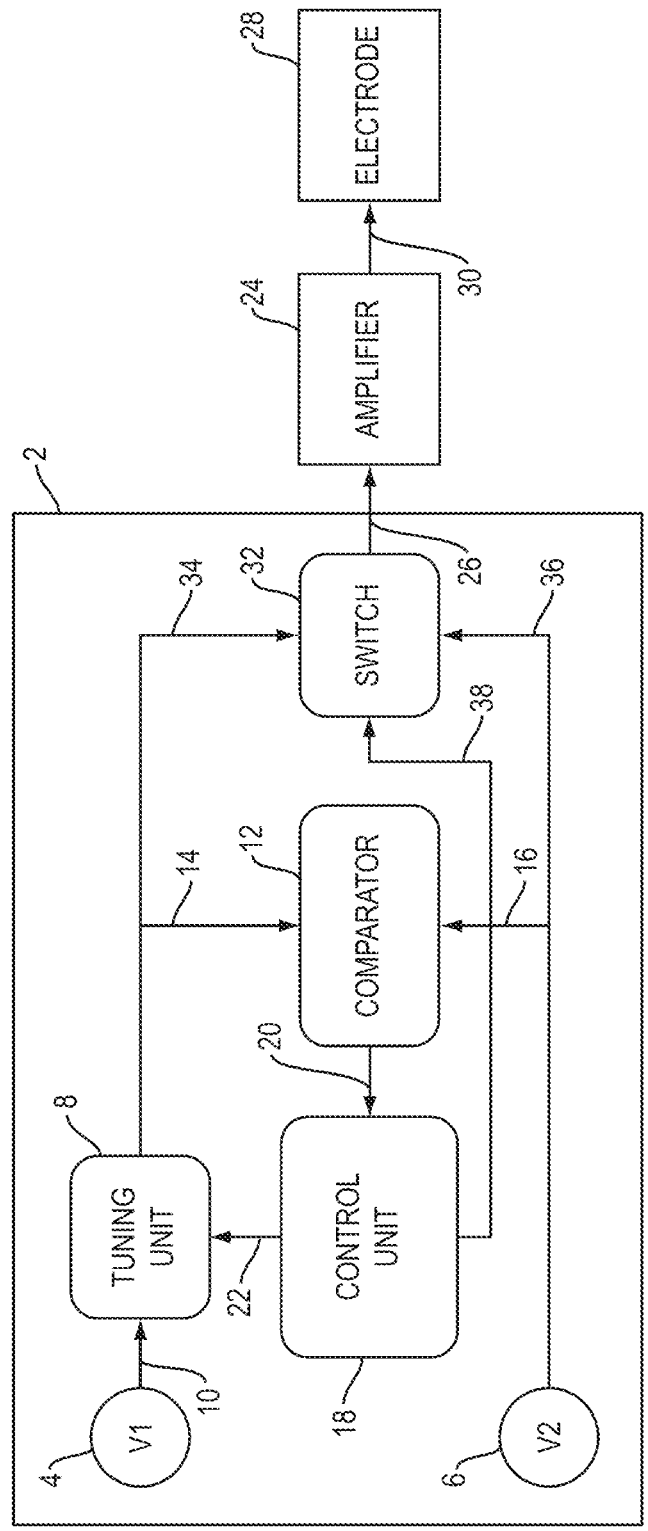
FIG. 2 shows a second embodiment of an inventive voltage supply schematically.

FIG. 2 shows a second embodiment of an inventive voltage supply 2. Schematically are shown the main components of the voltage supply 2, which are essential for the invention. For components of the inventive voltage supply 2 of the second and all further embodiments are used the same reference signs as in the preceding embodiments, if the same components are used in the embodiments.

Because the most components are in following embodiments the same as in the preceding embodiments, these components are not described for the following embodiments and it is referred to the description of these components regarding FIG. 1 or other preceding embodiments and their related Figures.

The main difference of the first and second embodiment is that the switch 32 is a component of the voltage supply 2 in the second embodiment. The switch 32 is also able to connect the output voltage of the tuning unit 8 applied to the switch 32 with the voltage amplifier 24, which is applying an amplified voltage to an electrode 28. But the voltage of the accurate DC voltage source 6 is also provided to the switch 32 shown by arrow 36.

An additional difference of the first and second embodiment is that the control unit 18 also provides a switching signal to the switch 32 shown by the arrow 38.

The second embodiment of the voltage supply 2 is able to execute the following calibration method of the voltage supply 2 to provide a reference voltage of high accuracy and stability.

When the voltage supply 2 is activated, in a first step the switch 32 is connecting the accurate DC voltage source 6 with the voltage amplifier 24, which is applying an amplified voltage to an electrode 28. In this stage of the calibration method the nominal voltage of the accurate DC voltage source 6 is already applied at the voltage amplifier 24. So the applied voltage is already accurate, but has limited stability according to the stability of the accurate DC voltage source 6.

In this first step is the output voltage of the tuning unit 8 is not connected via the switch 32 with the voltage amplifier 24.

As already described for the first embodiment in detail, the control circuit 18 of the voltage supply 2 is tuning in the second step the tuning unit 8 according to the signal provided by the comparator 12 to minimise the absolute difference between the output voltage of the tuning unit 8 and the voltage of the accurate DC voltage source 6.

When the signal provided from the comparator 12 indicates, that the absolute difference of the output voltage of the tuning unit 8 to the voltage of the accurate DC voltage source 6 is below a defined minimum value, the tuning by the control unit 18 will be stopped. Then the control unit submits in a third step a switching signal to the switch 32 shown by the arrow 38. When the switch 32 has received the switching signal, the switch 32 is actuated and then the output voltage of the tuning unit 8 is connected with the voltage amplifier 24 and the voltage supplied by the accurate DC voltage source 6 is disconnected by the switch from the voltage amplifier 24. Then the output voltage of the tuning unit 8 is a reference voltage, having the accuracy of the accurate DC voltage source 6 and stability of the ultra-stable DC voltage source 4, which is applied at the voltage amplifier 24. Then the voltage amplifier 24 is supplying a voltage of high accuracy and stability based on the to the reference voltage provided by the power supply 2 to the electrode 28.

So in the second embodiment of the inventive voltage supply 2 at first the output voltage of the tuning unit 8 is calibrated to provide the intended reference voltage with high accuracy and stability and when the control circuit 18 of the voltage supply 2 has this achieved, the switch 32 is actuated to provide the optimized reference voltage to the voltage amplifier 24. During this calibration the nominal voltage of the accurate DC voltage source 6 is applied to the voltage amplifier 24 having a limited stability.

This limited stability of the voltage applied to the voltage amplifier 24 during the tuning period of the reference voltage with high accuracy and stability is uncritical, because the tuning period is typically in the range of some seconds, while the warm up of an activated voltage supply of the electrode typically providing a high voltage in the kV range takes a much longer time, typically in the range of 30 to 60 minutes. And just if an instrument is switched off only for a short period, the electronics supplying the voltage to the electrode requires some time, typically in the range of several seconds to a few minutes, to be stabilised. In this phase it is helpful, when accurate DC voltage source 6 is providing a voltage having already the value of the required reference voltage, because the electrical components, in particular resistors are already supplied with the right power. That in this phase the voltage provided by the accurate DC voltage source 6 has a limited stability is not relevant.

Figure 3:
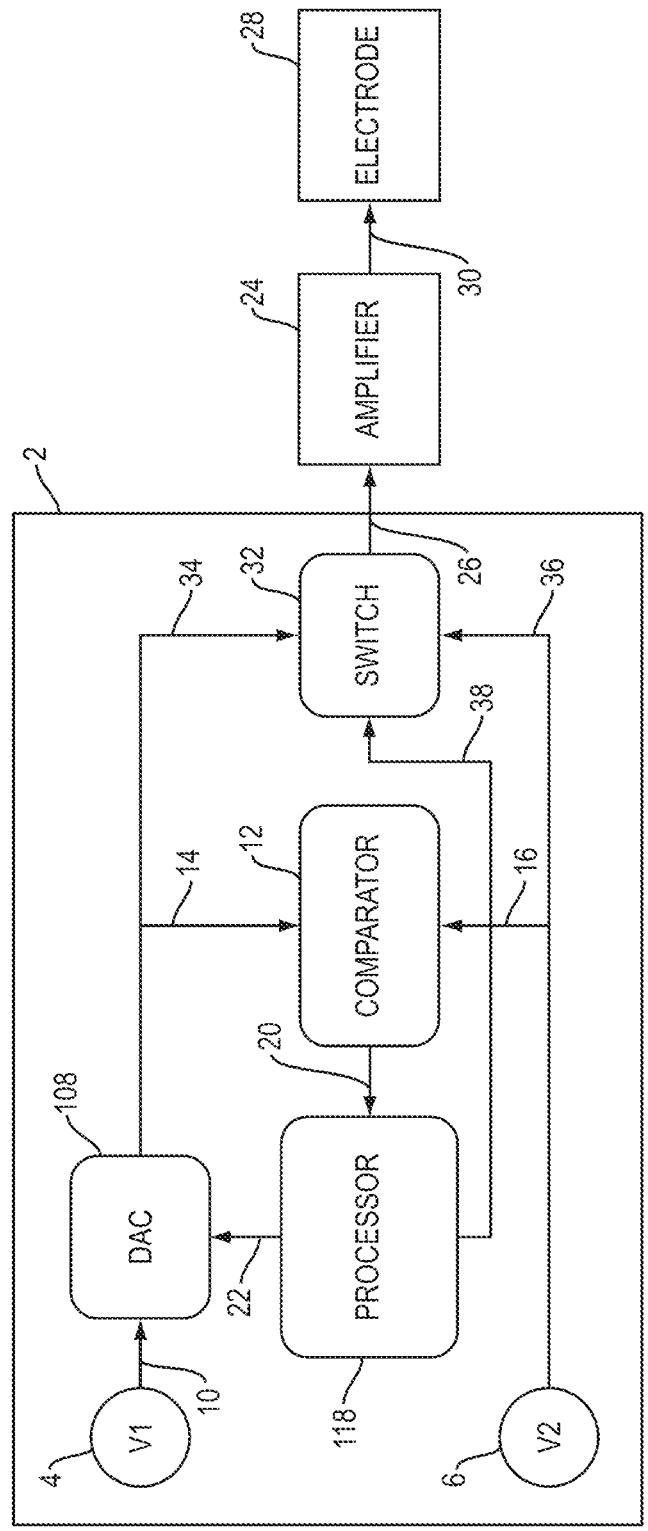
FIG. 3 shows a third embodiment of an inventive voltage supply schematically comprising digital components.

FIG. 3 shows a third embodiment of an inventive voltage supply 2. Schematically are shown the main components of the voltage supply 2, which are essential for the invention. For components of the inventive voltage supply 2 of the third embodiment are used the same reference signs as in the first embodiment of FIG. 1 or second embodiment of FIG. 2, if the same components are used.

The voltage supply 2 of the third embodiment comprises in principle the same components as the second embodiment, but for several components digital technology is used, which can improve the functionality of the inventive voltage supply 2 further.

The inventive voltage supply 2 of the third embodiment comprises two different DC voltage sources, an ultra-stable DC voltage source 4 (V1) and an accurate DC voltage source 6 (V2).

The parameters of such ultra-stable DC voltage source 4 (V1) and an accurate DC voltage source 6 (V2) are the same as described for the first embodiment. Also the relation of the absolute values of the voltages of these DC voltages is the same as described for the first embodiment.

For example in the third embodiment of the inventive voltage supply 2 an ultra-stable DC source 4 can be used, which provides an average voltage of 7 V and an accurate DC voltage source 6 which provide a nominal voltage of 5 V. Then the inventive voltage supply 2 will provide a reference voltage of 5 V.

The third embodiment of the inventive voltage supply 2 comprises a tuning unit, which is a digital to analogue converter (DAC) 108. A digital signal of several bits is provided to the digital input of the digital to analogue converter (DAC) 108 for digitally tuning the digital to analogue converter (DAC) 108.

The voltage of the ultra-stable DC voltage source 4 is applied at two (input) connectors (not shown) of the digital to analogue converter (DAC) 108 shown by the arrow 10. The digital to analogue converter (DAC) 108 comprises an output connector (not shown) to which the digital to analogue converter (DAC) 108 provides an output voltage by tapping the voltage from the resistor network of digital to analogue converter (DAC) 108.

The output voltage of the digital to analogue converter (DAC) 108 is the reference voltage provided by the voltage supply 2.

The inventive voltage supply 2 also comprises a comparator 12. Preferably the comparator 12 comprises an operational amplifier which is a differential amplifier.

The output voltage of the digital to analogue converter (DAC) 108 shown by the arrow 14 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages. The output signal which is resulting from the comparison of these two input voltages is a digital signal which has only the output signal 0 and 1. By these signals it is only indicated which of the two input voltages has the higher value.

For such a kind of comparator can be used a high-gain differential amplifier, which is providing a very low or high voltage, which are then identified as signal 0 and 1.

The inventive voltage supply 2 comprises also a control unit, which is processor 118. A computer program can be executed by the processor to operate the voltage supply 2 in accordance with the described steps.

The signal provided by the comparator 12, which results from the comparison of the output voltage of digital to analogue converter (DAC) 108 and the voltage of the accurate voltage source 6, is provided to the processor 118 as input signal shown by arrow 20.

The processor 118 is tuning the digital to analogue converter (DAC) 108 according to the digital signal provided by the comparator 12 to minimise the absolute difference between the output voltage of the digital to analogue converter (DAC) 108 and the voltage of the accurate DC voltage source 6. To achieve this, the processor 118 provides a digital output signal, which is provided to the digital to analogue converter (DAC) 108 shown by arrow 22.

The output signal provided by the processor 118 (arrow 22) is increasing the output voltage of the digital to analogue converter (DAC) 108 if the value of the voltage of the accurate DC voltage source 6 is higher than the output voltage of the digital to analogue converter (DAC) 108.

When the digital signal provided by the comparator 12 indicates by a first value that the voltage of the accurate DC voltage source 6 is higher than the output voltage of the digital to analogue converter (DAC) 108, the processor 118 reacts on the first value of the digital signal provided by the comparator 12 and provides a digital signal to the digital to analogue converter (DAC) 108 to increase its output voltage.

The output signal provided by processor 118 is decreasing the output voltage of the digital to analogue converter (DAC) 108 if the value of the voltage of the DC accurate voltage source 6 is lower than the output voltage of the digital to analogue converter (DAC) 108.

When the digital signal provided by the comparator 12 indicates by a second value that the voltage of the accurate DC voltage source 6 is lower than the output voltage of the digital to analogue converter (DAC) 108, the processor 118 reacts on the second value of the digital signal provided by the comparator 12 and provides a digital signal to the digital to analogue converter (DAC) 108 to decrease its output voltage.

Preferably the increase and decrease of the output voltage of the digital to analogue converter (DAC) 108 is reduced stepwise by the processor 118 providing accordingly a signal to the digital to analogue converter (DAC) 108. By this reduced change of the output voltage of the digital to analogue converter (DAC) 108 the absolute difference between the output voltage of the digital to analogue converter (DAC) 108 and the voltage of the accurate DC voltage source 6 is minimised.

Then the digital to analogue converter (DAC) 108 is providing an output voltage, which is a reference voltage having the stability of the ultra-stable DC voltage source 4 and the accuracy of the accurate DC voltage source 6. The average of the output voltage of the digital to analogue converter (DAC) 108 is equal to the average of the voltage supplied by the accurate DC voltage source 6. So the provided reference voltage has—apart from a small difference—the value of the voltage supplied by the accurate DC voltage source 6 and the same accuracy. But due to the inventive power supply 2 it has now the stability of the ultra-stable DC voltage source 4.

In a preferred embodiment the digital to analogue converter 108 comprises a resistor ladder network, in particular an R-2R resistor ladder network. The digital signal provided by the processor 118 in this preferred embodiment is a digital signal of a specific number of bits. Preferably the digital signal is a signal of at least 16 bits, particular preferably of at least 20 bits. Based on the digital signal provided by the comparator 12, the processor is applying the method of successive approximation to minimise the absolute difference between the output voltage of the digital to analogue converter (DAC) 108 and the voltage of the accurate DC voltage source 6. In this method according to the bits of the digital signal provided by the processor 118 to the digital to analogue converter (DAC) 108 the output voltage of the digital to analogue converter (DAC) 108 is determined by the R-2R resistor ladder network. The resistor network is dividing with each set bit (value 1) the provided voltage of the ultra-stable DC voltage source 4 into equal shares. So the first bit is dividing the voltage to the share ½, the second is dividing the remaining voltage into shares of ¼, the third is dividing the remaining voltage into shares of ⅛ and so forth.

Before the approximation all bits of the digital signal are set to 0 (alternatively they can all be set to 1). When the comparator 12 at the beginning of the approximation is providing for the first time a digital signal, which is indicating if the voltage of the accurate DC voltage source 6 is higher or lower than the output voltage of the digital to analogue converter (DAC) 108, the first bit is accordingly set by the processor to adjust accordingly the output voltage of the digital to analogue converter (DAC) 108. Normally in this first iteration step the first bit is set to 1 and accordingly the output voltage of the digital to analogue converter (DAC) 108 is the half of the voltage of the ultra-stable DC voltage source 4. Then the comparator 12 in the next iteration is providing a second digital signal, which is indicating if the voltage of the accurate DC voltage source 6 is higher or lower than the output voltage of the digital to analogue converter (DAC) 108. If now the voltage of the output voltage of the digital to analogue converter (DAC) 108 too high due to setting the bit before to 1, the bit is set back and the second bit is set to 1. Otherwise the second bit is set to 1 and the first bit remains unchanged. Then the comparator 12 in the next iteration is providing a third digital signal, which is indicating if the voltage of the accurate DC voltage source 6 is higher or lower than the output voltage of the digital to analogue converter (DAC) 108. If now the voltage of the output voltage of the digital to analogue converter (DAC) 108 too high due to setting the (second) bit before to 1, the bit is set back and the third bit is set to 1. Otherwise only the third bit is set to 1 and the second bit remains unchanged.

Over the iteration steps of the method each of the bits of the digital signal provided by the processor 118 to the digital to analogue converter (DAC) 108 is set and the output voltage of the digital to analogue converter (DAC) 108 is correctly adjusted to the voltage of the accurate DC voltage source 6. The accuracy of this adjustment is increasing fast and so the ratio of the remaining absolute difference between output voltage of the digital to analogue converter (DAC) 108 and the voltage of the accurate DC voltage source 6 at the end of the approximation to the nominal average value of the voltage of the accurate DC voltage source 6 is for a 20 bit signal provided by the processor 118 to the digital to analogue converter (DAC) 108 1 ppm, for a 16 bit signal 15 ppm and a 14 bit signal 61 ppm. Depending on the properties of the comparator the remaining absolute difference could be also bigger than these values, but this is not relevant as long as the reference voltage has now the required stability.

In the embodiment of the FIG. 3 the output voltage of the digital to analogue converter (DAC) 108 of the inventive voltage supply 2 is applied as reference voltage at a voltage amplifier 24 shown by arrow 26, which is applying an amplified voltage to an electrode 28 shown by arrow 30. The output voltage of the digital to analogue converter (DAC) 108 is applied at the voltage amplifier 24 via a switch 32 after the tuning process has been finished. Accordingly the output voltage of the digital to analogue converter (DAC) 108 is directly applied to the switch 32 shown by arrow 34.

The voltage of the accurate DC voltage source 6 is also provided to the switch 32 shown by arrow 36.

The processor 118 provides a switching signal to the switch 32 shown by the arrow 38.

The third embodiment of the voltage supply 2 is able to execute the following calibration method of the voltage supply 2 to provide a reference voltage of high accuracy and stability.

When the voltage supply 2 is activated, in a first step the switch 32 is connecting the accurate DC voltage source 6 with the voltage amplifier 24, which is applying an amplified voltage to an electrode 28. In this stage of the calibration method the nominal voltage of the accurate DC voltage source 6 is already applied at the voltage amplifier 24. So the applied voltage is already accurate, but has limited stability according to the stability of the accurate DC voltage source 6.

In this first step is the output voltage of the digital to analogue converter (DAC) 108 not connected via the switch 32 with the voltage amplifier 24.

The processor 118 of the voltage supply 2 is tuning in the second step the digital to analogue converter (DAC) 108 according to the signal provided by the comparator 12 to minimise the absolute difference between the output voltage of the digital to analogue converter (DAC) 108 and the voltage of the accurate DC voltage source 6 as described before preferably using the method of successive approximation.

When the tuning by the processor 118 has been finished, which means that all bits are set when the method of successive approximation is used, the processor 118 submits in a third step a switching signal to the switch 32 shown by the arrow 38. When the switch 32 has received the switching signal, the switch is actuated and then the output voltage of the digital to analogue converter (DAC) 108 is connected with the voltage amplifier 24 and the supplied voltage of the accurate DC voltage source 6 is disconnected by the switch from the voltage amplifier 24. Then the output voltage of the digital to analogue converter (DAC) 108 is a reference voltage, having the accuracy of the accurate DC voltage source 6 and stability of the ultra-stable DC voltage source 4, which is applied at the voltage amplifier 24. Then the voltage amplifier 24 is supplying a voltage of high accuracy and stability based on the reference voltage provided by the voltage supply 2 to the electrode 28.

So in the third embodiment of the inventive voltage supply 2 at first the output voltage of the digital to analogue converter (DAC) 108 is calibrated to provide the intended reference voltage with high accuracy and stability and when the control circuit of the voltage supply 2 has this achieved, the switch 32 is actuated to provide the optimised reference voltage to the voltage amplifier 24. During this calibration the nominal voltage of the accurate DC voltage source 6 is applied at the voltage amplifier 24 which has a limited stability.

Figure 4:
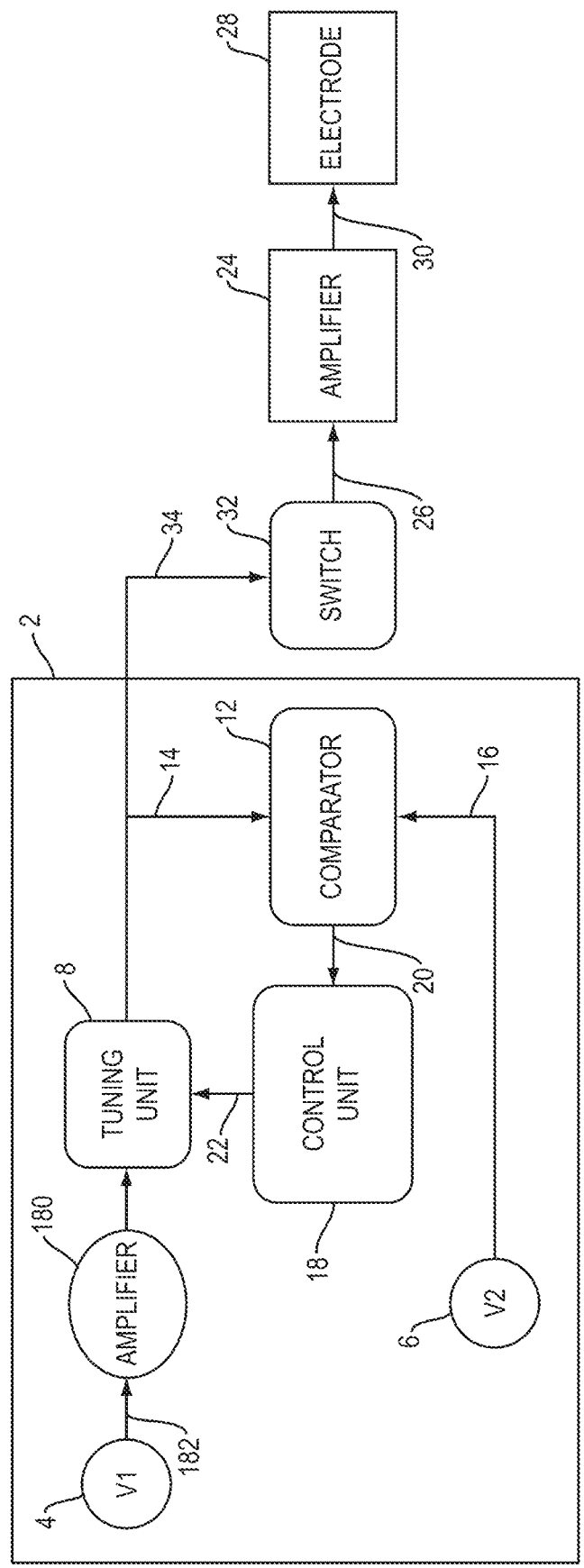
FIG. 4 shows a fourth embodiment of an inventive voltage supply schematically.

FIG. 4 shows a fourth embodiment of the inventive power supply 2.

In this embodiment, in which in general all components are the same as in the first embodiment, the voltage supplied by the ultra-stable DC voltage source 4 is not applied directly to (input) connectors (not shown) of the tuning unit 8. The voltage of the ultra-stable DC voltage source 4 is applied to a voltage amplifier 180—named in the further specification ultra-stable voltage amplifier 180— shown by the arrow 182. The amplified voltage provided at the output of the ultra-stable voltage amplifier 180 is then provided to two (input) connectors (not shown) of the tuning unit 8 shown by the arrow 10 as an example of an ultra-stable voltage which is based on the supplied voltage of the ultra-stable voltage source 4.

In the fourth embodiment of the inventive voltage supply 2 the amplified voltage provided at the output of the ultra-stable voltage amplifier 180 has a higher absolute value than the voltage supplied by the accurate DC voltage source 6. The voltage supplied by the ultra-stable DC voltage source 4 can have a lower absolute value than the voltage supplied by the accurate DC voltage source 6.

Typically in the fourth embodiment of the inventive voltage supply 2 the absolute value of the amplified voltage provided at the output of the ultra-stable voltage amplifier 180 is at least 2% higher than the absolute value of the voltage of the accurate DC voltage source 6. Preferably the absolute value of the amplified voltage provided at the output of the ultra-stable voltage amplifier 180 is at least 10% higher than the absolute value of the voltage of the accurate DC voltage source 6. More preferably the absolute value of the amplified voltage provided at the output of the ultra-stable voltage amplifier 180 is at least 25% higher than the absolute value of the voltage of the accurate DC voltage source 6.

Typically the absolute value of the amplified voltage provided at the output of the ultra-stable voltage amplifier 180 is not more than 500% higher than the absolute value of the voltage of the accurate DC voltage source 6. Preferably the absolute value of the amplified voltage provided at the output of the ultra-stable voltage amplifier 180 is not more than 200% higher than the absolute value of the voltage of the accurate DC voltage source 6. More preferably the absolute value of the amplified voltage provided at the output of the ultra-stable voltage amplifier 180 is not more than 100% higher than the absolute value of the voltage of the accurate DC voltage source 6.

For example in the fourth embodiment of the inventive voltage supply 2 an ultra-stable DC source 4 can be used, which provide an average voltage of 4 V and an accurate DC voltage source 6 which provide a nominal voltage of 5 V. The ultra-stable voltage amplifier 180 is then amplifying the average voltage of 4 V provided by the ultra-stable DC source 4 to an amplified voltage of 7 V provided to two (input) connectors (not shown) of the tuning unit 8. Then the inventive voltage supply 2 will provide a reference voltage of 5 V.

Because all other components of the first and fourth embodiment of the inventive voltage supply are the same, the tuning unit 8 of the fourth embodiment of the inventive voltage supply 2 is providing an output voltage, which is the reference voltage provided by the fourth embodiment of the inventive voltage supply 2 having the stability of the ultra-stable DC voltage source 4 and the accuracy of the accurate DC voltage source 6. This is in particularly correct, if the ultra-stable voltage amplifier 180 has no influence on stability of the amplified voltage applied to the tuning unit 8, so that the amplified voltage provided at the output of the ultra-stable voltage amplifier 180 and provided to the tuning unit 8 has the same stability than the voltage supplied by the ultra-stable DC voltage source 4. Otherwise the performance of the fourth embodiment of the inventive voltage supply 2 may be somewhat reduced. But nevertheless the fourth embodiment of the inventive voltage supply 2 will provide a reference voltage of high accuracy and high stability.

The average of the output voltage of the tuning unit divider 8 of the fourth embodiment of the inventive voltage supply 2 is after the tuning period equal to the average of the voltage supplied by the accurate DC voltage source 6 during the tuning period. So the provided reference voltage has—apart from a difference smaller the defined minimum value of total difference of the output voltage of the tuning 8 to the voltage of the accurate DC voltage source 6, below which the tuning by the control unit 18 will be stopped—the value of the voltage supplied by the accurate DC voltage source 6 and the same accuracy. But due to the fourth embodiment of the inventive power supply 2 the provided reference voltage has now the stability of the ultra-stable DC voltage source 4.

Figure 5:
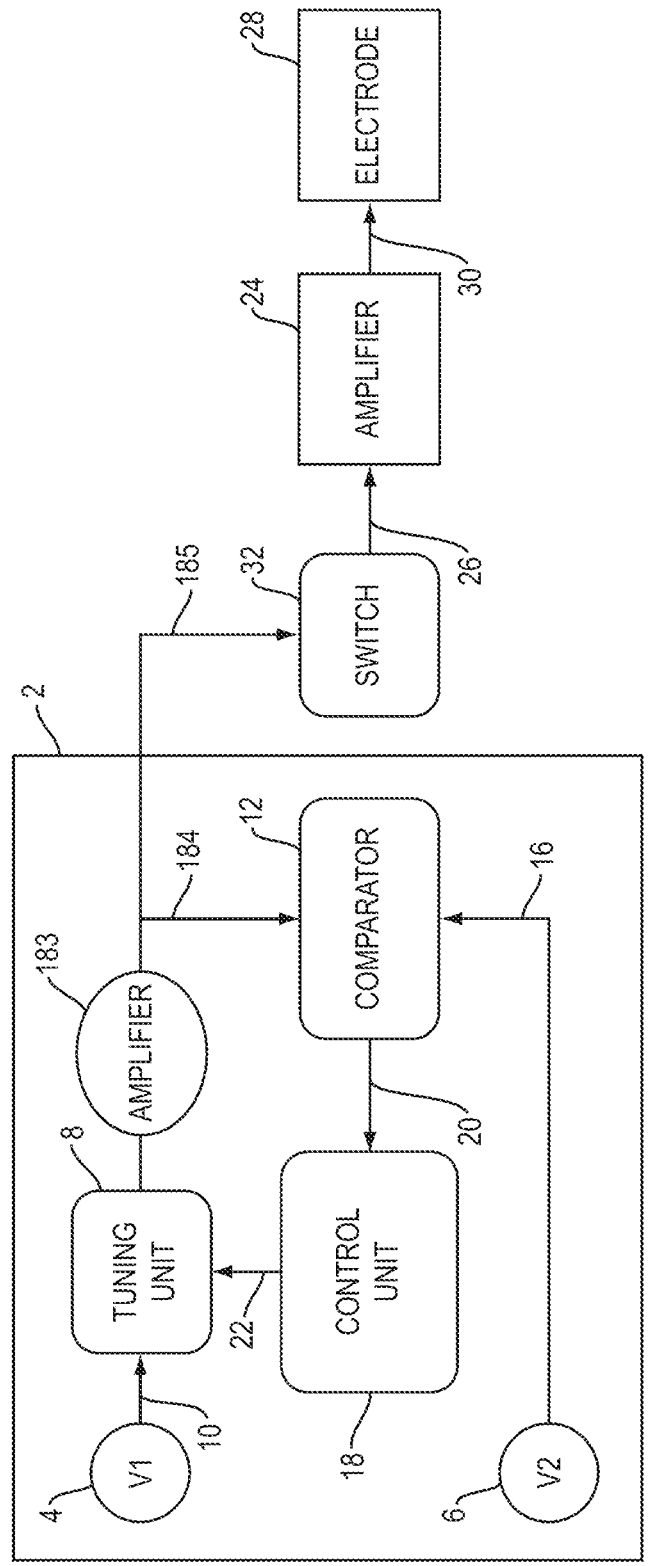
FIG. 5 shows a fifth embodiment of an inventive voltage supply schematically.

FIG. 5 shows a fifth embodiment of the inventive power supply 2.

In this embodiment, in which in general all components are the same as in the first embodiment, the output voltage of the tunable voltage divider 8 is provided to an amplifier 183—named in the further specification output voltage amplifier 183. The output voltage amplifier 183 amplifies the output voltage of the tunable voltage divider 8. So an amplified output voltage is provided at the output of the output voltage amplifier 183. This amplified output voltage is an example of a voltage based on the output voltage of the tuning unit 8.

In the fifth embodiment of the inventive voltage supply 2 the amplified output voltage provided at the output of the output voltage amplifier 183 shown by the arrow 184 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages. The output signal can be a signal which is equal or proportional to the difference of the compared voltages. The output signal which is resulting from the comparison of these two input voltages can be also a digital signal which has only the output signals 0 and 1. By these signals it is only indicated which of the two input voltages has the higher value or higher absolute value.

In the fifth embodiment of the inventive voltage supply 2 the voltage supplied by the ultra-stable DC voltage source 4 can have a lower absolute value than the voltage supplied by the accurate DC voltage source 6.

The signal provided by the comparator 12, which results in the fifth embodiment of the inventive voltage supply 2 from the comparison of the amplified output voltage provided at the output of the output voltage amplifier 183 and the voltage of the accurate voltage source 6, is provided to the control unit 18 as input signal shown by arrow 20.

The control unit 18 in the fifth embodiment of the inventive voltage supply 2 is tuning the tuning unit 8 according to the signal provided by the comparator 12 to minimise the difference between the amplified output voltage provided at the output of the output voltage amplifier 183 and the voltage of the accurate DC voltage source 6. To achieve this, the control unit 18 provides an output signal, which is provided to the tuning unit 8 shown by arrow 22.

When the signal provided from the comparator 12 indicates, that the total difference of the amplified output voltage provided at the output of the output voltage amplifier 183 to the voltage of the accurate DC voltage source 6 is below a defined minimum value, the tuning by the control unit 18 will be stopped. Preferably the ratio of the defined minimum value, when the tuning of the tunable voltage divider 8 is stopped, to the nominal average value of the voltage supplied by the accurate DC voltage source 6 is below 500 ppm, preferably below 200 ppm, more preferably below 50 ppm and most preferably below 10 ppm.

For example in the fifth embodiment of the inventive voltage supply 2 the defined minimum value can be 210 µV. For a nominal voltage the accurate DC voltage source 6 of 7 V then the ratio of the defined minimum value to the nominal average value of the voltage supplied by the accurate DC voltage source 6 is 30 ppm.

If the output signal of the comparator 12 is a digital signal which indicates only, which of the two components has a higher value or a higher absolute value and a output signal 22 provided by the control unit 18 to the tuning unit 8 is inducing a change of the amplified output voltage provided at the output of the output voltage amplifier 183 only for a value which is below the defined minimum value of the total difference of the amplified output voltage provided at the output of the output voltage amplifier 183 to the voltage of the accurate DC voltage source 6, when the tuning process shall be stopped, a change of the digital signal provided by the comparator due to the induced change indicates that the total difference of the amplified output voltage provided at the output of the output voltage amplifier 183 to the voltage of the accurate DC voltage source 6 is below the defined minimum value. Accordingly the tuning process is stopped by the control unit 18.

Then the tuning unit 8 is providing an output voltage, which is in the fifth embodiment of the inventive voltage supply 2 a voltage having the stability of the ultra-stable DC voltage source 4 and the accuracy of the accurate DC voltage source 6. The average of the amplified output voltage provided at the output of the output voltage amplifier 183 is equal to the average of the voltage supplied by the accurate DC voltage source 6. So the provided reference voltage, which is in the fifth embodiment the amplified output voltage provided at the output of the output voltage amplifier 183 has—apart from a difference smaller the defined minimum value—the value of the voltage supplied by the accurate DC voltage source 6 and the same accuracy. But due to the inventive power supply 2 it has now the stability of the ultra-stable DC voltage source 4.

So the reference voltage provided by the fifth embodiment of the inventive power supply which is the amplified output voltage provided at the output of the output voltage amplifier 183 is a voltage based on the output voltage of the tuning unit. In this embodiment the provided reference voltage is an amplified output voltage of the tuning unit 8, wherein the gain of the amplification is defined by the amplifying output voltage amplifier 183.

If the signal provided by the comparator 12 which is provided to the control unit 18 is equal or proportional to the difference of the compared voltages, according to the detected voltage difference the control unit 18 reacts and provides a signal to the tuning unit 8 to increase or decrease its output voltage according to the detected voltage difference. In the fifth embodiment of the inventive voltage supply 2 the absolute difference of the amplified output voltage provided at the output of the output voltage amplifier 183 and the voltage of the accurate DC voltage source 6 is reduced.

The output signal provided by the control unit 18 (arrow 22) in the fifth embodiment of the inventive voltage supply 2 is increasing the output voltage of the tunable voltage divider 8 and accordingly the amplified output voltage provided at the output of the output voltage amplifier 183 if the value of the voltage of the DC accurate voltage source 6 is higher than the amplified output voltage provided at the output of the output voltage amplifier 183.

In particular if the comparator 12 in the fifth embodiment of the inventive voltage supply 2 is providing a digital signal, then the digital signal provided by the comparator 12 indicates by a first value that the voltage of the accurate DC voltage source 6 is higher than amplified output voltage provided at the output of the output voltage amplifier 183. The control unit reacts on the first value of the digital signal provided by the comparator and provides a signal to the tuning unit 8 to increase its output voltage and accordingly the amplified output voltage provided at the output of the output voltage amplifier 183.

The output signal provided by the control unit 18 in the fifth embodiment of the inventive voltage supply 2 is decreasing the output voltage of the tuning unit 8 and accordingly the amplified output voltage provided at the output of the output voltage amplifier 183 if the value of the voltage of the accurate DC voltage source 6 is lower than the amplified output voltage provided at the output of the output voltage amplifier 183.

In particular if the comparator 12 in the fifth embodiment of the inventive voltage supply 2 is providing a digital signal, then the digital signal provided by the comparator 12 indicates by a second value that the voltage of the accurate DC voltage source 6 is lower than the amplified output voltage provided at the output of the output voltage amplifier 183. The control unit reacts on the second value of the digital signal provided by the comparator 12 and provides a signal to the tuning unit 8 to decrease its output voltage and accordingly the amplified output voltage provided at the output of the output voltage amplifier 183.

Preferably the increase and decrease of the output voltage of the tuning unit 8 and accordingly the amplified output voltage provided at the output of the output voltage amplifier 183 is reduced stepwise by the control unit 18 providing accordingly a signal to the tuning unit 8.

By this reduced change of the output voltage of the tuning unit 8 and accordingly the reduced change of the amplified output voltage provided at the output of the output voltage amplifier 183 in the fifth embodiment of the inventive voltage supply 2 the absolute difference between amplified output voltage provided at the output of the output voltage amplifier 183 and the voltage of the accurate DC voltage source 6 is minimised.

In the fifth embodiment of the FIG. 5 the amplified output voltage provided at the output of the output voltage amplifier 183 of the inventive voltage supply 2 is applied as reference voltage at a voltage amplifier 24 shown by arrow 185, which is applying an amplified voltage to an electrode 28 shown by arrow 30. The amplified output voltage provided at the output of the output voltage amplifier 183 is applied to the voltage amplifier 24 via a switch 32. Accordingly the amplified output voltage provided at the output of the output voltage amplifier 183 is applied at the switch 32 shown by arrow 185.

The switch 32 will connect in the fifth embodiment of the inventive voltage supply 2 the amplified output voltage provided at the output of the output voltage amplifier 183 at a defined time after the voltage supply 2 has been activated. Preferably the time delay to connect the amplified output voltage provided at the output of the output voltage amplifier 183 with the voltage amplifier 24 is chosen in that way that the tuning of the tuning unit 8 by the control unit 18 has been finished before the amplified output voltage provided at the output of the output voltage amplifier 183 is connected with the voltage amplifier 24. Then the amplified output voltage provided at the output of the output voltage amplifier 183 is a reference voltage, having the accuracy of the accurate DC voltage source 6 and stability of the ultra-stable DC voltage source 4, which is applied to the voltage amplifier 24. Then the voltage amplifier 24 is supplying a voltage of high accuracy and stability based on the reference voltage provided by the power supply 2 to the electrode 28. This is in particularly correct, if the output voltage amplifier 183 has no influence on the stability of the amplified voltage applied to the comparator 12, so that the amplified voltage provided at the output of the output voltage amplifier 183 has the same stability than the voltage supplied by the ultra-stable DC voltage source 4. Otherwise the performance of the fifth embodiment of the inventive voltage supply 2 may be somewhat reduced. But nevertheless the fifth embodiment of the inventive voltage supply 2 will provide a reference voltage of high accuracy and high stability.

Figure 6:
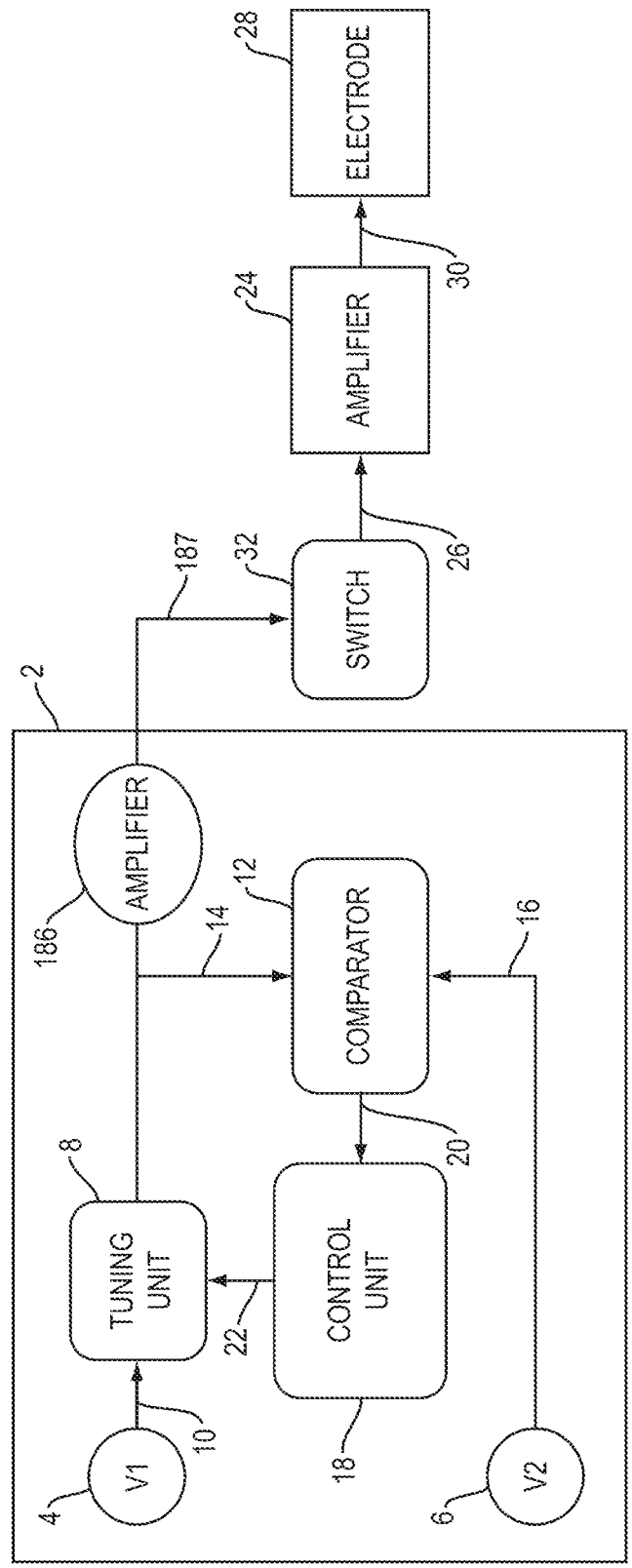
FIG. 6 shows a sixth embodiment of an inventive voltage supply schematically.

FIG. 6 shows a sixth embodiment of the inventive power supply 2.

In this embodiment, in which in general all components are the same as in the first embodiment, the output voltage of the tunable voltage divider 8 is provided to an amplifier 186—named in the further specification reference voltage pre-amplifier 186. The reference voltage pre-amplifier 186 amplifies the output voltage of the tunable voltage divider 8. So an amplified output voltage is provided at the output of the reference voltage pre-amplifier 186. This amplified output voltage is a voltage based on the output voltage of the tuning unit 8 and is provided as the reference voltage of the inventive voltage supply 2.

In the sixth embodiment of the inventive voltage supply 2 the output voltage of the tunable voltage divider 8 shown by the arrow 14 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages. The output signal can be a signal which is equal or proportional to the difference of the compared voltages. The output signal which is resulting from the comparison of these two input voltages can be also a digital signal which has only the output signals 0 and 1. By these signals it is only indicated which of the two input voltages has the higher value.

In the sixth embodiment of the inventive voltage supply 2 the voltage supplied by the ultra-stable DC source 4 has a higher absolute value than the voltage supplied by the accurate DC voltage source 6.

Typically in the sixth embodiment of the inventive voltage supply 2 the absolute value of the voltage of the ultra-stable DC source 4 is at least 2% higher than the absolute value of the voltage of the accurate DC voltage source 6. Preferably the absolute value of the voltage of the ultra-stable DC source 4 is at least 10% higher than the absolute value of the voltage of the accurate DC voltage source 6. More preferably the absolute value of the voltage of the ultra-stable DC source 4 is at least 25% higher than the absolute value of the voltage of the accurate DC voltage source 6.

Typically the absolute value of the voltage of the ultra-stable DC source 4 is not more than 500% higher than the absolute value of the voltage of the accurate DC voltage source 6. Preferably the absolute value of the voltage of the ultra-stable DC source 4 is not more than 200% higher than the absolute value of the voltage of the accurate DC voltage source 6. More preferably the absolute value of the voltage of the ultra-stable DC source 4 is not more than 100% higher than the absolute value of the voltage of the accurate DC voltage source 6.

For example in the sixth embodiment of the inventive voltage supply 2 an ultra-stable DC source 4 can be used, which provide an average voltage of 9 V and an accurate DC voltage source 6 which provide a nominal voltage of 7 V.

The signal provided by the comparator 12, which results in the sixth embodiment of the inventive voltage supply 2 from the comparison of the output voltage of the tuning unit 8 and the voltage of the accurate voltage source 6 is provided to the control unit 18 as input signal shown by arrow 20.

The control unit 18 in the sixth embodiment of the inventive voltage supply 2 is tuning the tuning unit 8 according to the signal provided by the comparator 12 to minimise the absolute difference between the output voltage of the tuning unit 8 and the voltage of the accurate DC voltage source 6. To achieve this, the control unit 18 provides an output signal, which is provided to the tuning unit 8 shown by arrow 22.

When the signal provided from the comparator 12 indicates, that the total difference of the output voltage of the tuning 8 to the voltage of the accurate DC voltage source 6 is below a defined minimum value, the tuning by the control unit 18 will be stopped. Preferably the ratio of the defined minimum value, when the tuning of the tunable voltage divider 8 is stopped, to the nominal average value of the voltage supplied by the accurate DC voltage source 6 is below 500 ppm, preferably below 200 ppm, more preferably below 50 ppm and most preferably below 10 ppm.

For example in the sixth embodiment of the inventive voltage supply 2 the defined minimum value can be 140 µV. For a nominal voltage the accurate DC voltage source 6 of 7 V then the ratio of the defined minimum value to the nominal average value of the voltage supplied by the accurate DC voltage source 6 is 20 ppm.

Then the tuning unit 8 is providing an output voltage, which is in the sixth embodiment of the inventive voltage supply 2 provided to the reference voltage pre-amplifier 186 which amplifies the output voltage of the tunable voltage divider 8. Then the amplified voltage provided by the reference voltage pre-amplifier 186 is the reference voltage of the inventive voltage supply 2 having the stability of the ultra-stable DC voltage source 4 and the accuracy of the accurate DC voltage source 6. The average of the output voltage of the tuning unit divider 8 is equal to the average of the voltage supplied by the accurate DC voltage source 6. So the provided voltage provided to the reference voltage pre-amplifier 186 has—apart from a difference smaller the defined minimum value—the value of the voltage supplied by the accurate DC voltage source 6 and the same accuracy. Due to the inventive power supply 2 the amplified output voltage provided at the output of the reference voltage pre-amplifier 186 as reference voltage has now the stability of the ultra-stable DC voltage source 4.

Preferably the increase and decrease of the output voltage of the tuning unit 8 is reduced stepwise by the control unit 18 providing accordingly a signal to the tuning unit 8.

By this reduced change of the output voltage of the tuning unit 8 in the sixth embodiment of the inventive voltage supply 2 the absolute difference between the output voltage of the tuning unit 8 and the voltage of the accurate DC voltage source 6 is minimised.

In the sixth embodiment of the FIG. 6 the amplified output voltage provided at the output of the reference voltage pre-amplifier 186 is applied as reference voltage at a voltage amplifier 24 shown by arrow 187, which is applying an amplified voltage to an electrode 28 shown by arrow 30. The amplified output voltage provided at the output of the reference voltage pre-amplifier 186 is applied to the voltage amplifier 24 via a switch 32. Accordingly the amplified output voltage provided at the output of the reference voltage pre-amplifier 186 is applied at the switch 32 shown by arrow 187.

The switch 32 will connect in the sixth embodiment of the inventive voltage supply 2 the amplified output voltage provided at the output of the reference voltage pre-amplifier 186 with the voltage amplifier 24 at a defined time after the voltage supply 2 has been activated. Preferably the time delay to connect the amplified output voltage provided at the output of the reference voltage pre-amplifier 186 with the voltage amplifier 24 is chosen in that way that the tuning of the tuning unit 8 by the control unit 18 has been finished before the amplified output voltage provided at the output of the reference voltage pre-amplifier 186 is connected with the voltage amplifier 24. Then amplified output voltage provided at the output of the reference voltage pre-amplifier 186 is a reference voltage, having the accuracy of the accurate DC voltage source 6 and stability of the ultra-stable DC voltage source 4, which is applied to the voltage amplifier 24. Then the voltage amplifier 24 is supplying a voltage of high accuracy and stability based on the reference voltage provided by the power supply 2 to the electrode 28. This is in particularly correct, if the reference voltage pre-amplifier 186 has no influence on the stability of the amplified voltage provided as reference voltage, so that the amplified voltage provided at the output of the reference voltage pre-amplifier 186 has the same stability than the voltage supplied by the ultra-stable DC voltage source 4. Otherwise the performance of the sixth embodiment of the inventive voltage supply 2 may be somewhat reduced. But nevertheless the sixth embodiment of the inventive voltage supply 2 will provide a reference voltage of high accuracy and high stability.

Figure 7:
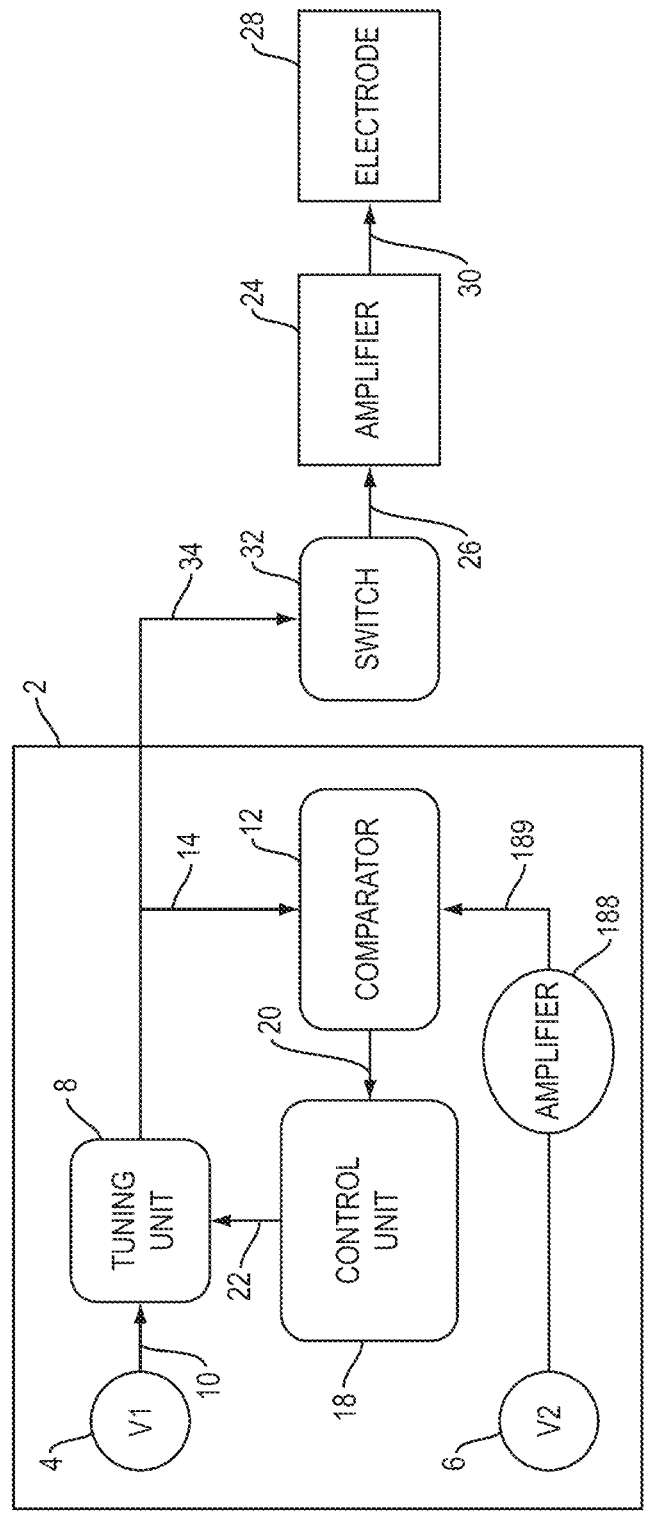
FIG. 7 shows a seventh embodiment of an inventive voltage supply schematically.

FIG. 7 shows a seventh embodiment of the inventive power supply 2.

In this embodiment, in which in general all components are the same as in the first embodiment, the voltage supplied by the accurate DC voltage source 6 is provided to an amplifier 188—named in the further specification accurate voltage amplifier 188. The accurate voltage amplifier 188 amplifies the voltage supplied by the accurate DC voltage source 6. So the amplified voltage is provided at the comparator 12 shown by arrow 189. The amplified voltage at the output of the accurate voltage amplifier 188, which is an accurate voltage, is a voltage based on the supplied voltage of the accurate DC voltage source.

In the seventh embodiment of the inventive voltage supply 2 the output voltage of the tunable voltage divider 8 shown by the arrow 14 and the amplified voltage amplified by the accurate voltage amplifier 188 shown by the arrow 189 are provided to the comparator 12 of the inventive power supply 2, which compares the voltage signals. The comparator 12 provides an output signal which is resulting from the comparison of these two input voltages. The output signal can be a signal which is equal or proportional to the difference of the compared voltages. The output signal which is resulting from the comparison of these two input voltages can be also a digital signal which has only the output signals 0 and 1. By these signals it is only indicated which of the two input voltages has the higher value.

The signal provided by the comparator 12, which results in the seventh embodiment of the inventive voltage supply 2 from the comparison of the output voltage of the tuning unit 8 and the amplified voltage amplified by the accurate voltage amplifier 188 is provided to the control unit 18 as input signal shown by arrow 20.

The control unit 18 in the seventh embodiment of the inventive voltage supply 2 is tuning the tuning unit 8 according to the signal provided by the comparator 12 to minimise the absolute difference between the output voltage of the tuning unit 8 and the amplified voltage amplified by the accurate voltage amplifier 188. To achieve this, the control unit 18 provides an output signal, which is provided to the tuning unit 8 shown by arrow 22.

When the signal provided from the comparator 12 indicates, that the total difference of the output voltage of the tuning 8 to the amplified voltage amplified by the accurate voltage amplifier 188 is below a defined minimum value, the tuning by the control unit 18 will be stopped. Preferably the ratio of the defined minimum value, when the tuning of the tunable voltage divider 8 is stopped, to the nominal average value of the amplified voltage amplified by the accurate voltage amplifier 188 is below 500 ppm, preferably below 200 ppm, more preferably below 50 ppm and most preferably below 10 ppm.

For example in the seventh embodiment of the inventive voltage supply 2 the defined minimum value can be 280 µV. For a nominal voltage of the accurate DC voltage source 6 of 3.5 V amplified by the accurate voltage amplifier 188 with a gain of 2 the ratio of the defined minimum value to the nominal average value of the amplified voltage amplified by the accurate voltage amplifier 188 is 40 ppm.

Then the tuning unit 8 is providing an output voltage, which is in the seventh embodiment of the inventive voltage supply 2 a reference voltage having the stability of the ultra-stable DC voltage source 4 and the accuracy of the accurate DC voltage source 6. The average of the output voltage of the tuning unit divider 8 is equal to the average of the amplified voltage amplified by the accurate voltage amplifier 188. So the provided reference voltage has—apart from a difference smaller the defined minimum value—the value of the amplified voltage amplified by the accurate voltage amplifier 188 and the same accuracy. But due to the inventive power supply 2 it has now the stability of the ultra-stable DC voltage source 4.

If the signal provided by the comparator 12 which is provided to the control unit 18 is equal or proportional to the difference of the compared voltages, according to the detected voltage difference the control unit 18 reacts and provides a signal to the tuning unit 8 to increase or decrease its output voltage according to the detected voltage difference. In the seventh embodiment of the inventive voltage supply 2 the absolute difference of the output voltage of the tuning unit 8 and the amplified voltage amplified by the accurate voltage amplifier 188 is minimised.

The output signal provided by the control unit 18 (arrow 22) in the seventh embodiment of the inventive voltage supply 2 is increasing the output voltage of the tunable voltage divider 8 if the value of the amplified voltage amplified by the accurate voltage amplifier 188 is higher than the output voltage of the tunable voltage divider 8.

In particular if the comparator 12 in the seventh embodiment of the inventive voltage supply 2 is providing a digital signal, then the digital signal provided by the comparator 12 indicates by a first value that the amplified voltage amplified by the accurate voltage amplifier 188 6 is higher than the output voltage of the tuning unit 8. The control unit reacts on the first value of the digital signal provided by the comparator and provides a signal to the tuning unit 8 to increase its output voltage.

The output signal provided by the control unit 18 in the seventh embodiment of the inventive voltage supply 2 is decreasing the output voltage of the tuning unit 8 if the amplified voltage amplified by the accurate voltage amplifier 188 is lower than the output voltage of the tunable voltage divider 8.

In particular if the comparator 12 in the seventh embodiment of the inventive voltage supply 2 is providing a digital signal, then the digital signal provided by the comparator 12 indicates by a second value that the amplified voltage amplified by the accurate voltage amplifier 188 is lower than the output voltage of the tuning unit 8. The control unit reacts on the second value of the digital signal provided by the comparator 12 and provides a signal to the tuning unit 8 to decrease its output voltage.

Preferably the increase and decrease of the output voltage of the tuning unit 8 is reduced stepwise by the control unit 18 providing accordingly a signal to the tuning unit 8.

By this reduced change of the output voltage of the tuning unit 8 in the seventh embodiment of the inventive voltage supply 2 the absolute difference between the output voltage of the tuning unit 8 and the amplified voltage amplified by the accurate voltage amplifier 188 is minimised.

In the seventh embodiment of the FIG. 7 the output voltage of the tuning unit 8 of the inventive voltage supply 2 is applied as reference voltage at a voltage amplifier 24 shown by arrow 26, which is applying an amplified voltage to an electrode 28 shown by arrow 30. The output voltage of the tuning unit 8 is applied to the voltage amplifier 24 via a switch 32. Accordingly the output voltage of the tuning unit 8 is directly applied at the switch 32 shown by arrow 34.

The switch 32 will connect in the seventh embodiment of the inventive voltage supply 2 the output voltage of the tuning unit 8 with the voltage amplifier 24 at a defined time after the voltage supply 2 has been activated. Preferably the time delay to connect the output voltage of the tuning unit 8 with the voltage amplifier 24 is chosen in that way that the tuning of the tuning unit 8 by the control unit 18 has been finished before the output voltage of the tuning unit 8 is connected with the voltage amplifier 24. Then the output voltage of the tuning unit 8 is a reference voltage, having the accuracy of the accurate DC voltage source 6 and stability of the ultra-stable DC voltage source 4, which is applied to the voltage amplifier 24. Then the voltage amplifier 24 is supplying a voltage of high accuracy and stability based on the reference voltage provided by the power supply 2 to the electrode 28. This is in particularly correct, if the accurate voltage amplifier 188 has no influence on the accuracy of the reference voltage, so that the output voltage of the tuning unit 8 has the same accuracy than the voltage supplied by the accurate DC voltage source 6.

Otherwise the performance of the seventh embodiment of the inventive voltage supply 2 may be somewhat reduced. But nevertheless the seventh embodiment of the inventive voltage supply 2 will provide a reference voltage of high accuracy and high stability.

Figure 8:
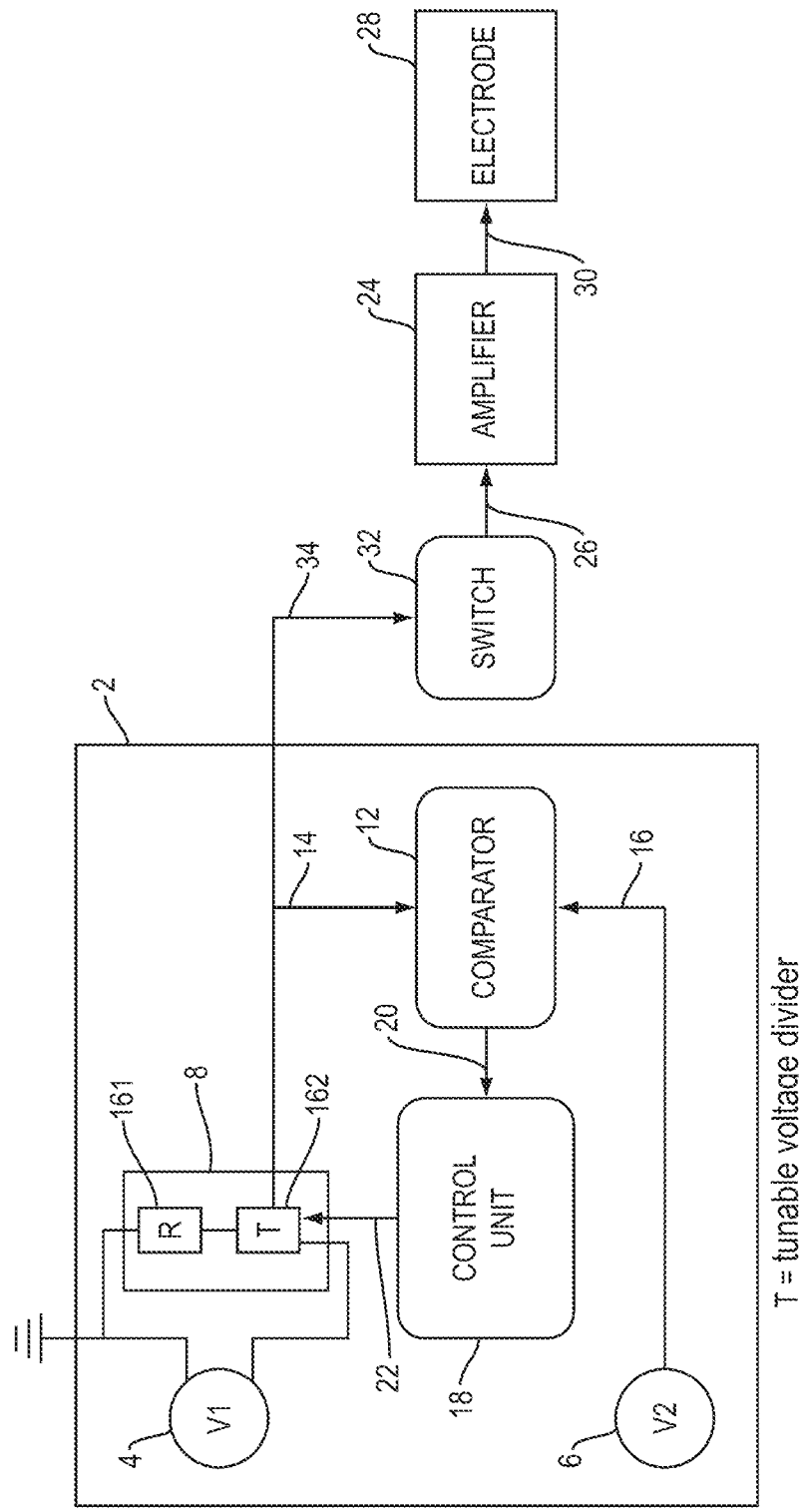
FIG. 8 shows an eighth embodiment of an inventive voltage supply schematically.

FIG. 8 shows an eighth embodiment of the inventive power supply 2.

In this embodiment, in which in general all components are the same as in the first embodiment, only another embodiment of the tuning unit 8 is provided. In this embodiment the tuning unit 8 of the voltage supply 2 comprises at least one resistor 161 and a tunable voltage divider 162, which are connected in series.

In the eighth embodiment of the inventive voltage supply 2 the voltage supplied by the DC ultra-stable voltage source 4 is applied to two (input) connectors of the tuning unit 8, wherein one connector is connected with the at least one resistor 161 and the other with the tunable voltage divider 162.

The tuning unit 8 comprises an output connector (not shown) to which the tuning unit 8 provides an output voltage which is then provided to the comparator shown by the arrow 14. The output voltage is provided by taping the voltage from the resistor or the resistor network of the tunable voltage divider 162. Only a portion of the voltage supplied by the ultra-stable DC voltage source 4 is applied to the tunable voltage divider 162 and only this portion of the supplied voltage is tunable by the tunable voltage divider 162 to provide an output voltage to the (output) connector. Accordingly only the portion of the voltage supplied by the ultra-stable DC voltage source 4 to the tunable voltage divider 162 can be used to adapt the output voltage of the tuning unit 8 to the voltage supplied by the accurate DC voltage source 6. Typically the adaptable portion of the voltage supplied by the ultra-stable DC voltage source 4 is higher than 10% of the voltage, preferably higher than 15% of the voltage and more preferably higher than 20% of the voltage. Typically the adaptable portion of the voltage supplied by the ultra-stable voltage DC source 4 is below 50% of the voltage, preferably below 40% of the voltage and more preferably below 30 of the voltage.

Figure 9:
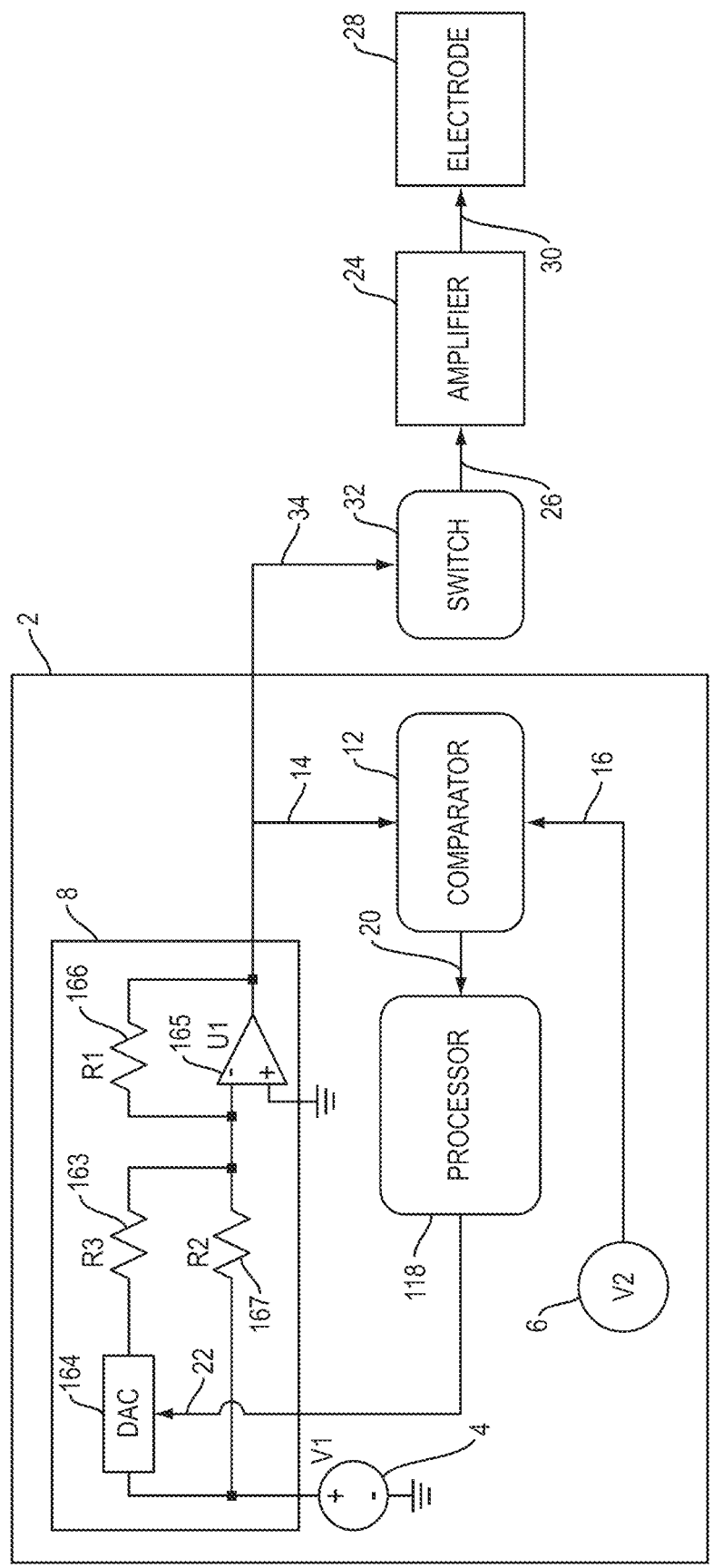
FIG. 9 shows a ninth embodiment of an inventive voltage supply schematically.

FIG. 9 shows a ninth embodiment of the inventive power supply 2.

In this embodiment, in which in general all shown components are the same as in the third embodiment, only another embodiment of the tuning unit 8 is provided. Another difference is, that in the ninth embodiment only the output voltage of the tuning unit 8 is applied the switch 32.

In this embodiment the tuning unit 8 of the voltage supply 2 comprises a first resistor 167 (R2) and a digital to analogue converter 164 (DAC), which are connected in parallel and a current to voltage converter, which is a transimpedance amplifier. The transimpedance amplifier comprises an operational amplifier 165 and a feedback resistor 166 (R1). The digital to analogue converter 164 (DAC) is connected in series with a second resistor 163 (R3). The voltage supplied by the ultra-stable voltage source 4 to the tuning unit 8 is applied at the parallel connected digital to analogue converter 164 (DAC) and the first resistor 167 (R2). The other end of this parallel connection is connected with the input of the transimpedance amplifier, which provides at its output the output voltage of the tuning unit 8, which is provided to the comparator 12 shown by the arrow 14 and directly applied to the switch 32 shown by arrow 34. This voltage has the reverse polarity as the voltage supplied by the ultra-stable voltage source 4. But the output voltage of the tuning unit 8 and the voltage supplied by the accurate voltage source 6 have in this embodiment the same polarity.

In the ninth embodiment of the inventive voltage supply 2 the output voltage of the tunable voltage divider 8 shown by the arrow 14 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages having the same polarity.

The value of the output voltage of the tuning unit 8 depends on the resistance values of the first resistor 167 (R2), the second resistor 163 (R3), the feedback resistor 166 (R1) and the output voltage of the digital to analogue converter 164 (DAC) as known by a skilled person.

The inventive voltage supply 2 comprises also a control unit, which is a processor 118. A computer program can be executed by the processor 118 to operate the voltage supply 2 in accordance with the described methods.

The signal provided by the comparator 12, which results from the comparison of the output voltage of the control unit 8 and the voltage of the accurate voltage source 6, is provided to the processor 118 as input signal shown by arrow 20.

The processor 118 is tuning the digital to analogue converter (DAC) 164 of the tuning unit 8 according to the digital signal provided by the comparator 12 to minimise the absolute difference between the output voltage of control unit 8 and the voltage of the accurate DC voltage source 6. To achieve this, the processor 118 provides a digital output signal, which is provided to the digital to analogue converter (DAC) 164 shown by arrow 22.

The output signal provided by the processor 118 (arrow 22) is increasing the absolute value of the output voltage of the digital to analogue converter (DAC) 164 and accordingly the absolute value of the output voltage of the tuning unit 8 if the absolute value of the voltage of the accurate DC voltage source 6 is higher than the absolute value of the output voltage of the tuning unit 8.

When the digital signal provided by the comparator 12 indicates by a first value that the absolute value of the voltage supplied by the accurate DC voltage source 6 is higher than the absolute value of the output voltage of the tuning unit 8, the processor 118 reacts on the first value of the digital signal provided by the comparator 12 and provides a digital signal to the digital to analogue converter (DAC) 164 to increase the absolute value of its output voltage.

The output signal provided by processor 118 is decreasing the absolute value of the output voltage of the digital to analogue converter (DAC) 164 if the absolute value of the voltage of the accurate DC voltage source 6 is lower than the absolute value of the output voltage of the tuning unit 8.

When the digital signal provided by the comparator 12 indicates by a second value that the absolute value of the voltage supplied by the accurate DC voltage source 6 is lower than absolute value of the output voltage of the digital to analogue converter (DAC) 108, the processor 118 reacts on the second value of the digital signal provided by the comparator 12 and provides a digital signal to the digital to analogue converter (DAC) 164 to decrease the absolute value of its output voltage.

Preferably the increase and decrease of the output voltage of the tuning unit 8 is reduced stepwise by the processor 118 providing accordingly a signal to the digital to analogue converter (DAC) 164. By this reduced change of the output voltage of the tuning unit 8 the absolute difference between the output voltage of the tuning unit 8 and the voltage of the accurate DC voltage source 6 is minimised.

Then the tuning unit 8 is providing an output voltage, which is a reference voltage having the stability of the ultra-stable DC voltage source 4 and the accuracy of the accurate DC voltage source 6. The average of the output voltage of the tuning unit 8 is equal to the average of the voltage supplied by the accurate DC voltage source 6. So the provided reference voltage has—apart from a small difference—the value of the voltage supplied by the accurate DC voltage source 6 and the same accuracy. But due to the inventive power supply 2 it has now the stability of the ultra-stable DC voltage source 4. This is in particularly correct, if the components of the tuning unit 8 have no influence on the stability on output voltage of the tuning unit 8. Otherwise the performance of the ninth embodiment of the inventive voltage supply 2 may be somewhat reduced. But nevertheless the ninth embodiment of the inventive voltage supply 2 will provide a reference voltage of high accuracy and high stability.

In a preferred embodiment the digital to analogue converter 164 comprises a resistor ladder network, in particular an R-2R resistor ladder network. The digital signal provided by the processor 118 in this preferred embodiment is a digital signal of a specific number of bits. Preferably the digital signal is a signal of at least 16 bits, particular preferably of at least 20 bits. Based on the digital signal provided by the comparator 12 the processor 118 is applying the method of successive approximation to minimise the absolute difference between the output voltage of tuning unit 8 and the voltage of the accurate DC voltage source 6 as explained before in detail. In this method according to the bits of the digital signal provided by the processor 118 to the digital to analogue converter (DAC) 164 the output voltage of the digital to analogue converter (DAC) 164 is determined by the R-2R resistor ladder network. The resistor network is dividing with each set bit (value 1) the voltage applied at the digital to analogue converter (DAC) 164 into equal shares. So the first bit is dividing the voltage to the share ½, the second is dividing the remaining voltage into shares of ¼, the third is dividing the remaining voltage into shares of ⅛ and so forth. Accordingly to the set bits provided by the processor 118 the output voltage of the digital to analogue converter (DAC) 164 is provided.

During the iteration steps of the method each of the bits of the digital signal provided by the processor 118 to the digital to analogue converter (DAC) 164 is set and the output voltage of the tuning unit 8 is correctly adjusted to the voltage of the accurate DC voltage source 6. The accuracy of this adjustment is increasing fast.

In the embodiment of the FIG. 9 the output voltage of the tuning unit 8 of the inventive voltage supply 2 is applied as reference voltage at a voltage amplifier 24 shown by arrow 26, which is applying an amplified voltage to an electrode 28 shown by arrow 30. The output voltage of the tuning unit 8 is applied at the voltage amplifier 24 via a switch 32 after the tuning process has been finished. Accordingly the output voltage of the tuning unit 8 is directly applied to the switch 32 shown by arrow 34.

Figure 10:
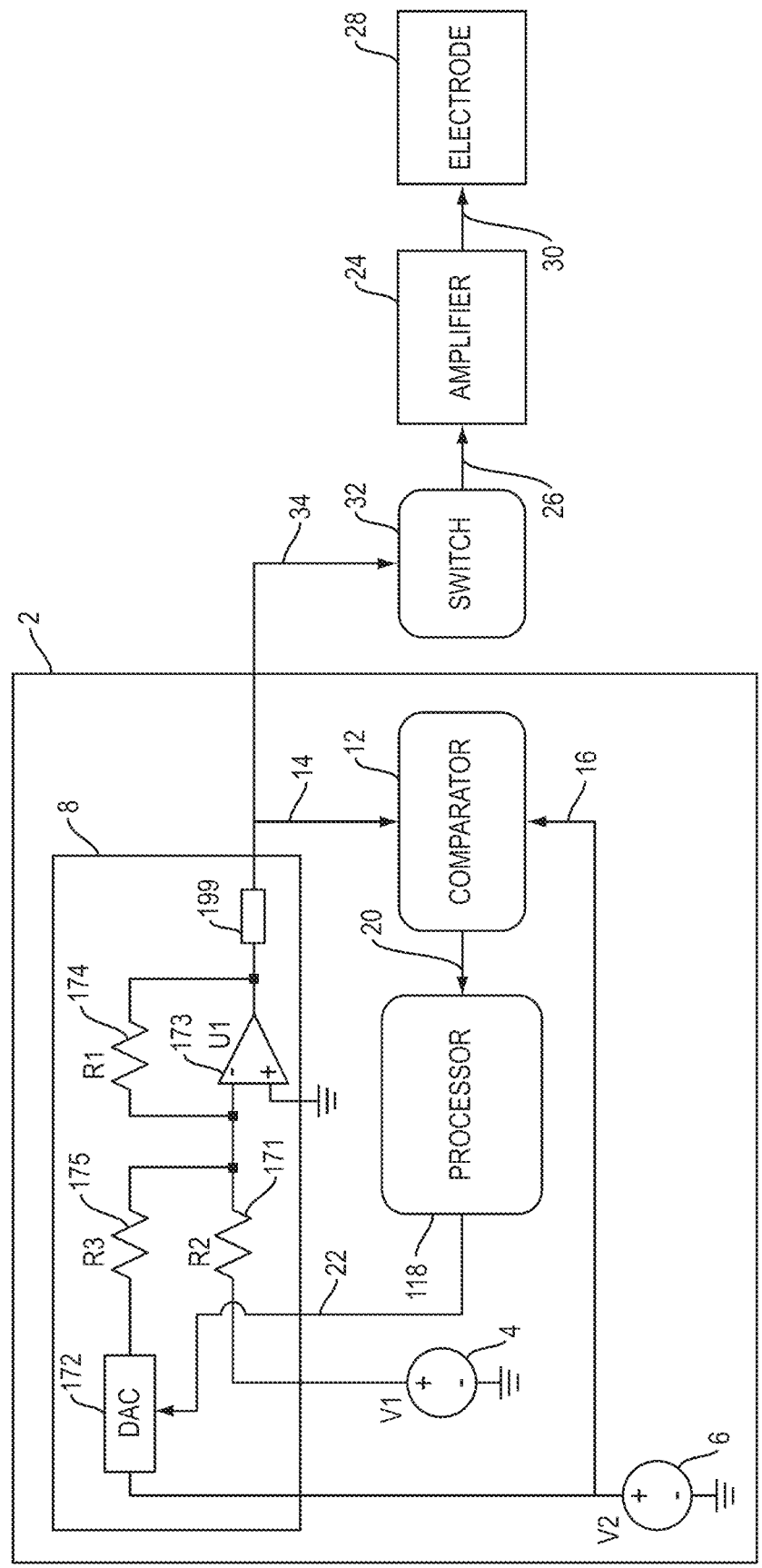
FIG. 10 shows a tenth embodiment of an inventive voltage supply schematically.

FIG. 10 shows a tenth embodiment of the inventive power supply 2.

In this embodiment, in which in general all shown components are the same as in the third embodiment, only another embodiment of the tuning unit 8 is provided. Another difference is, that in the tenth embodiment only the output voltage of the tuning unit 8 is applied the switch 32.

In this embodiment the tuning unit 8 of the voltage supply 2 comprises a first resistor 171 (R2) and a digital to analogue converter 172 (DAC) and a current to voltage converter which is a transimpedance amplifier. The transimpedance amplifier comprises an operational amplifier 173 and a feedback resistor 174 (R1).

At the first resistor 171 (R2) the voltage provided by the ultra-stable DC voltage source 4 is applied and at the digital to analogue converter 172 (DAC) the voltage provided by the accurate DC voltage source 6 is applied. The digital to analogue converter 172 (DAC) is connected in series with a second resistor 175 (R3).

The first resistor 171 (R2) and the digital to analogue converter 172 (DAC) are connected at a node, which is connected with the input of the transimpedance amplifier, which provides its output to an input of an inverting amplifier 199. At the output of the inverting amplifier 199 is provided the output voltage of the tuning unit 8. This voltage is provided to the comparator 12 shown by the arrow 14 and directly applied to the switch 32 shown by arrow 34.

In the tenth embodiment of the inventive voltage supply 2 the output voltage of the tuning unit 8 shown by the arrow 14 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages.

The value of the output voltage of the tuning unit 8 depends on the resistance values of the first resistor 171 (R3), the second resistor 175 (R2), the feedback resistor 174 (R1) and the output voltage of the digital to analogue converter 172 (DAC) as known by a skilled person. The output voltage of the digital to analogue converter 172 (DAC) is related to the voltage supplied by the accurate DC voltage source 6 to the digital to analogue converter 172 (DAC).

The inventive voltage supply 2 comprises also a control unit, which is a processor 118. A computer program can be executed by the processor to operate the voltage supply 2 in accordance with the described methods.

The signal provided by the comparator 12, which results from the comparison of the output voltage of the control unit 8 and the voltage of the accurate voltage source 6, is provided to the processor 118 as input signal shown by arrow 20.

The processor 118 is tuning the digital to analogue converter (DAC) 172 of the tuning unit 8 according to the digital signal provided by the comparator 12 to minimise the absolute difference between the output voltage of control unit 8 and the voltage of the accurate DC voltage source 6. To achieve this, the processor 118 provides a digital output signal, which is provided to the digital to analogue converter (DAC) 172 shown by arrow 22.

The output signal provided by the processor 118 (arrow 22) is increasing the absolute value of the output voltage of the digital to analogue converter (DAC) 172 and accordingly the absolute value of the output voltage of the tuning unit 8 if the absolute value of the voltage of the accurate DC voltage source 6 is higher than absolute value of the output voltage of the tuning unit 8.

When the digital signal provided by the comparator 12 indicates by a first value that the absolute value of the voltage supplied by the accurate DC voltage source 6 is higher than the absolute value of the output voltage of the tuning unit 8, the processor 118 reacts on the first value of the digital signal provided by the comparator 12 and provides a digital signal to the digital to analogue converter (DAC) 172 to increase the absolute value of its output voltage.

The output signal provided by the processor 118 is decreasing the absolute value of the output voltage of the digital to analogue converter (DAC) 172 if the absolute value of the voltage of the accurate DC voltage source 6 is lower than the absolute value of the output voltage of the tuning unit 8.

When the digital signal provided by the comparator 12 indicates by a second value that the absolute value of the voltage supplied by the accurate DC voltage source 6 is lower than the absolute value of the of the output voltage of the tuning unit 8, the processor 118 reacts on the second value of the digital signal provided by the comparator 12 and provides a digital signal to the digital to analogue converter (DAC) 172 to decrease the absolute value of its output voltage.

Preferably the increase and decrease of the output voltage of the tuning unit 8 is reduced stepwise by the processor 118 providing accordingly a signal to the digital to analogue converter (DAC) 172. By this reduced change of the output voltage of the tuning unit 8 the absolute difference between the output voltage of the tuning unit 8 and the voltage of the accurate DC voltage source 6 is minimised.

Then the tuning unit 8 is providing an output voltage, which is a reference voltage, having the stability of the ultra-stable DC voltage source 4 and the accuracy of the accurate DC voltage source 6. The average of the output voltage of the tuning unit 8 is equal to the average of the voltage supplied by the accurate DC voltage source 6. So the provided reference voltage has—apart from a small difference—the value of the voltage supplied by the accurate DC voltage source 6 and the same accuracy. But due to the inventive power supply 2 it has now the stability of the ultra-stable DC voltage source 4. This is in particularly correct, if the components of the tuning unit 8 have no influence on the stability on output voltage of the tuning unit 8.

Otherwise the performance of the tenth embodiment of the inventive voltage supply 2 may be somewhat reduced. But nevertheless the tenth embodiment of the inventive voltage supply 2 will provide a reference voltage of high accuracy and high stability.

In a preferred embodiment the digital to analogue converter 172 comprises a resistor ladder network, in particular an R-2R resistor ladder network, which can be used in the same way as described for the ninth embodiment.

During the iteration steps of the proposed method each of the bits of the digital signal provided by the processor 118 to the digital to analogue converter (DAC) 172 is set and the output voltage of the tuning unit 8 is correctly adjusted to the voltage of the accurate DC voltage source 6. The accuracy of this adjustment is increasing fast because with each set of a further bit the adjustment of the output voltage of the digital to analogue converter (DAC) 172 is bisected which is provoking the adjustment of the output voltage of the tuning unit 8.

In the embodiment of the FIG. 10 the output voltage of the tuning unit 8 of the inventive voltage supply 2 is applied as reference voltage at a voltage amplifier 24 shown by arrow 26, which is applying an amplified voltage to an electrode 28 shown by arrow 30. The output voltage of the tuning unit 8 is applied at the voltage amplifier 24 via a switch 32 after the tuning process has been finished. Accordingly the output voltage of the tuning unit 8 is directly applied to the switch 32 shown by arrow 34.

Figure 11:
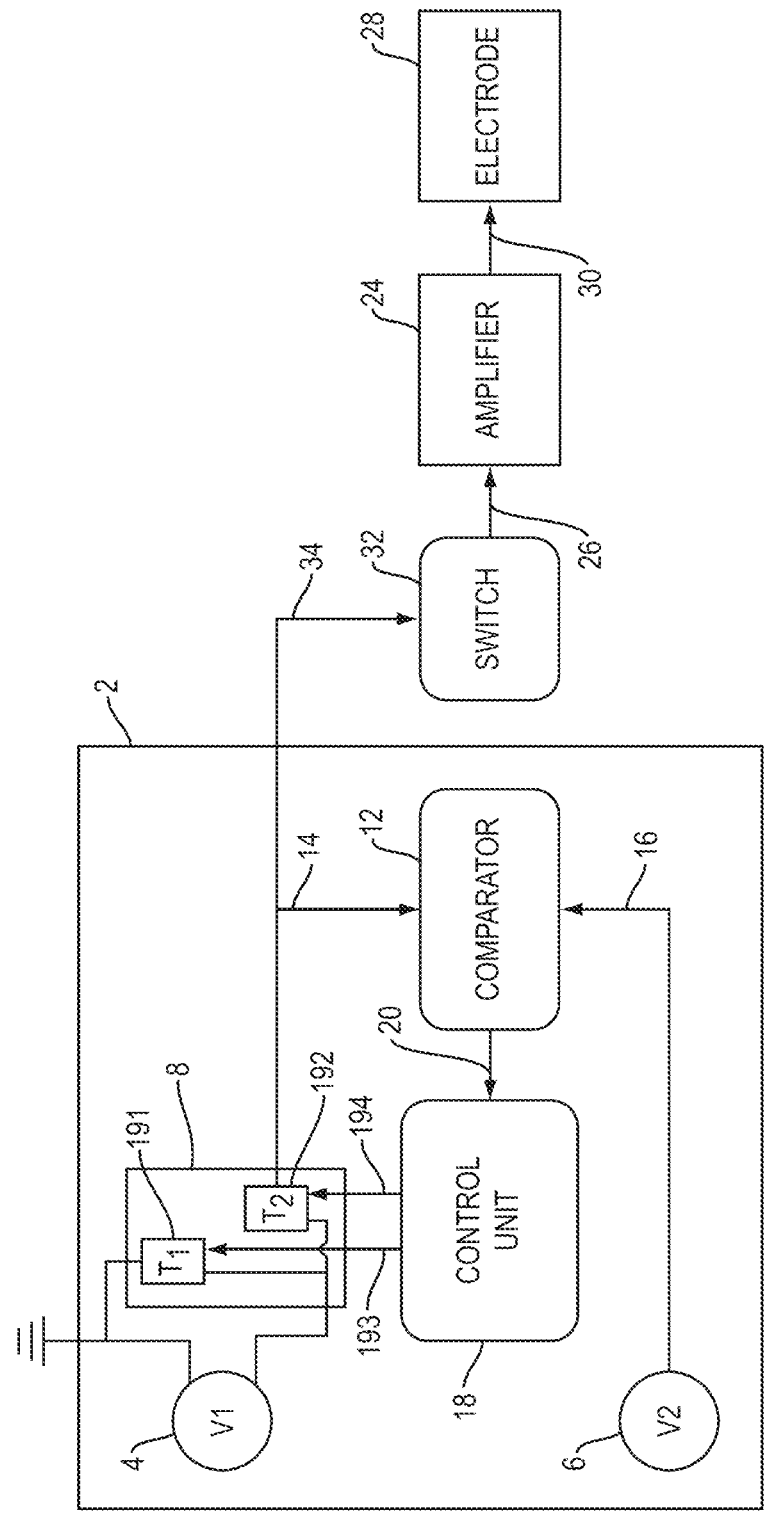
FIG. 11 shows an eleventh embodiment of an inventive voltage supply schematically.

FIG. 11 shows an eleventh embodiment of the inventive power supply 2.

In this embodiment, in which in general all components are the same as in the first embodiment, only another embodiment of the tuning unit 8 is provided.

In this embodiment of the invention the tuning unit 8 of the voltage supply comprises two tunable voltage dividers 191 and 192, which are preferably two digital to analogue converters (DAC). The voltage supplied by the ultra-stable DC voltage source 4 to the tuning unit 8 is applied at a first tunable voltage divider 191 (T1) of the two tunable voltage dividers, which provides an output voltage to an (output) connector. This output voltage is then applied at the second tunable voltage divider 192 (T 2) of the two tunable voltage dividers, which provides an output voltage to an (output) connector, which is the output voltage of the tuning unit 8. The first tunable voltage divider 191 is used to tune the output voltage of the tuning unit 8 coarse and the second tunable voltage divider 192 is used to tune the output voltage of the tuning unit 8 in a fine manner.

The tuning unit 8 comprises an output connector (not shown) to which the tuning unit 8 provides an output voltage which is then provided to the comparator 12 shown by the arrow 14. The output voltage is provided by taping the voltage from a resistor or the resistor network of the second tunable voltage divider 192.

In the eleventh embodiment of the inventive voltage supply 2 the voltage supplied by the ultra-stable DC source 4 has a higher absolute value than the voltage supplied by the accurate DC voltage source 6.

Typically in the eleventh embodiment of the inventive voltage supply 2 the absolute value of the voltage of the ultra-stable DC source 4 is at least 2% higher than the absolute value of the voltage of the accurate DC voltage source 6. Preferably the absolute value of the voltage of the ultra-stable DC source 4 is at least 10% higher than the absolute value of the voltage of the accurate DC voltage source 6. More preferably the absolute value of the voltage of the ultra-stable DC source 4 is at least 25% higher than the absolute value of the voltage of the accurate DC voltage source 6.

Typically the absolute value of the voltage of the ultra-stable DC source 4 is not more than 500% higher than the absolute value of the voltage of the accurate DC voltage source 6. Preferably the absolute value of the voltage of the ultra-stable DC source 4 is not more than 200% higher than the absolute value of the voltage of the accurate DC voltage source 6. More preferably the absolute value of the voltage of the ultra-stable DC source 4 is not more than 100% higher than the absolute value of the voltage of the accurate DC voltage source 6.

The first tunable voltage divider 191 to which the voltage of the ultra-stable DC source 4 is applied is used to tune the output voltage of the tuning unit 8 coarse. So typically the output voltage of the tuning unit 8 is tuned by the first tunable voltage divider 191 with a selectivity of 1% to 5% of the voltage of the accurate DC voltage source 6, preferably with a selectivity of 200 ppm to 1,000 ppm of the voltage of the accurate DC voltage source 6.

The second tunable voltage divider 192 is used to tune the output voltage of the tuning unit 8 in a fine manner, so that the total difference of the output voltage of the tuning 8 to the voltage of the accurate DC voltage source 6 is below a defined minimum value, when the tuning by the control unit 18 will be stopped. Preferably due to the tuning of the second tunable voltage divider 192 the ratio of the defined minimum value, when the tuning of the tunable voltage divider 8 is stopped, to the nominal average value of the voltage supplied by the accurate DC voltage source 6 is below 500 ppm, preferably below 200 ppm, more preferably below 50 ppm and most preferably below 10 ppm.

The control unit 18 in the eleventh embodiment of the inventive voltage supply 2 is tuning the first tunable voltage divider 191 and the second tunable voltage divider 192 of the tuning unit 8 according to the signal provided by the comparator 12 to minimise the absolute difference between the output voltage of the tuning unit 8 and the voltage of the accurate DC voltage source 6. To achieve this the control unit 18 provides an two output signals, a first output signal for coarse tuning provided to the first tunable voltage divider 191 of the tuning unit 8 shown by arrow 193 and a second output signal for fine tuning provided to the second tunable voltage divider 192 of the tuning unit 8 shown by arrow 194.

The control unit 18 provides the two output signals based on the output signal shown by the arrow 20 of the comparator 12 in the same way as described for the first embodiment. The difference is that the first output signal shown by arrow 193 is provided by the control unit 18 only for a coarse adjustment to the first tunable voltage divider 191 and that the second output signal shown by arrow 194 is provided by the control unit 18 to the second tunable voltage divider 192 to minimise the total difference between the output voltage of the tuning unit 8 and the voltage of the accurate DC voltage source 6 until the total difference is below a defined minimum value and the tuning process is stopped. Due to the use of two tunable voltage dividers the adjustment can be faster and is more sensitive to react on small total differences between the output voltage of the tuning 8 and the voltage of the accurate DC voltage source 6. At the beginning of the tuning process the control unit 18 is providing the first output signal shown by arrow 193 and may also provide the second output signal shown by arrow 194. When the total difference between the output voltage of the tuning unit 8 and the voltage of the accurate DC voltage source 6 is during the tuning process below the selectivity of the first tunable voltage divider 191, the control unit 18 is preferably only further adapting the second output signal shown by arrow 194 provided to the second tunable voltage divider 192 to minimise the total difference between the output voltage of the tuning unit 8 and the voltage of the accurate DC voltage source 6 until the total difference is below a defined minimum value, wherein the first output signal shown by arrow 193 remains unchanged.

In the eleventh embodiment of the inventive voltage supply 2 the output voltage of the tuning unit 8 is providing a reference voltage, having the accuracy of the accurate DC voltage source 6 and stability of the ultra-stable DC voltage source 4. This is in particularly correct, if the two tunable voltage dividers 191 and 192 have no influence on the stability of the reference voltage. Otherwise the performance of the eleventh embodiment of the inventive voltage supply 2 may be somewhat reduced. But nevertheless the eleventh embodiment of the inventive voltage supply 2 will provide a reference voltage of high accuracy and high stability.

Figure 12:
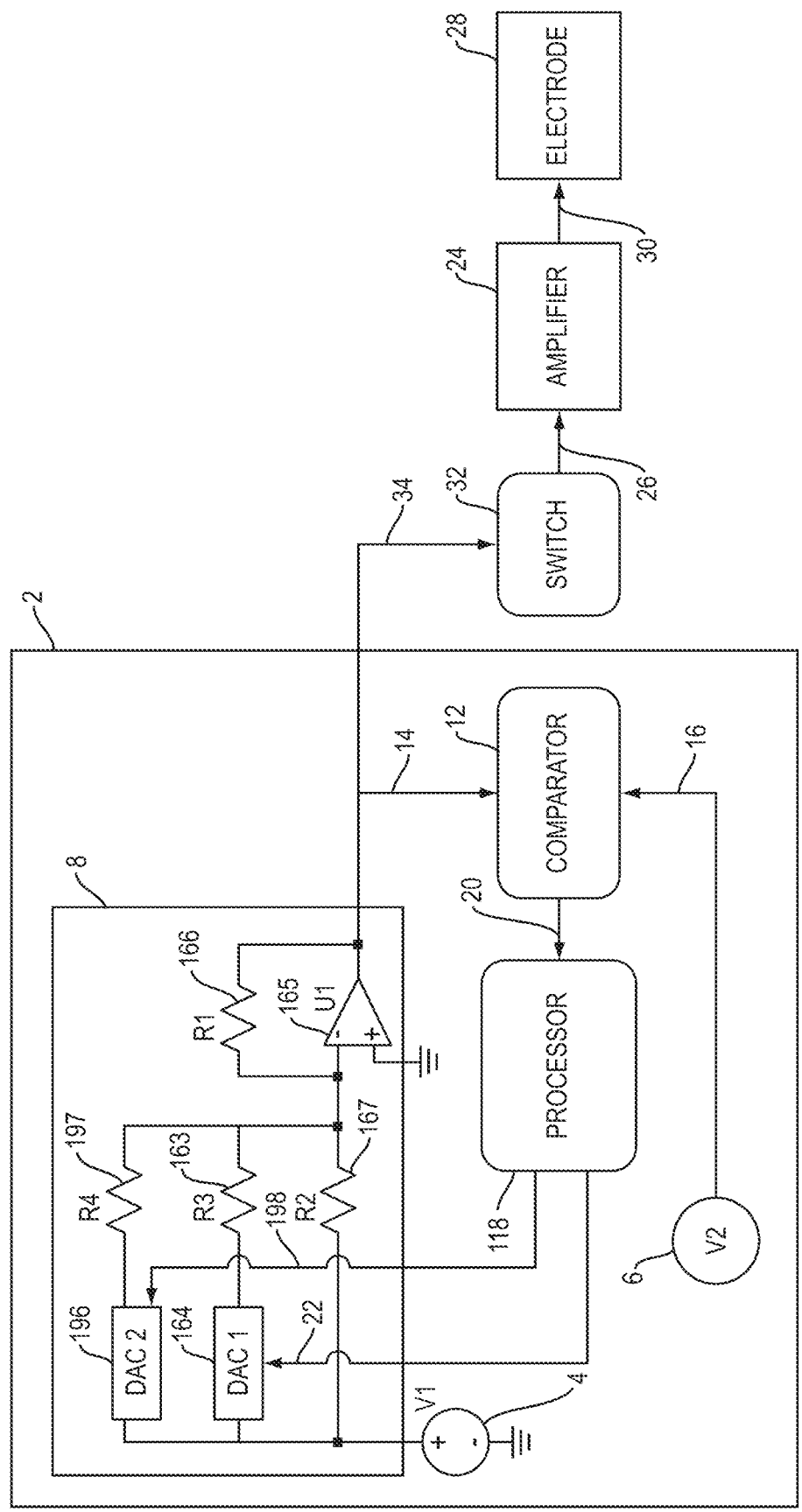
FIG. 12 shows a twelfth embodiment of an inventive voltage supply schematically.
Figure 13A:
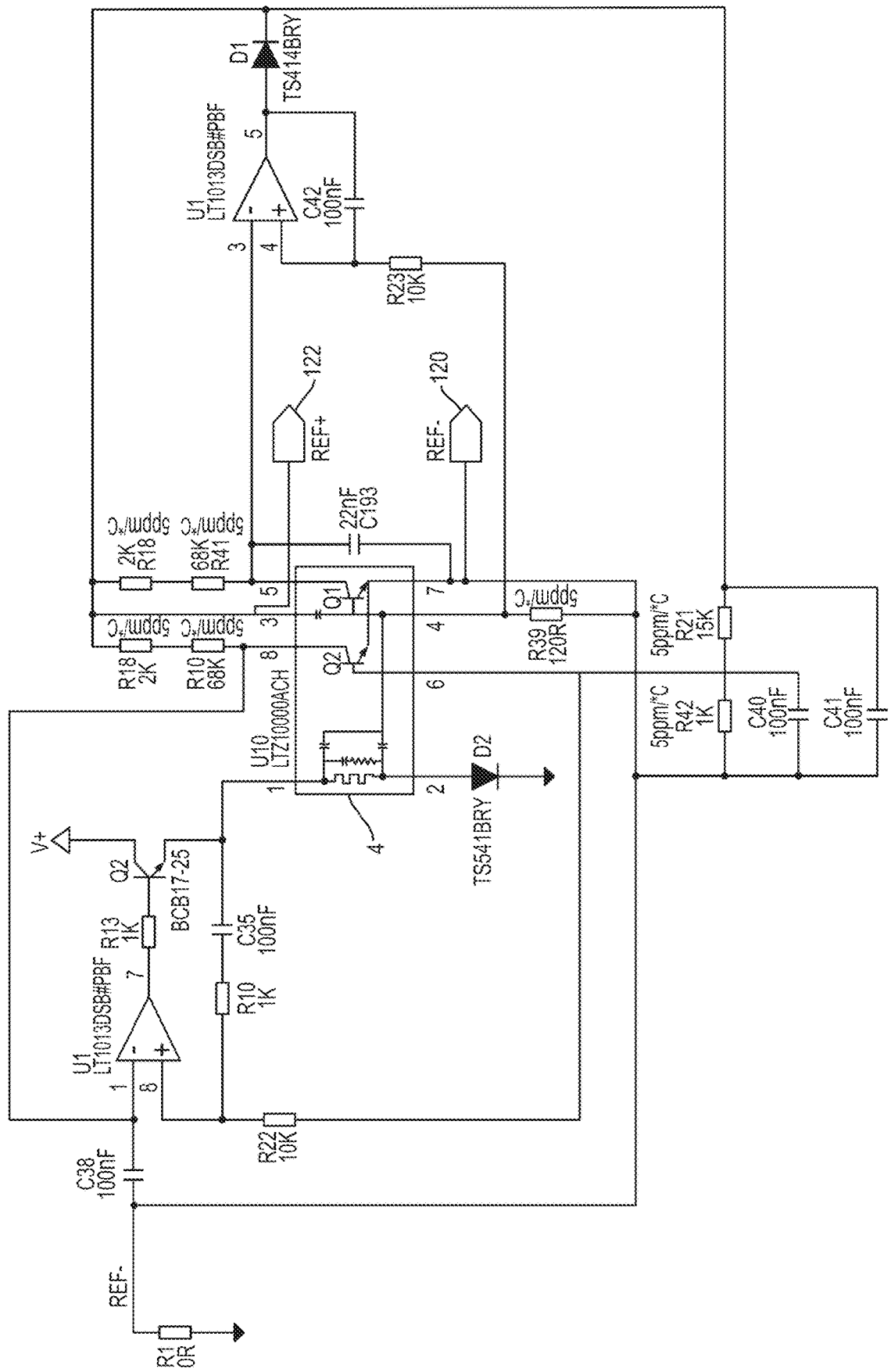
FIGS. 13 *a*-13 *d* show details of the third embodiment of an inventive voltage supply.
Figure 13B:
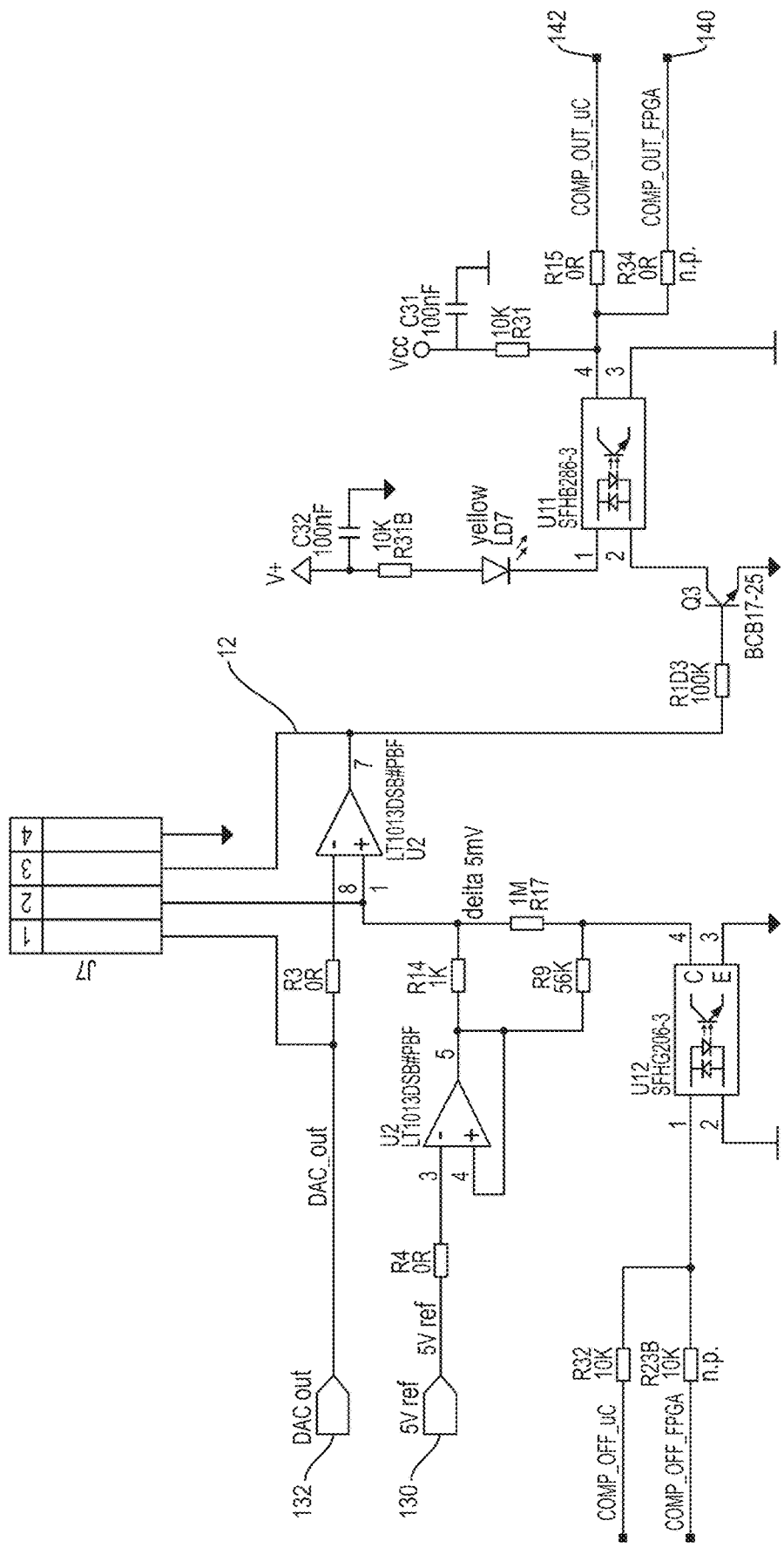
Figure 13C:
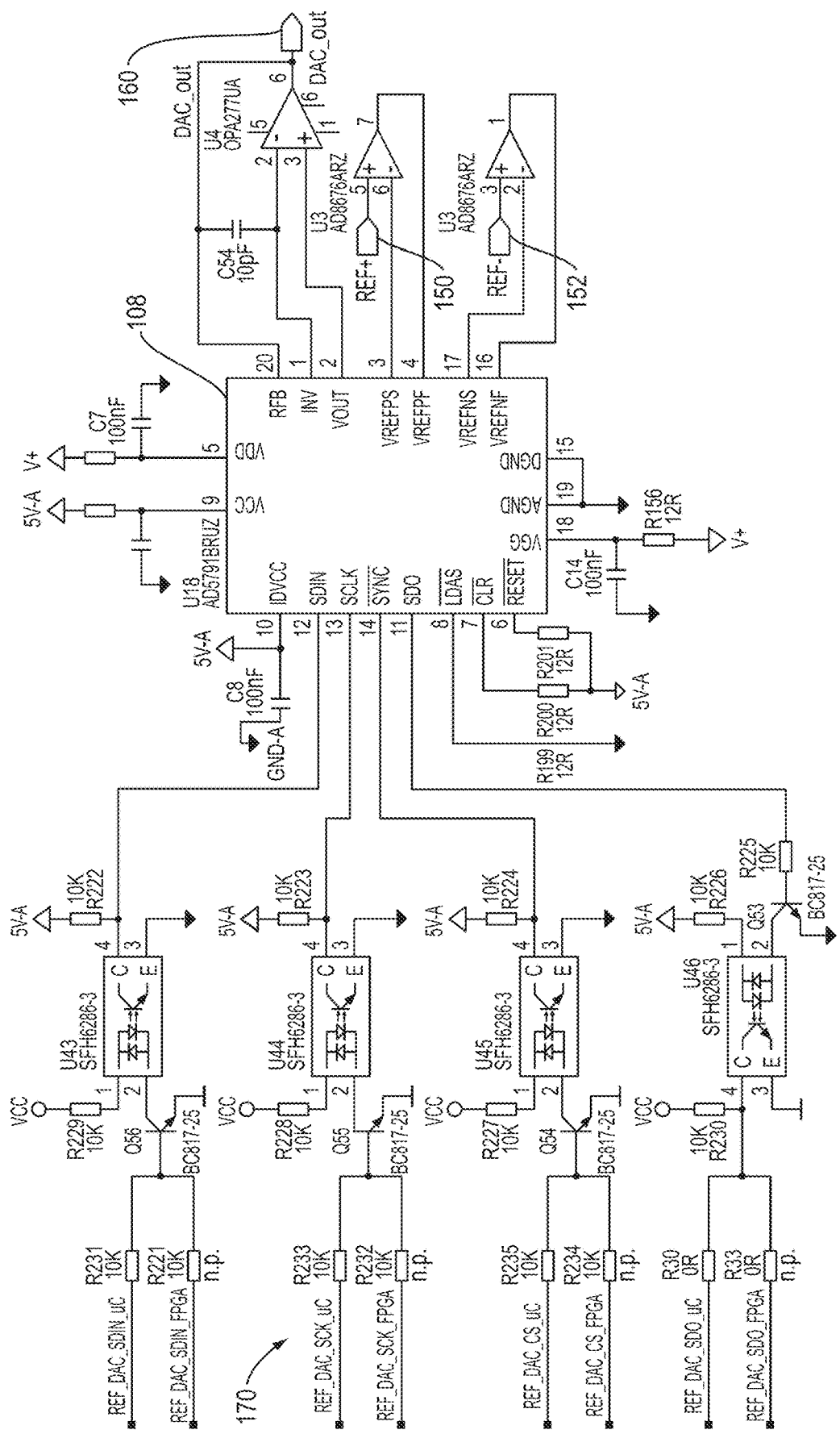
Figure 13D:
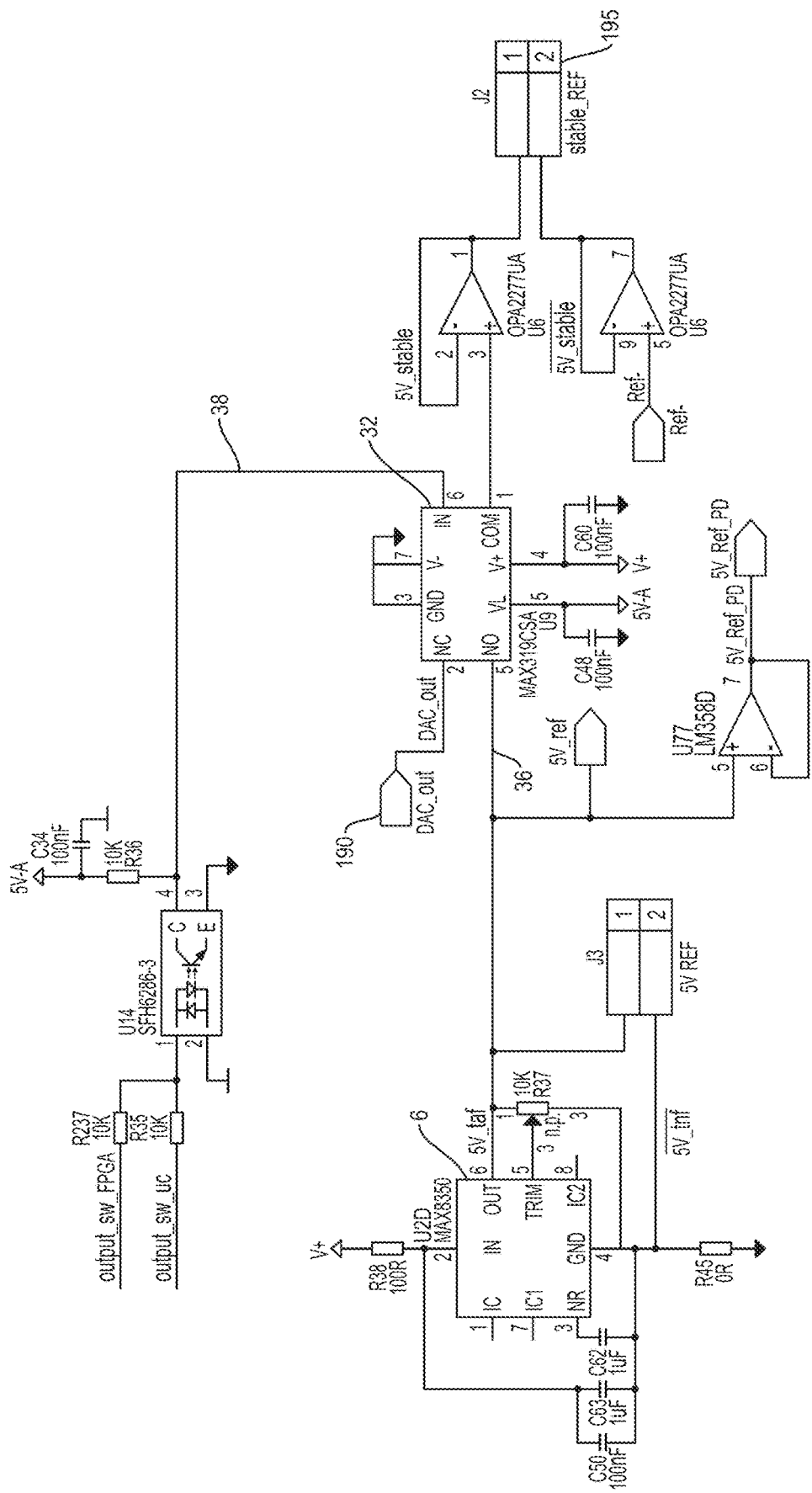

FIG. 12 shows a twelfth embodiment of the inventive power supply 2.

In this embodiment, in which in general all components are the same as in the ninth embodiment, only the tuning unit 8 comprises additional components.

In this embodiment of the invention the tuning unit 8 of the voltage supply 2 comprises a second digital to analogue converters 196 (DAC2). The first resistor 167 (R2) and the two digital to analogue converters, the first digital to analogue converters 164 (DAC1) and the second digital to analogue converters 196 (DAC2) are provided in parallel lines.

The first digital to analogue converter 164 (DAC1) is connected in series with a second resistor 163 (R3) and the second digital to analogue converter 196 (DAC2) is connected in series with a third resistor 197 (R4). The voltage supplied by the ultra-stable voltage source 4 to the tuning unit is applied at the first digital to analogue converter 164 (DAC1), the second digital to analogue converter 164 (DAC2) and the first resistor 167 (R2). The other end of the parallel lines, in which the first resistor 167 (R2) and the two digital to analogue converters, the first digital to analogue converters 164 (DAC1) and the second digital to analogue converters 196 (DAC2) are provided, is connected with the input of the transimpedance amplifier, which provides at its output the output voltage of the tuning unit 8, which is provided to the comparator 12 shown by the arrow 14 and directly applied to the switch 32 shown by arrow 34. This voltage has the reverse polarity as the voltage supplied by the ultra-stable voltage source 4. But the output voltage of the tuning unit 8 has the same polarity as the voltage supplied by the accurate voltage source 6.

In the twelfth embodiment of the inventive voltage supply 2 the output voltage of the tunable voltage divider 8 shown by the arrow 14 and the voltage of the accurate voltage source 6 shown by the arrow 16 are provided to the comparator 12 of the inventive power supply 2, which compares the voltage signals. The comparator 12 provides an output signal which is resulting from the comparison of these two input voltages having the same polarity.

The value of the output voltage of the tuning unit 8 depends on the resistance values of the first resistor 167 (R2), the second resistor 163 (R3), the third resistor 197 (R4), the feedback resistor 166 (R1), the output voltage of the first digital to analogue converter 164 (DAC1) and the output voltage of the second digital to analogue converter 196 (DAC2) as known by a skilled person.

The inventive voltage supply 2 comprises also a control unit, which is processor 118. A computer program can be executed by the processor to operate the voltage supply 2 in accordance with the described methods.

The signal provided by the comparator 12, which results from the comparison of the output voltage of the tuning unit 8 and the voltage of the accurate voltage source 6, is provided to the processor 118 as input signal shown by arrow 20.

The processor 118 is tuning the first digital to analogue converter (DAC1) 164 and second digital to analogue converter (DAC2) 196 of the tuning unit 8 according to the digital signal provided by the comparator 12 to minimise the absolute difference between the output voltage of tuning unit 8 and the voltage of the accurate DC voltage source 6. To achieve this, the processor 118 provides two digital output signals, which are provided to the first digital to analogue converter (DAC1) 164 shown by arrow 22 and the second digital to analogue converter (DAC2) 196 shown by arrow 198.

In this configuration the first digital to analogue converter 164 (DAC1) is provided for a coarse tuning of the output voltage of the tuning unit 8 and the second digital to analogue converter 196 (DAC2) is provided for a fine tuning of the output voltage of the tuning unit 8. The second digital to analogue converter 196 (DAC2) is connected in series with the third resistor 197 (R4) of higher resistivity than the second resistor 163 (R3) for the fine tuning of the tuning unit 8.

The control unit 18 provides the two output signals based on the output signal shown by the arrow 20 of the comparator 12 in the same way as described for the ninth embodiment. The difference is that the first output signal shown by arrow 22 is provided by the control unit 18 only for a coarse adjustment to the first digital to analogue converter 164 (DAC1) and that the second output signal shown by arrow 198 is provided by the control unit 18 to the second digital to analogue converter 196 (DAC2) to minimise the total difference between the output voltage of the tuning unit 8 and the voltage of the accurate DC voltage source 6 after the coarse adjustment to the first digital to analogue converter 164 (DAC1) until the total difference is below a defined minimum value and the tuning process is stopped.

In detail, at the beginning of the tuning process the control unit 18 is providing the first output signal shown by arrow 22 for a coarse adjustment to the first digital to analogue converter 164 (DAC1) and may also provide the second output signal shown by arrow 198 to the second digital to analogue converter 196 (DAC2). When the total difference between the output voltage of the tuning unit 8 and the voltage of the accurate DC voltage source 6 is during the tuning process below the selectivity of the first digital to analogue converter 164 (DAC1), the control unit 18 is preferably only further adapting the second output signal shown by arrow 198 provided to the second digital to analogue converter 196 (DAC2) to minimise the total difference between the output voltage of the tuning unit 8 and the voltage of the accurate DC voltage source 6 until the total difference is below a defined minimum value, wherein the first output signal shown by arrow 22 remains unchanged.

Due to the use of two digital to analogue converters the adjustment can be faster and more sensitive to react on small total differences between the output voltage of the tuning unit 8 and the voltage of the accurate DC voltage source 6.

In the twelfth embodiment of the inventive voltage supply 2 the output voltage of the tuning unit 8 is providing a reference voltage, having the accuracy of the accurate DC voltage source 6 and stability of the ultra-stable DC voltage source 4. This is in particularly correct, if the components of the tuning unit 8 divider have no influence on the stability of the reference voltage. Otherwise the performance of the twelfth embodiment of the inventive voltage supply 2 may be somewhat reduced. But nevertheless the twelfth embodiment of the inventive voltage supply 2 will provide a reference voltage of high accuracy and high stability.

In FIGS. 13 *a*-13 *d* details of the electrical circuit of the third embodiment of the inventive voltage supply are shown.

In FIG. 13 the ultra-stable DC voltage source 4 is shown in detail. Shown are the output connectors 120,122 of the ultra-stable DC voltage source 4 providing the voltage to the digital to analogue converter (DAC) 108.

In FIG. 13 *b* the comparator 12 is shown in detail. The input connector 130 is connected with the accurate DC voltage source 6 and the input connector 132 is connected with the output of the digital to analogue converter (DAC) 108. The comparator 12 is providing via the output connectors 140 and 142 a digital signal to the processor 118.

In FIG. 13 *c* the digital to analogue converter (DAC) 108 is shown in detail. Via the input connectors 150, 152 the voltage of the ultra-stable DC voltage source 4 is provided to the digital to analogue converter (DAC) 108. The output connector 160 is providing the output voltage of the digital to analogue converter (DAC) 108, which is the ultra-stable and accurate reference voltage provided by the voltage supply 2. Via the input connector 170 the processor 118 provides its input signal to the digital to analogue converter (DAC) 108.

In FIG. 13 *d* the switch 32 of the voltage supply 2 is shown in detail. It is shown the accurate DC voltage source 6, which is connected with the switch 32. Via the input connector 190 is the output voltage of the digital to analogue converter (DAC) 108 provided to the switch. Further the switch control signal is provided via the line 38 (shown in FIGS. 2 and 3 as arrow 38). The switch is providing the voltage provided by the power supply 2 via the output connector 195 to the amplifier 24.

Figure 14:
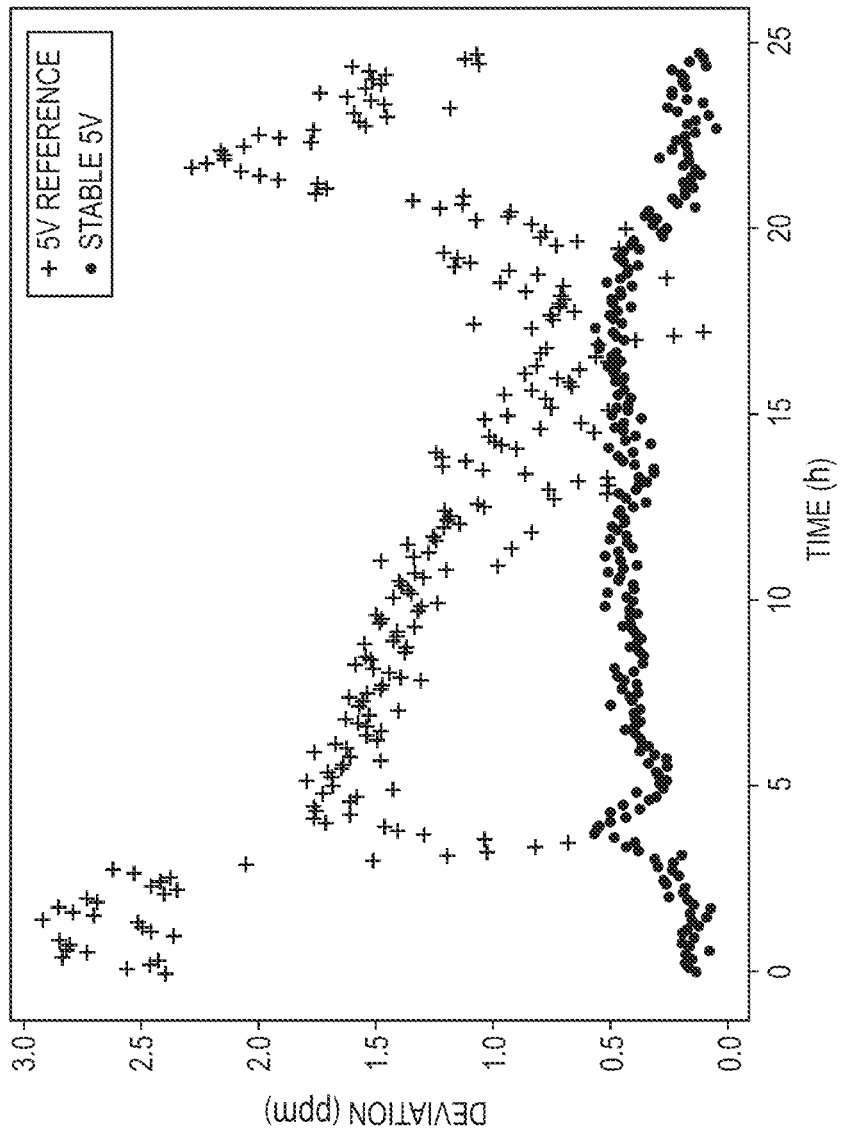
FIG. 14 shows time stability behaviour of the reference voltage provided by an accurate voltage supply and of the reference voltage provided by an inventive voltage supply.

In FIG. 14 is shown a measurement of the time stability behaviour of the reference voltage provided by the inventive voltage supply 2 of the third embodiment of the invention over a time period of 24 hours. Shown is the relative absolute maximum deviation of the maximum value and minimum value in relation to the average voltage of the reference voltage over the time by the dots. By the "+"-symbol is shown relative absolute maximum deviation of the maximum value and minimum value in relation to the average voltage over the time of the accurate DC voltage source 6 for comparison. Due to the inventive power supply the relative absolute maximum deviation of the reference voltage could be reduced below 1 ppm, even below 0.6 ppm, over the whole time. For the accurate DC voltage source 6 the relative absolute maximum deviation is much higher and varies over the investigated time period.

So by the inventive voltage supply 2 the time stability of the provided reference voltage is much increased in comparison to the voltage, provided only by the accurate DC voltage source 6.

Figure 15:
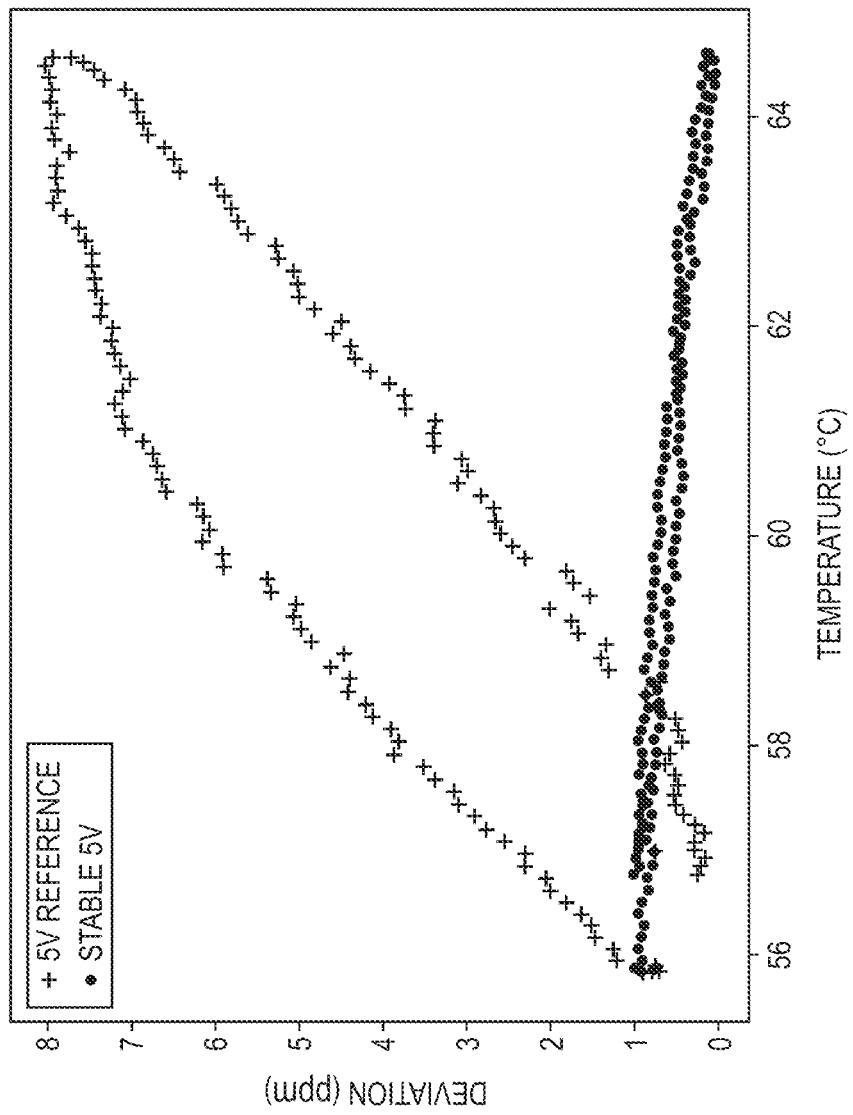
FIG. 15 shows the temperature behaviour of the reference voltage provided by an accurate voltage supply and of the reference voltage provided by an inventive voltage supply.

In FIG. 15 is shown a measurement of the temperature behaviour of the reference voltage provided by the inventive voltage supply 2 of the third embodiment of the invention over a temperature range between 56° C. and 64.5° C. Shown by the dots is the relative absolute deviation of the average voltage of the reference voltage at the different temperatures of the reference voltage of the inventive power supply 2. This relative absolute deviation of average voltage is shown in relation to the lowest average voltage of the reference voltage in the temperature range having the relative deviation of 0. By the "+"-symbol is shown the relative absolute deviation of average voltage of the reference voltage provided by the accurate DC voltage source 6 at the different temperatures in relation to the lowest average voltage of the accurate DC voltage source 6 in the temperature range having the relative deviation of 0 for comparison. The measurements started at the temperature of 56° C. Due to the inventive power supply the relative absolute maximum deviation of the reference voltage, which is the relative maximum deviation of the maximum value and the minimum value of the voltage in the specific temperature range, could be reduced below 1 ppm over the whole temperature range. For the accurate DC voltage source 6 the absolute relative maximum deviation is much higher and varies over the investigated temperature range. Also a strong hysteresis effect is visible for the accurate DC voltage source 6, when the temperature is increased and decreased showing higher relative deviations for increasing temperatures.

So by the inventive voltage supply 2 the temperature stability of the provided reference voltage is much increased in comparison to the voltage, provided only by the accurate DC voltage source 6.

The reference voltage provided by the inventive power supply 2 can be used to supplying a voltage to at least one electrode of a mass spectrometer.

Figure 16B:
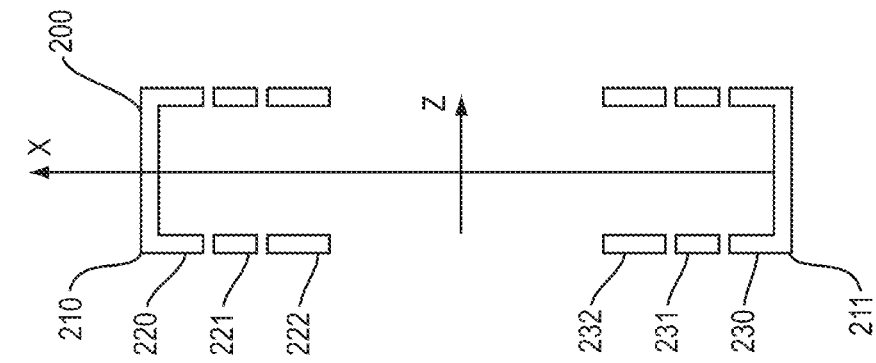
FIGS. 16 *a* and 16 *b* show a first embodiment of a multi-reflection time-of-flight mass analyser, to which a voltage can be applied using the inventive voltage supply.
Figure 16A:
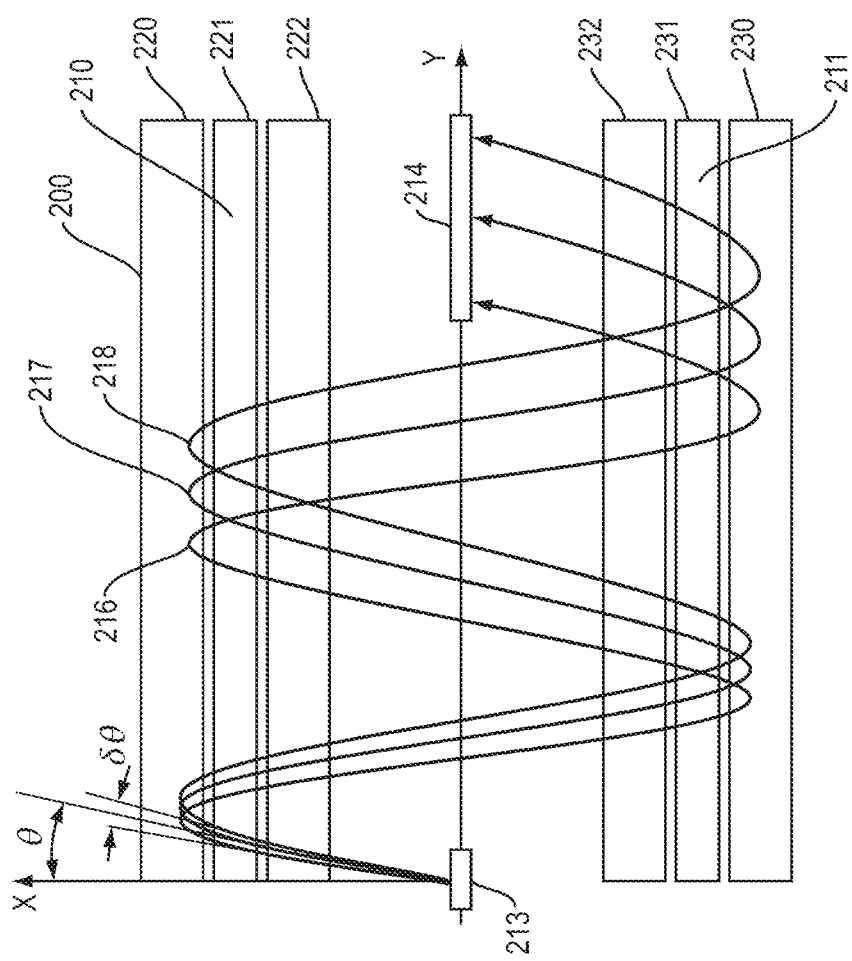

The electrode of a mass spectrometer can be in particular an electrode of a time-of-flight mass spectrometer, in particular of a multi-reflection time-of-flight mass spectrometer in which the reference voltage provided by the inventive voltage supply can be used to provide a voltage to mirror electrodes, e.g. a specific electrode of the mirror electrodes or all electrodes of the mirror electrodes. In FIGS. 16 *a* and 16 *b* a first embodiment of multi-reflection time-of-flight mass analyser 200 is shown, which is used in a multi-reflection time-of-flight mass spectrometer. The inventive power supply 2 can be used in such multi-reflection time-of-flight mass spectrometer. The reference voltage is provided to at least one voltage amplifier 24 (not shown) of multi-reflection time-of-flight mass spectrometer, which then provides a voltage to electrodes, e.g. at least one mirror electrode, of multi-reflection time-of-flight mass analyser 200, which has typically a value in the range of kilovolts (kV).

In particular in FIGS. 16 *a* and 16 *b* the multi-reflection time-of-flight mass analyser 200 is shown schematically which is known by a skilled person. The multi-reflection time-of-flight mass analyser 200 comprises parallel ion-optical mirrors 210, 211 elongated linearly along a drift length. FIG. 16 *a* shows the analyser in the X-Y plane and FIG. 16 *b* shows the same analyser in the X-Z plane. Opposing ion-optical mirrors 210, 211 are elongated along a drift direction Y and are arranged parallel to one another. Ions are injected from ion injector 213 with injection angle Θ to axis X and angular divergence δθ, in the X-Y plane. Accordingly, three ion flight paths are depicted, 216, 217, 218. The ions travel into mirror 210 and are turned around to proceed out of mirror 210 and towards mirror 211, whereupon they are reflected in mirror 211 and proceed back to mirror 210 following a zigzag ion flight path, drifting relatively slowly in the drift direction Y. After multiple reflections in mirrors 210, 211 the ions reach a detector 214, upon which they impinge, and are detected. In some embodiments of analysers the ion injector 213 and detector 214 are located outside the volume bounded by the mirrors. FIG. 16 *b* is a schematic diagram of the multi-reflection time-of-flight mass analyser 200 of FIG. 16 *a* shown in section, i.e. in the X-Z plane, but with the ion flight paths 216, 217, 218, ion injector 213 and detector 214 omitted for clarity.

Each ion-optical mirror 210, 211 comprises three elongate parallel mirror electrodes. The ion ion-optical mirror 210 comprises the three mirror electrodes 220, 221, 222 and the ion ion-optical mirror 211 comprises the three mirror electrodes 230, 231, 232.

The ions in a multi-reflection time-of-flight mass spectrometer 200 are reflected between opposing ion-optical mirrors 210, 211 several times while they are drifting along the drift direction Y. It is possible, that the ions are injected with a small injection angle Θ to axis X. Accordingly the number of the reflection of the ions and the length of the flight path of the ions will increase. Due to the multi-reflection of the ions at the ion-optical mirrors 210, 211 comprising several mirror electrodes 220, 221, 222, 230, 231, 232, each electrode 220, 221, 222, 230, 231, 232 has preferably to be provided with an accurate and ultra-stable voltage. Any instability could change the trajectory of the ions which are oscillating between the reflecting ion-optical mirrors 210, 211. Accordingly a changed flight-time of the analysed ions would result in time-of-flight mass spectra of lower resolving power or changing mass-to-charge-calibration of the detected time-of-flight mass spectra.

It is also possible and may be sufficient, that only to a specific electrode in each mirror electrode, e.g. the electrodes 220 and 230, an accurate and ultra-stable voltage is provided.

Therefore, at least one inventive voltage supply 2, for example one of the twelve embodiments described before, is used in the multi-reflection time-of-flight mass spectrometer to provide an accurate and ultra-stable reference voltage. The reference voltage is provided to the voltage amplifiers 24 of multi-reflection time-of-flight mass spectrometer, which then provides a voltage to mirror electrodes 220, 221, 222, 230, 231, 232 of ion-optical mirrors 210, 211 of the of multi-reflection time-of-flight mass analyser 200, which is typically in the range of kilovolts (kV). Based on the specific concept of the multi-reflection time-of-flight mass analyser 200, to each of the mirror electrodes 220, 221, 222, 230, 231, 232 of an ion-optical mirrors 210 is the same voltage provided or more preferably to each of the mirror electrodes 220, 221, 222 of an ion-optical mirrors 210 a different voltage is provide by voltage amplifiers 24 which are using the accurate and ultra-stable reference voltage of an inventive voltage supply 2. One voltage amplifier 24 can be used to apply the same voltage to more than one electrode. In particular, typically to mirror electrodes having the same function in both ion-optical mirrors 210, 211 the same voltage is applied by one voltage amplifier 24, for example to the outer mirror electrodes 220, 230 of both ion-optical mirrors 210, 211. Similarly, another voltage amplifier 24 can supply the same voltage to mirror electrodes 221, 231 and a further voltage amplifier 24 can supply the same voltage to mirror electrodes 222, 232. The voltage applied at the mirror electrodes has typically an absolute value in the range of 1 kV up to 12 kV, preferably in the range of 2 KV up to 8 kV. In a multi-reflection time-of-flight mass spectrometer, for example of the shown embodiment can be used one inventive voltage supply 2 to provide an accurate and ultra-stable reference voltage, but also more inventive voltage supplies 2 to provide accurate and ultra-stable reference voltages. E.g. to each voltage amplifier 24 can be assigned a separate voltage supply 2 to provide an accurate and ultra-stable reference voltage for each voltage amplifier 24.

Figure 17:
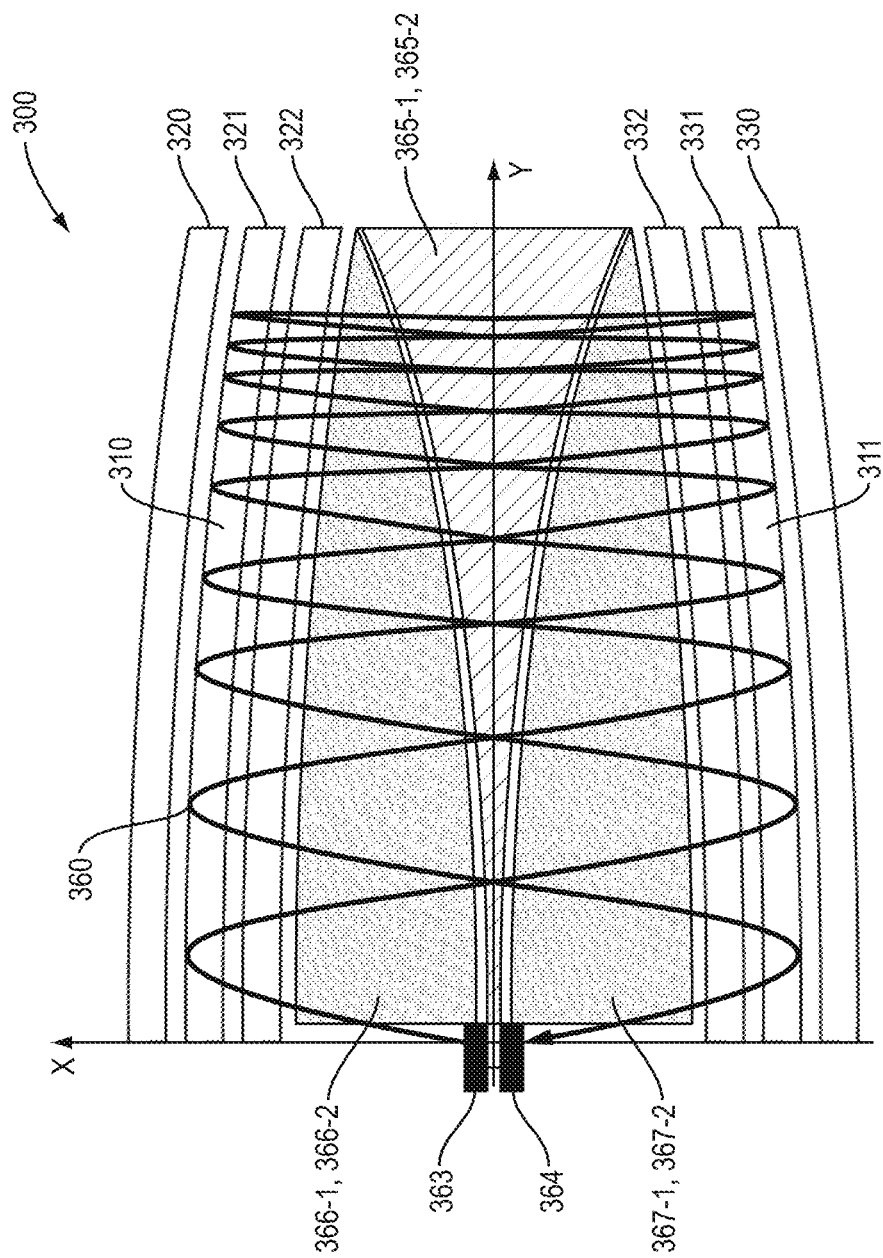
FIG. 17 shows a second embodiment of a multi-reflection time-of-flight mass analyser, to which a voltage can be applied using the inventive voltage supply.

In FIG. 17 a second embodiment of multi-reflection time-of-flight mass analyser 300 is shown, which is used in a multi-reflection time-of-flight mass spectrometer. The inventive power supply 2 can be used also in such multi-reflection time-of-flight mass spectrometer. The reference voltage is provided to at least one voltage amplifier 24 (not shown) of the multi-reflection time-of-flight mass spectrometer, which then provides a voltage to electrodes of multi-reflection time-of-flight mass analyser 300, which is typically in the range of kilovolts (kV). The embodiment of the multi-reflection time-of-flight mass analyser 300 is known by skilled persons and described in WO 2013/110587. The inventive voltage supply 2 can be also used in other multi-reflection time-of-flight mass spectrometer described in WO 2013/110587 to provide an accurate and ultra-stable reference voltage.

In particular, in FIG. 17 the multi-reflection time-of-flight mass analyser 300 is shown schematically. The multi-reflection time-of-flight mass analyser 300 comprises ion-optical mirrors 310, 311 elongated linearly along a drift length. FIG.

17 shows the analyser in the X-Y plane. Opposing ion-optical mirrors 310, 311 are elongated parabolically along a drift direction Y. The multi-reflection time-of-flight mass analyser 300 is further comprising compensation electrodes 365-1, 366-1, 367-1, 365-2, 366-2, 367-2. As a more technological implementation, parabolic shapes could be approximated by circular arcs (which could be then made on a turning machine). Compensation electrodes 365-1, 366-1, 367-1, 365-2, 366-2, 367-2 allow further advantages to be provided, in particular that of reducing time-of-flight aberrations. The embodiment of FIG. 17 is similar to that of FIGS. 16 a and 16 b, and similar considerations apply to the general ion motion from the injector 363 to the detector 364 the ions undergoing a plurality of oscillations 360 between mirrors ion-optical mirrors 310, 311. Due to the parabolic shape of the ion optical mirrors the ions are reflected back at high Y values (at the right side of the mass analyser), then moving in negative drift direction Y and finally impinge on the detector which is arranged on the same side as the injector of the ions 363. Three pairs of compensation electrodes 365-1, 365-2 as one pair, 366-1, 366-2 as another pair and 367-1, 367-2 as a further pair, comprise extended surfaces in the X-Y plane facing the ion beam, the electrodes being displaced in +/−Z from the ion beam flight path, i.e. each compensation electrode 365-1, 366-1, 367-1, 365-2, 366-2, 367-2 has a surface substantially parallel to the X-Y plane located either side of a space extending between the opposing ion-optical mirrors 310, 311. In use, the compensation electrodes 365-1,365-2 are electrically biased, both electrodes having voltage offset U(Y)>0 applied in case of positive ions and U(Y)<0 applied in case of negative ions. Voltage offset U(Y) is, in some embodiments, a function of Y, i.e. the potential of the compensation plates varies along the drift length, but in this embodiment the voltage offset is constant. The electrodes 366, 367 are not biased and have zero voltage offset.

Each ion-optical mirror 310, 311 comprises three elongate mirror electrodes. The ion ion-optical mirror 310 comprises three mirror electrodes 320, 321, 322 and the ion ion-optical mirror 311 comprises three mirror electrodes 330, 331, 332.

The ions in a multi-reflection time-of-flight mass spectrometer 300 are reflected between opposing ion-optical mirrors 310, 311 several times while they are drifting along the direction Y, are reflected and drift back in the direction −Y. It is possible, that the ions are injected with a small injection angle Θ to axis X. Accordingly the number of the reflection of the ions and the length of the flight path of the ions will increase. Due to the multi-refection of the ions at the ion-optical mirrors 310, 311 comprising several mirror electrodes 320, 321, 322, 330, 331, 332, at least one mirror electrode 320, 321, 322, 330, 331, 332 of each ion-optical mirrors 310, 311 or each mirror electrode 320, 321, 322, 330, 331, 332 of the ion-optical mirrors 310, 311 has to be provided with an accurate and ultra-stable voltage. Any instability could change the trajectory of the ions which are oscillating between the reflecting ion-optical mirrors 310, 311. Accordingly a changed flight-time of the analysed ions would result in time-of-flight mass spectra of lower resolving power or changing mass-to-charge-calibration of the detected time-of-flight mass spectra.

Therefore, at least inventive voltage supply 2, for example one of the twelve embodiments described before, is used in the multi-reflection time-of-flight mass spectrometer to provide an accurate and ultra-stable reference voltage. The reference voltage is provided to the voltage amplifiers 24 of multi-reflection time-of-flight mass spectrometer, which then provides a voltage to the mirror electrodes 320, 321, 322, 330, 331, 332 of ion-optical mirrors 310, 311 of the multi-reflection time-of-flight mass analyser 300, which is typically in the range of kilovolts (kV). Based on the specific concept of the multi-reflection time-of-flight mass analyser 230 to each of the mirror electrodes 320, 321, 322, 330, 331, 332 of an ion-optical mirrors 310 is the same voltage provided or more preferably to each of the mirror electrodes 320, 321, 322 of an ion-optical mirrors 210 a different voltage is provided by voltage amplifiers 24 which are using the accurate and ultra-stable reference voltage of an inventive voltage supply 2. One voltage amplifier 24 can be used to apply the same voltage to more than one electrode. In particular, typically to electrodes having the same function in both ion-optical mirrors 310, 311 the same voltage is applied by one voltage amplifier 24, for example the outer mirror electrodes 320, 330 of both ion-optical mirrors 310, 311. Similarly, another voltage amplifier 24 can supply the same voltage to mirror electrodes 321, 331 and a further voltage amplifier 24 can supply the same voltage to mirror electrodes 322, 332. The voltage applied at the mirror electrodes has typically an absolute value in the range of 1 kV up to 12 kV, preferably in the range of 2 KV up to 8 kV. In a multi-reflection time-of-flight mass spectrometer, for example of this embodiment can be used one inventive voltage supply 2 to provide an accurate and ultra-stable reference voltage, but also more inventive voltage supplies 2 to provide accurate and ultra-stable reference voltages. E.g. to each voltage amplifier 24 can be assigned a separate voltage supply 2 to provide an accurate and ultra-stable reference voltage for each voltage amplifier 24.

The embodiments described in this application give examples of the inventive voltage supply and inventive calibration method. So the invention can be realised by each embodiment alone or by a combination of several or all features of the described embodiments without any limitations.

The invention claimed is:

1. A voltage supply for providing a reference voltage to supply a voltage to at least one electrode, comprising
   an ultra-stable DC voltage source,
   an accurate DC voltage source,
   a tuning unit including a digital to analogue converter,
   a comparator, and
   a control unit,
      wherein an ultra-stable voltage is applied to the tuning unit, which is provided based on a supplied voltage of the ultra-stable DC voltage source, the tuning unit provides an output voltage, a voltage based on the output voltage of the tuning unit is compared by the comparator with an accurate voltage, which is provided based on a supplied voltage of the accurate DC voltage source and the comparator provides a signal resulting from the comparison to the control unit, wherein the control unit is tuning the tuning unit during a tuning period according to the signal provided by the comparator to minimise the absolute difference between the voltage based on the output voltage of the tuning unit and the accurate voltage, and the reference voltage of the voltage supply is provided based on the output voltage of the tuning unit after the tuning period.

2. The voltage supply according to claim 1, wherein the supplied voltage of the ultra-stable DC source has a higher absolute value than the supplied voltage of the accurate DC voltage source.

3. The voltage supply according to claim 1, wherein the control unit provides a digital signal to the digital to analogue converter to tune the output voltage of the digital to analogue converter.

4. The voltage supply of claim 3, wherein the digital signal includes a specific number of bits.

5. The voltage supply according to claim 1, wherein the signal provided by the comparator to the control unit is a digital signal identifying which of the voltages compared by the comparator has a higher absolute value.

6. The voltage supply according to claim 5, wherein the control unit provides a signal to the tuning unit according to the digital signal provided by the comparator to increase the absolute value of the output voltage of the tuning unit if the absolute value of the accurate voltage compared by the comparator is higher than the absolute value of the voltage based on the output voltage of the tuning unit compared by the comparator and to decrease the absolute value of the output voltage of the tuning unit if the absolute value of the accurate voltage compared by the comparator is lower than the absolute value of the voltage based on output voltage of the tuning unit compared by the comparator.

7. The voltage supply according to claim 5, wherein the control unit provides a digital signal to the digital to analogue converter according to the digital signal provided by the comparator to increase the absolute value of the output voltage of the digital to analogue converter if the absolute value of the accurate voltage compared by the comparator is higher than the absolute value of the voltage based on the output voltage of the digital to analogue converter compared by the comparator and to decrease the absolute value of the output voltage of the digital to analogue converter if the absolute value of the accurate voltage compared by the comparator is lower than the absolute value of the voltage based on output voltage of the digital to analogue converter compared by the comparator.

8. The voltage supply according to claim 1, wherein the increase and decrease of the output voltage of the digital to analogue converter is reduced stepwise.

9. The voltage supply according to claim 1, wherein the provided reference voltage is applied at a voltage amplifier, which provides an amplified voltage to the at least one electrode.

10. The voltage supply according to claim 9, wherein the provided reference voltage is applied at the voltage amplifier via a switch.

11. The voltage supply according to claim 10, wherein an accurate voltage, which is provided, based on the supplied voltage of the accurate DC voltage source can be applied at the voltage amplifier via the switch.

12. The voltage supply according to claim 1, which provides the reference voltage to supply a voltage to the electrode of a mass spectrometer.

13. The voltage supply according to claim 12, wherein the electrode is a center electrode of an electrostatic trap.

14. The voltage supply according to claim 12, wherein the mass spectrometer is a time-of-flight mass spectrometer.

15. The voltage supply according to claim 14, wherein the time-of-flight mass spectrometer is a multi-reflection time-of-flight mass spectrometer.

16. The voltage supply according to claim 1, wherein the ultra-stable DC voltage source has a voltage stability below 1 ppm over a time period of 24 hours.

17. The voltage supply according to claim 1, wherein the ultra-stable DC voltage source has a voltage stability below 1 ppm over a temperature range of 10° C.

18. The voltage supply according to claim 1, wherein the accurate DC voltage source has a production accuracy of its supplied voltage below 1000 ppm.

19. The voltage supply according to claim 1, wherein the supplied voltage of the ultra-stable DC voltage source is the ultra-stable voltage, which is applied to the tuning unit.

20. The voltage supply according to claim 1, wherein the output voltage of the tuning unit is compared by the comparator with the accurate voltage to provide the signal to the control unit, wherein the control unit is tuning the tuning unit during the tuning period according to the signal to minimise the absolute difference between the output voltage of the tuning unit and the accurate voltage.

21. The voltage supply according to claim 1, wherein the supplied voltage of the accurate DC voltage source is the accurate voltage, which is compared by the comparator with the voltage based on the output voltage of the tuning unit.

22. The voltage supply according to claim 1, wherein the reference voltage provided by the voltage supply is the output voltage of the tuning unit after the tuning period.

23. The voltage supply of claim 1, wherein the digital to analogue converter includes a resistor ladder network.

24. A method for calibrating a voltage supply to provide a reference voltage to supply a voltage to at least one electrode, wherein a voltage provided based on an output voltage of a tuning unit including a digital to analogue converter can be provided by the voltage supply via a switch as the reference voltage, comprising the steps
activating the voltage supply, while the voltage provided based on the output voltage of the tuning unit is applied to the switch and this voltage is not provided via the switch as the reference voltage;
tuning the tuning unit by a control unit according to the signal provided by a comparator to minimise the absolute difference between the voltage based on the output voltage of the tuning unit and the accurate voltage compared by the comparator; and
when the absolute difference between the voltages compared by the comparator is below a defined minimum value and the tuning by the control unit is stopped, the control unit submits a switching signal to the switch, the switch receiving the switching signal is actuated and then the voltage provided based on the output voltage of the tuning unit applied to the switch is provided by the voltage supply via the switch as the reference voltage.

25. The method of claim 24, wherein the voltage provided based on the output voltage of the tuning unit applied to the switch is the voltage based on the output voltage of the tuning unit, which is compared by the comparator.

26. The method of claim 24, wherein the voltage supply includes the switch, the method comprising the steps
activating the voltage supply, while a voltage provided based on the output voltage of the tuning unit and an accurate voltage which is provided based on the supplied voltage of the accurate DC voltage source are applied to the switch and the voltage provided based on the output voltage of the tuning unit applied to the switch is not connected via the switch with the voltage amplifier and the accurate voltage applied to the switch is connected via the switch with the voltage amplifier;
tuning the tuning unit by the control unit according to the signal provided by the comparator to minimise the absolute difference between the voltage based on the output voltage of the tuning unit and the accurate voltage compared by the comparator and when the absolute difference between the voltages compared by the comparator is below a defined minimum value and the tuning by the control unit is stopped, the control unit submits a switching signal to the switch, the switch receiving the switching signal is actuated and then the voltage provided based on the output voltage of the tuning unit applied to the switch is connected via the switch with the voltage amplifier as the reference voltage and the accurate voltage, applied to the switch is disconnected by the switch from the voltage amplifier.

27. The method of claim 26, wherein the voltage provided based on the output voltage of the tuning unit applied to the switch is the voltage based on the output voltage of the tuning unit, which is compared by the comparator.

28. The method of claim 26, wherein the accurate voltage, which is applied to the switch, is the accurate voltage, which is compared by the comparator.

\* \* \* \* \*